(12) United States Patent
Kurose et al.

(10) Patent No.: US 11,514,986 B2
(45) Date of Patent: Nov. 29, 2022

(54) MEMORY SYSTEM AND SEMICONDUCTOR MEMORY DEVICE

(71) Applicant: Kioxia Corporation, Tokyo (JP)

(72) Inventors: Kengo Kurose, Tokyo (JP); Masanobu Shirakawa, Chigasaki (JP); Hideki Yamada, Yokohama (JP); Marie Takada, Yokohama (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/202,627

(22) Filed: Mar. 16, 2021

(65) Prior Publication Data

US 2022/0028460 A1 Jan. 27, 2022

(30) Foreign Application Priority Data

Jul. 21, 2020 (JP) .............................. JP2020-124259

(51) Int. Cl.
*G11C 16/04* (2006.01)
*G11C 16/16* (2006.01)
*G11C 11/56* (2006.01)
*G11C 16/10* (2006.01)
*G11C 16/26* (2006.01)
*G11C 16/34* (2006.01)
*G06F 3/06* (2006.01)
*H01L 27/11582* (2017.01)
*H01L 27/11556* (2017.01)

(52) U.S. Cl.
CPC .............. *G11C 16/16* (2013.01); *G06F 3/064* (2013.01); *G06F 3/0604* (2013.01); *G06F 3/0652* (2013.01); *G06F 3/0679* (2013.01); *G11C 11/5628* (2013.01); *G11C 11/5635* (2013.01); *G11C 11/5642* (2013.01); *G11C 11/5671* (2013.01); *G11C 16/0483* (2013.01); *G11C 16/10* (2013.01); *G11C 16/26* (2013.01); *G11C 16/3445* (2013.01); *H01L 27/11556* (2013.01); *H01L 27/11582* (2013.01)

(58) Field of Classification Search
CPC ...................................................... G11C 16/16
See application file for complete search history.

(56) References Cited

U.S. PATENT DOCUMENTS

| 7,200,708 | B1 * | 4/2007 | Kreifels | G11C 16/16 |
| | | | | 365/185.33 |
| 9,466,379 | B2 * | 10/2016 | Lee | G11C 16/14 |
| 9,589,651 | B1 * | 3/2017 | Tsuda | G11C 29/021 |
| 9,606,864 | B2 | 3/2017 | Lee et al. | |

(Continued)

FOREIGN PATENT DOCUMENTS

| JP | 2020-47318 A | 3/2020 |
| TW | I374449 B | 10/2012 |

*Primary Examiner* — Min Huang
(74) *Attorney, Agent, or Firm* — Oblon, McClelland, Maier & Neustadt, L.L.P.

(57) ABSTRACT

According to one embodiment, a memory system includes a semiconductor memory device and a controller. The semiconductor memory device includes a first memory cell configured to store data. The controller is configured to output a first parameter and a first command. The first parameter relates to an erase voltage for a first erase operation with respect to the first memory cell. The first command instructs the first erase operation. The controller outputs the first command after outputting the first parameter to the semiconductor memory device.

18 Claims, 39 Drawing Sheets

(56) References Cited

U.S. PATENT DOCUMENTS

| | | |
|---|---|---|
| 9,836,219 B2 | 12/2017 | Kim et al. |
| 10,025,514 B2 | 7/2018 | Suzuki et al. |
| 2009/0244976 A1* | 10/2009 | Kajimoto ............ G11C 11/5628 365/185.11 |
| 2009/0267128 A1 | 10/2009 | Maejima |
| 2009/0268522 A1 | 10/2009 | Maejima |
| 2010/0207195 A1 | 8/2010 | Fukuzumi et al. |
| 2010/0214838 A1 | 8/2010 | Hishida et al. |
| 2011/0284946 A1 | 11/2011 | Kiyotoshi |
| 2012/0069663 A1 | 3/2012 | Itagaki et al. |
| 2012/0307557 A1 | 12/2012 | Itagaki |
| 2019/0115078 A1* | 4/2019 | Kim .................... G11C 29/028 |
| 2020/0090763 A1 | 3/2020 | Tokutomi et al. |

\* cited by examiner

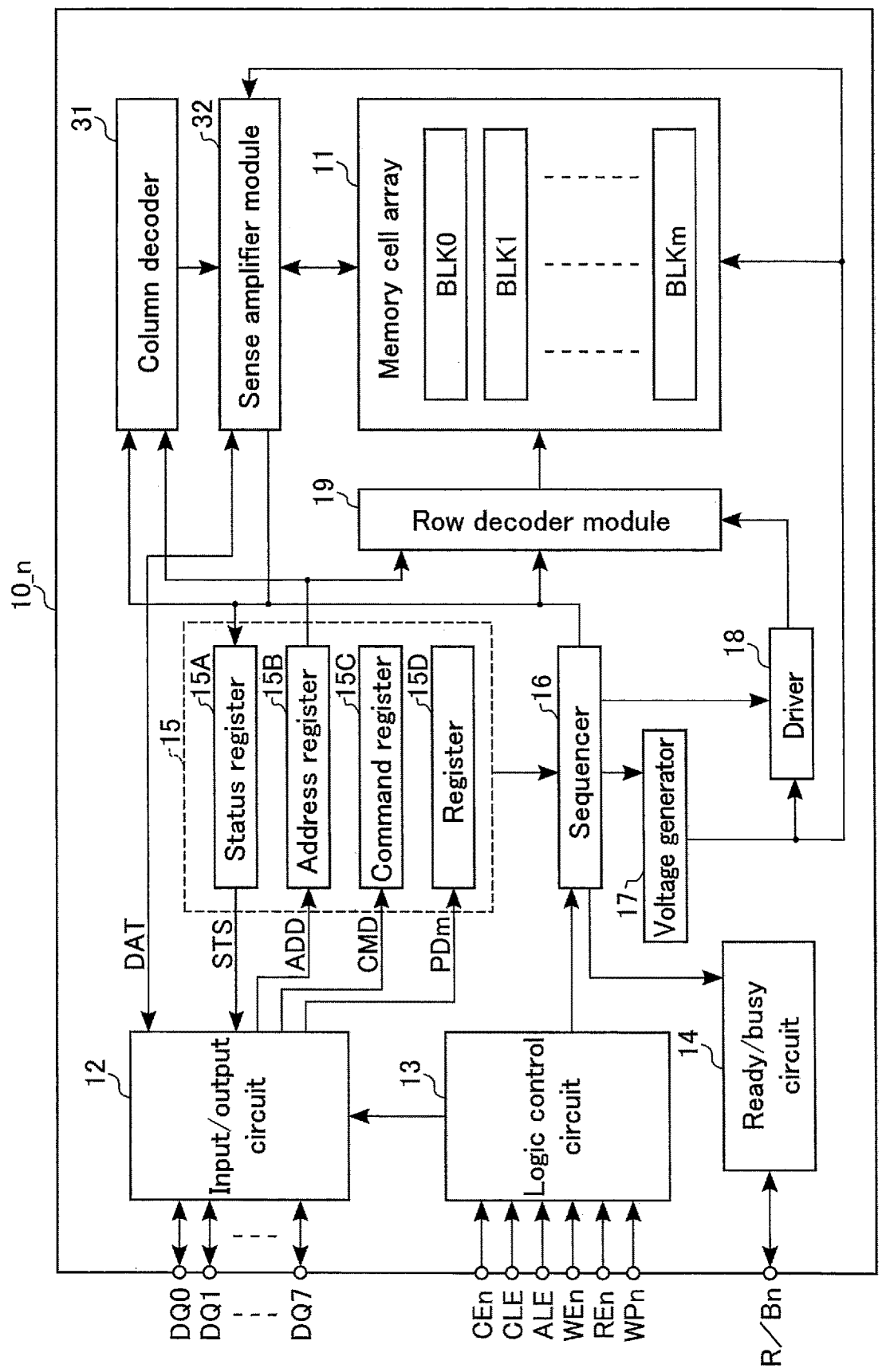
F I G. 2

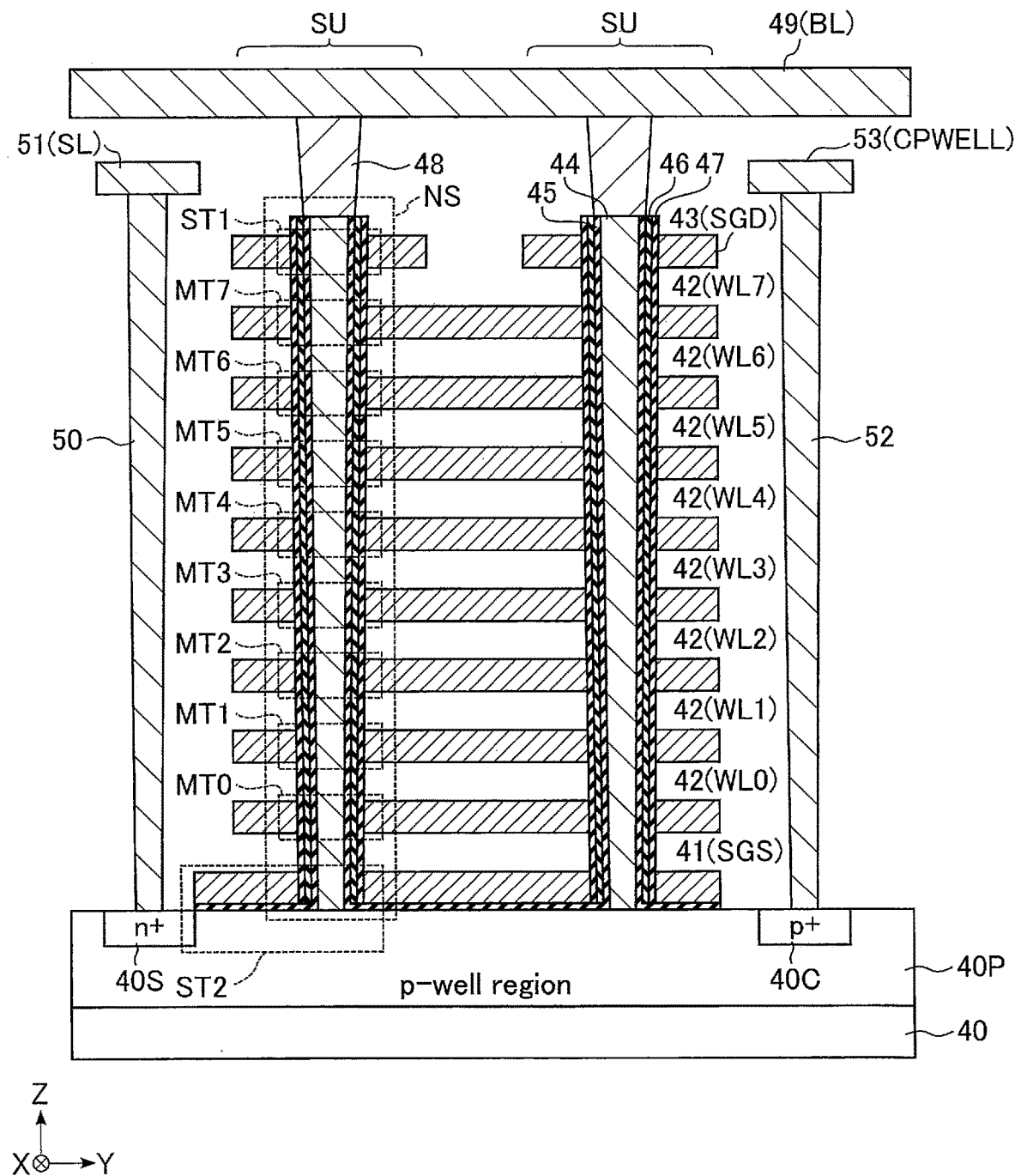
F I G. 4

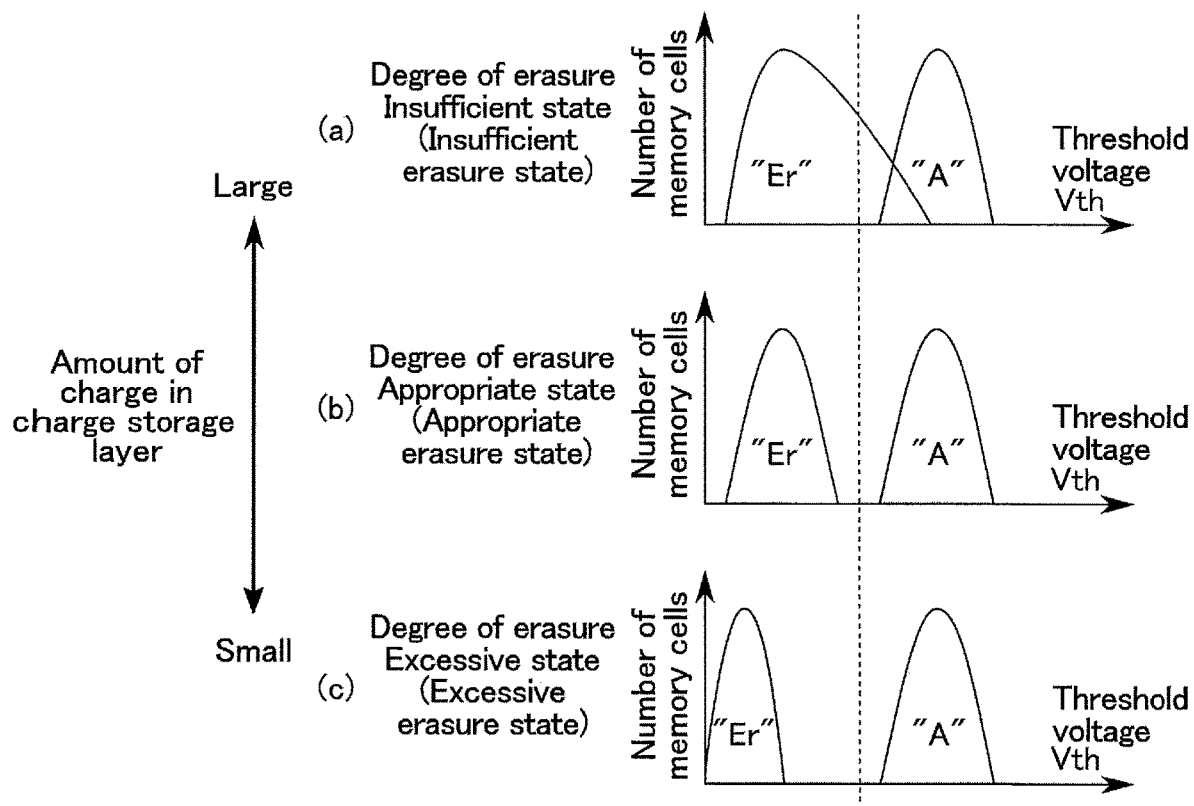
F I G. 5B

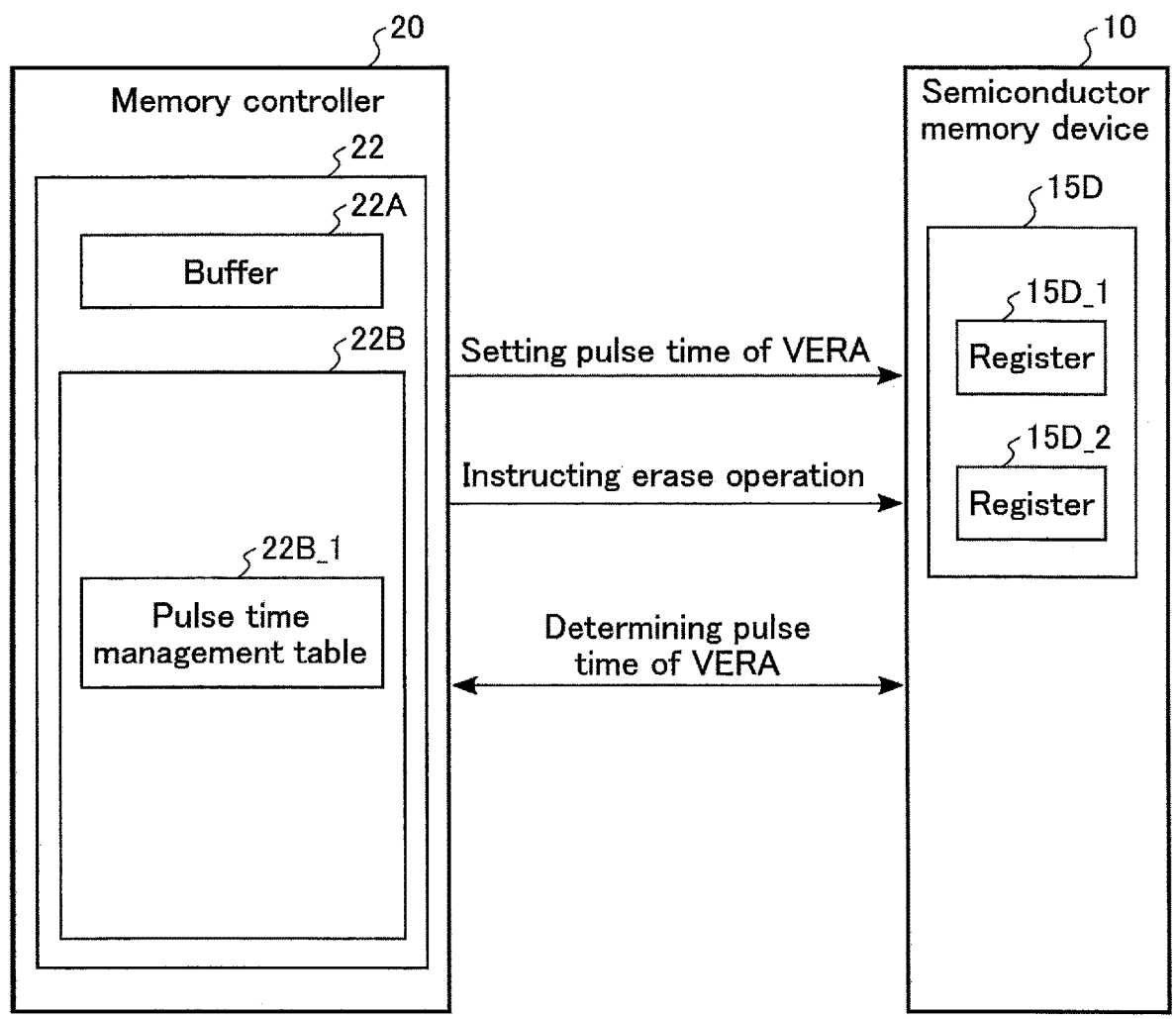
F I G. 9

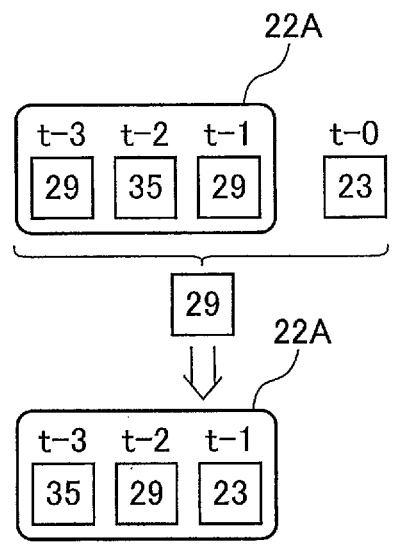
F I G. 13
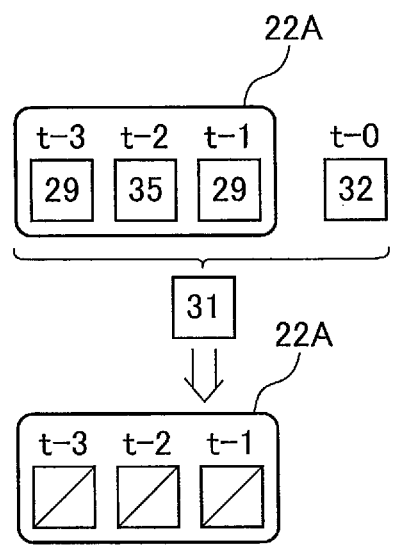
F I G. 14

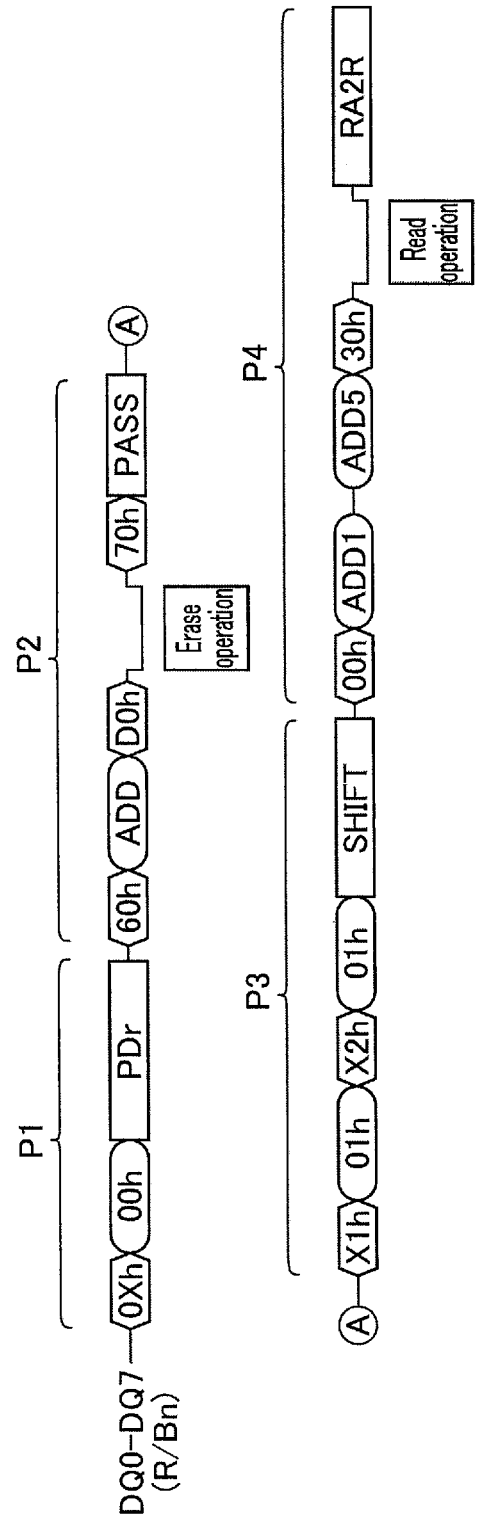
F I G. 15

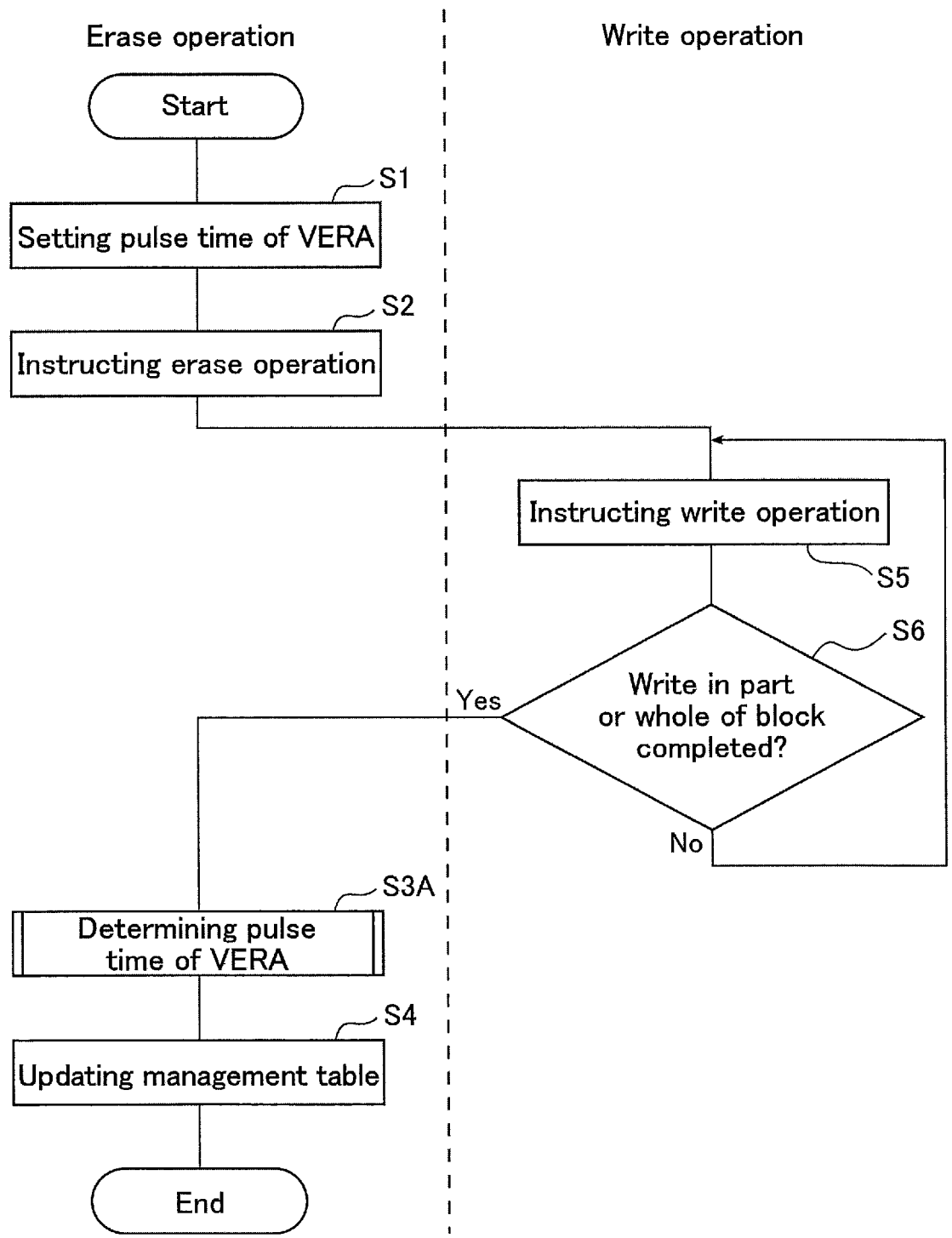
F I G. 17

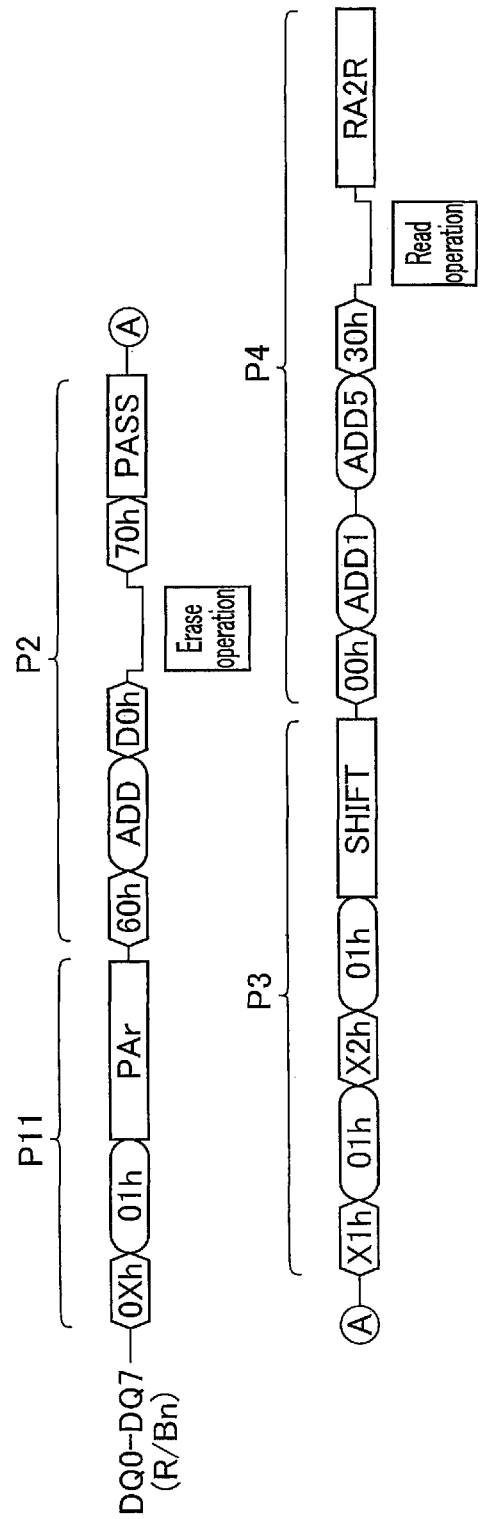
F I G. 27

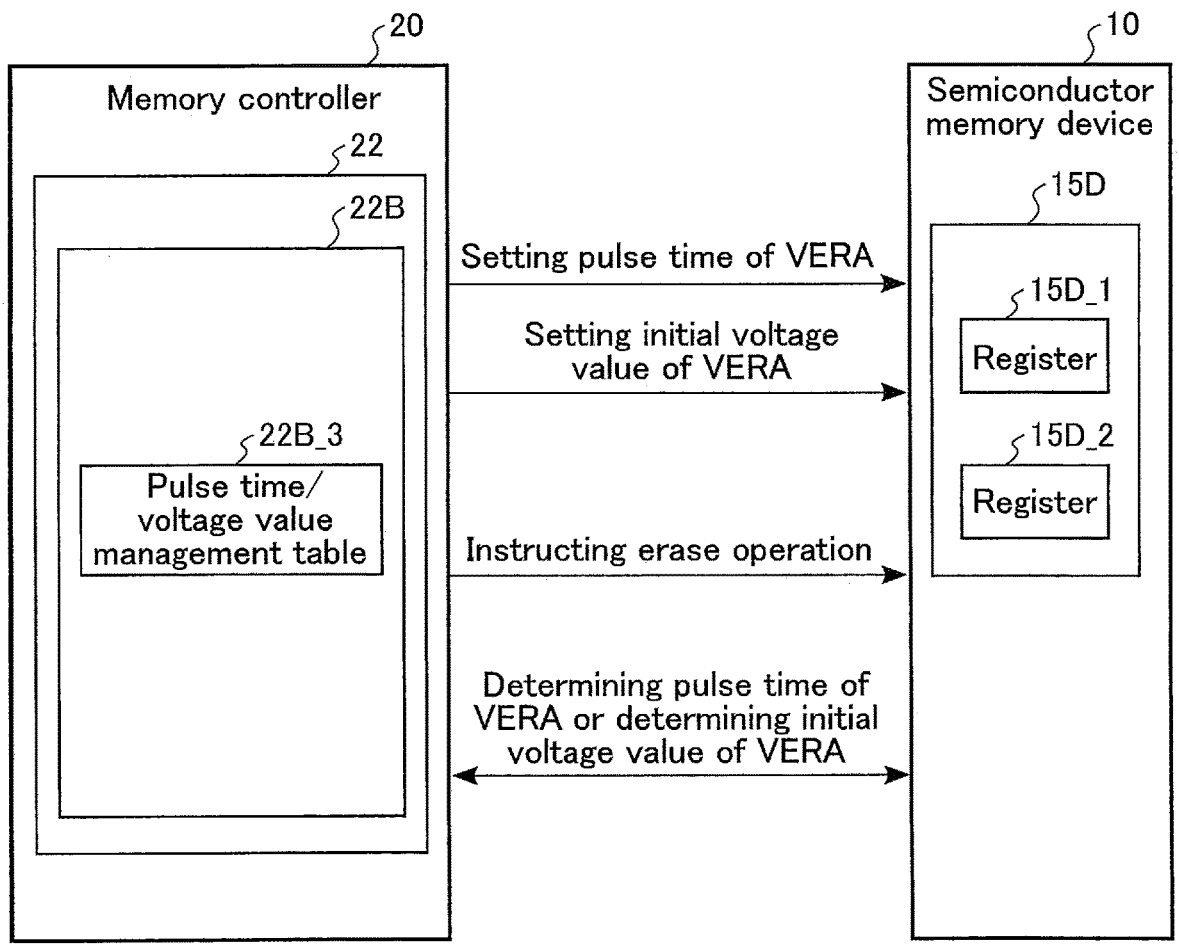
F I G. 32
F I G. 33

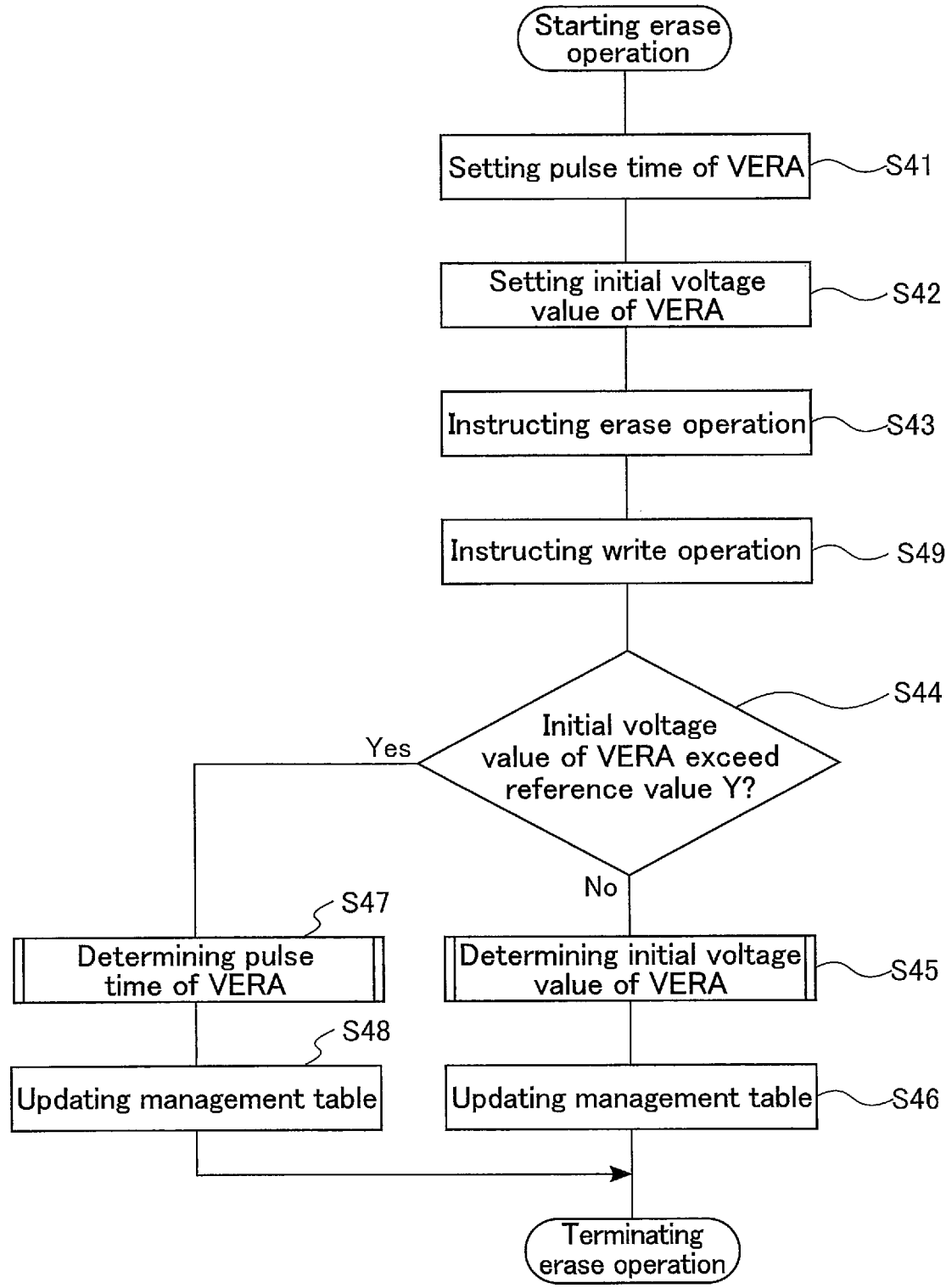
F I G. 35

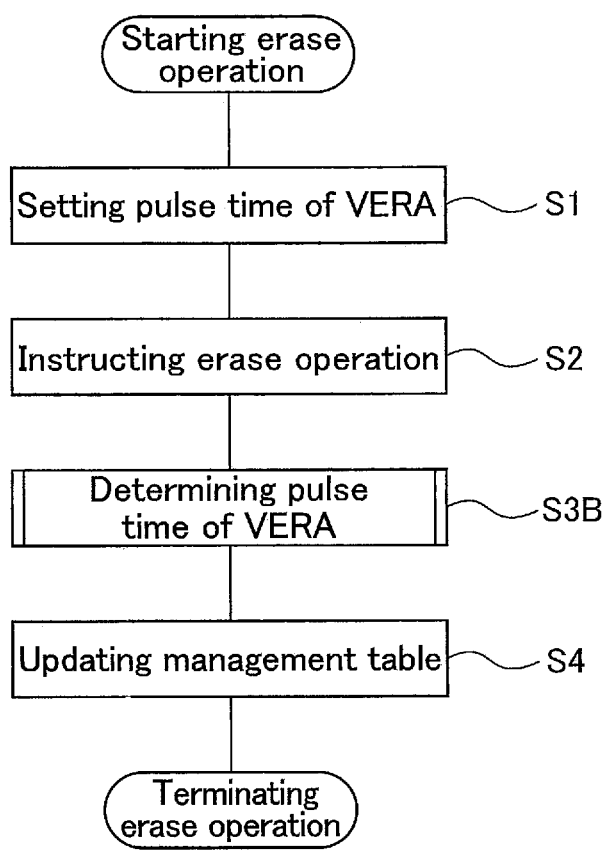
F I G. 38

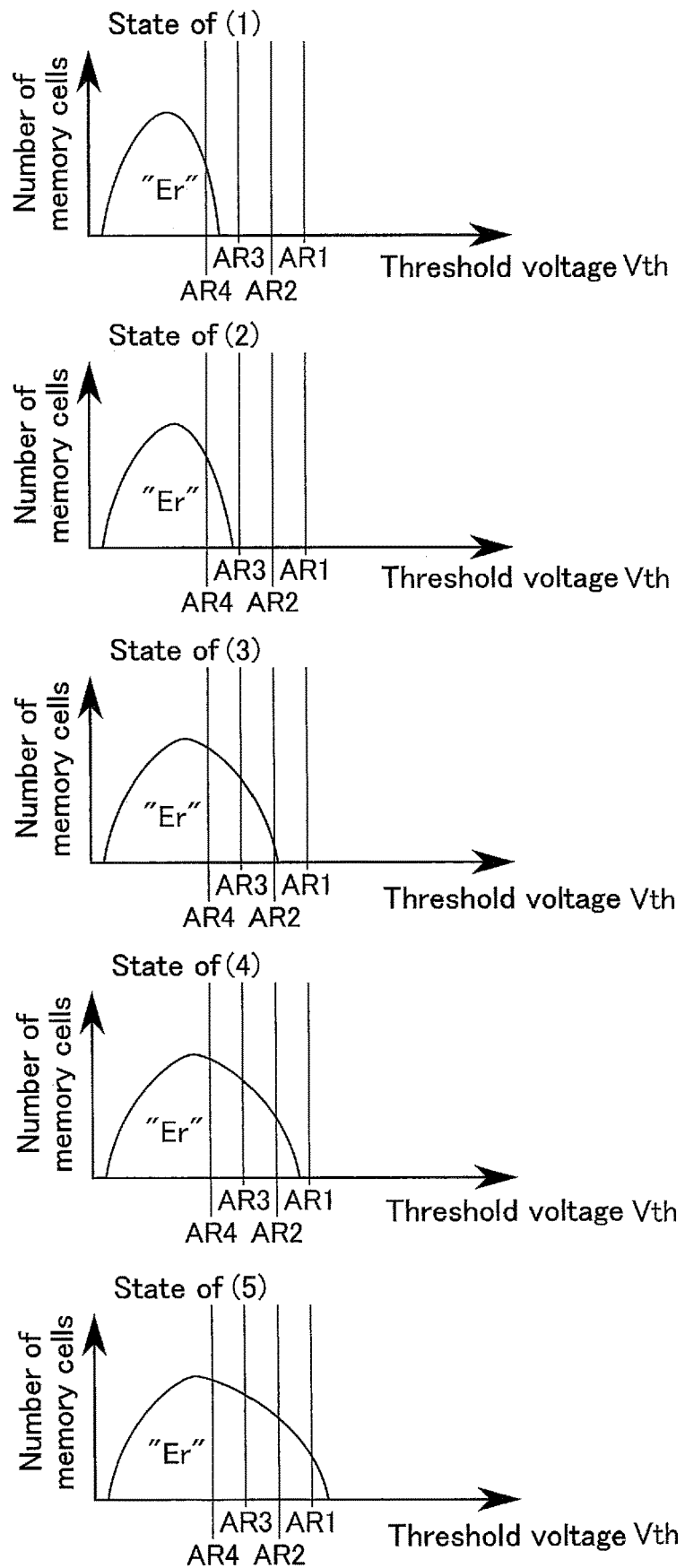
F I G. 40

| AR4 | AR3 | AR2 | AR1 | State |
|---|---|---|---|---|
| No | No | ... | ... | (1) Excessive erasure state |
| Yes | No | ... | ... | (2) Slightly excessive erasure state |
| No | Yes | No | ... | (3) Appropriate erasure state |
| No | Yes | Yes | No | (4) Slightly insufficient erasure state |
| No | Yes | Yes | Yes | (5) Insufficient erasure state |

F I G. 41

MEMORY SYSTEM AND SEMICONDUCTOR MEMORY DEVICE

CROSS-REFERENCE TO RELATED APPLICATIONS

This application is based upon and claims the benefit of priority from the Japanese Patent Application No. 2020-124259, filed Jul. 21, 2020, the entire contents of which are incorporated herein by reference.

FIELD

Embodiments described herein relate generally to a memory system and a semiconductor memory device.

BACKGROUND

As a non-volatile semiconductor memory device, for example, a NAND flash memory, in which memory cells are two-dimensionally or three-dimensionally arranged, is known. A NAND flash memory and a controller that controls the NAND flash memory form a memory system.

BRIEF DESCRIPTION OF THE DRAWINGS

FIG. 2 is a block diagram showing a configuration of a memory chip in a semiconductor memory device.

FIG. 4 is a cross-sectional view of a partial region of a block with the memory cell array.

FIG. 5B is a diagram showing the degree of erasure in memory cell transistors after an erase operation.

FIG. 9 is a diagram showing operations performed between a memory controller and the semiconductor memory device.

FIG. 13 is a diagram showing an example of the number of OFF bits stored in a buffer when a read is performed at a judgment level.

FIG. 14 is a diagram showing another example of the number of OFF bits stored in the buffer when the read is performed at the judgment level.

FIG. 15 is a diagram showing a command sequence in the first example of the erase operation according to the first embodiment.

FIG. 17 is a flowchart showing a second example of the erase operation in the memory system according to the first embodiment.

FIG. 27 is a diagram showing a command sequence in the first example of the erase operation according to the second embodiment.

FIG. 32 is a diagram showing operations performed between the memory controller and the semiconductor memory device.

FIG. 33 is a diagram showing an example of a management table for a pulse time and a voltage value, provided in a memory of the memory controller.

FIG. 35 is a flowchart showing a second example of the erase operation in the memory system according to the third embodiment.

FIG. 38 is a flowchart showing a second example of the erase operation in a memory system according to the fourth embodiment.

FIG. 40 is a diagram showing threshold voltage distributions of memory cells corresponding to judgment levels AR1 to AR4 used in the processing shown in FIG. 39.

FIG. 41 is a diagram showing a relationship between the number of OFF bits obtained at the judgment levels AR1 to AR4 and erasure states.

DETAILED DESCRIPTION

Figure 1:
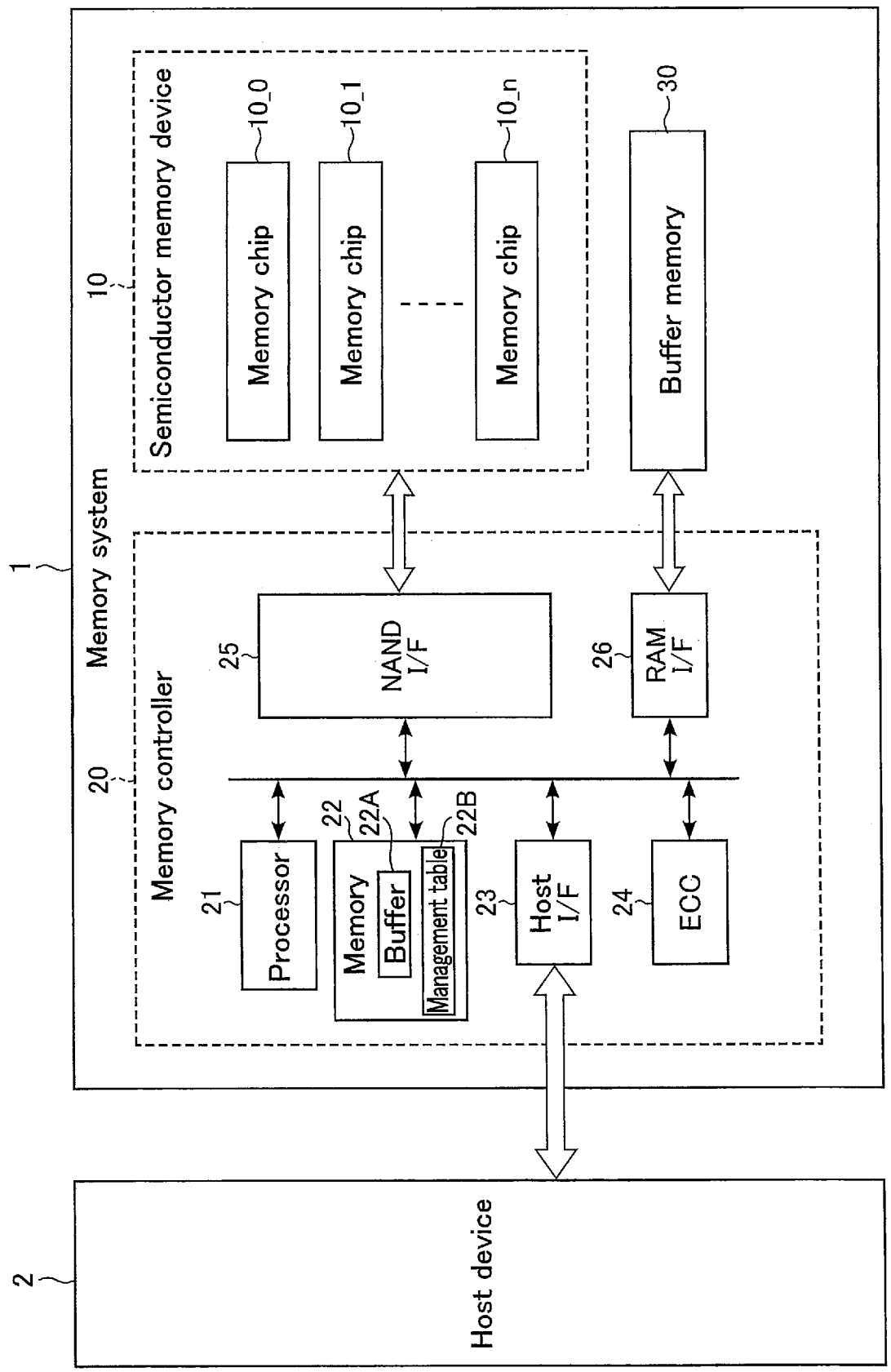
FIG. 1 is a block diagram showing a configuration of a memory system according to a first embodiment.

In general, according to one embodiment, a memory system includes a semiconductor memory device and a controller. The semiconductor memory device includes a first memory cell configured to store data. The controller is configured to output a first parameter and a first command. The first parameter relates to an erase voltage for a first erase operation with respect to the first memory cell. The first command instructs the first erase operation. The controller outputs the first command after outputting the first parameter to the semiconductor memory device.

Hereinafter, the embodiments will be described with reference to the drawings. In the following description, constituent elements having the same function and configuration will be assigned common reference numerals. The embodiments to be described below are shown as an example of a device or a method for embodying the technical idea of the embodiments, and are not intended to limit the material, shape, structure, arrangement, etc. of components to those described below.

Each of the function blocks can be implemented in the form of hardware, computer software, or a combination thereof. The function blocks are not necessarily categorized as in the later example. For example, part of the functions may be implemented by a function block other than the exemplary function blocks. In addition, the exemplary function blocks may be further divided into functional sub-blocks. Hereinafter, a three-dimensionally stacked type NAND flash memory in which memory cell transistors are stacked above a semiconductor substrate will be described as an example of the semiconductor memory device included in the memory system.

1. First Embodiment

A memory system according to a first embodiment will be described.

1.1 Configuration 1.1.1 Configuration of Memory System

First, a configuration of a memory system according to the first embodiment will be described with reference to FIG. 1. FIG. 1 is a block diagram showing a configuration of the memory system according to the first embodiment. A memory system 1 includes a semiconductor memory device 10, a memory controller 20, and a buffer memory 30. The memory system 1 is coupled to an external host device 2 and is configured to execute various operations in response to instructions from the host device 2.

The semiconductor memory device 10 includes one or more memory chips $10\_0$, $10\_1$, $10\_2$, . . . , $10\_n$ (n is a natural number equal to or greater than 0). The memory chip $10n$ includes a plurality of memory cells and stores data in a non-volatile manner. The semiconductor memory device 10 will be described later in detail.

The memory controller 20 is coupled to the semiconductor memory device 10 via a NAND bus. The NAND bus receives and transmits signals compatible with a NAND interface. The memory controller 20 is coupled to the host device 2 via a host bus. The memory controller 20 controls the semiconductor memory device 10. The memory controller 20 accesses the semiconductor memory device 10 in response to an instruction received from the host device 2.

The buffer memory 30 temporarily stores write data and read data transmitted and received between the semiconductor memory device 10 and the host device 2. The buffer memory 30 is comprised of, for example, a dynamic random access memory (DRAM), a static random access memory (SRAM), etc.

The semiconductor memory device 10 and the memory controller 20 may form one semiconductor device in combination, for example. Examples of such a semiconductor device include a memory card including an SD™ card, a solid state drive (SSD), etc. The memory controller 20 may be a system-on-a-chip (SoC), for example.

The host device 2 is, for example, a digital camera, a personal computer, etc., and the host bus is, for example, an SD™ interface-compatible bus.

1.1.2 Configuration of Memory Controller 20

A configuration of the memory controller 20 will be described with reference to FIG. 1 again. The controller 20 includes a central processing unit (CPU) (or processor) 21, a memory 22, a host interface (host I/F) 23, an error checking and correcting (ECC) circuit 24, a NAND interface (NAND I/F) 25, and a RAM interface (RAM I/F) 26.

The CPU 21 controls the operation of the memory controller 20. For example, upon receipt of a write instruction from the host device 2, the CPU 21 issues, in response thereto, a write instruction to the NAND interface 25. Similar processing is performed when reading and erasing data. The CPU 21 executes various types of processing such as wear leveling, for managing the semiconductor memory device 10. Operations of the memory controller 20, which will be described hereinafter, may be realized by the CPU 21 executing software (or firmware) or may be realized by hardware.

The memory 22 is, for example, a semiconductor memory such as a DRAM or an SRAM, and is used as a work area of the CPU 21. The memory 22 stores a buffer 22A configured to store various types of information, firmware for managing the semiconductor memory device 10, various types of management tables 22B, etc. The buffer 22A stores, for example, information on an erase result of a memory cell after an erase operation or after a write operation subsequent to the erase operation, that is, information indicative of an erasure state in a memory cell group (for example, a block) which is a target of erasure after the erase operation or the write operation. The management table 22B includes, for example, a parameter of an erase voltage VERA associated with each block. The parameter includes a pulse time or an initial voltage value of the erase voltage VERA. The management table 22B includes management tables 22B_1, 22B_2, and 22B_3 to be described later.

The host interface 23 is coupled to the host device 2 via a host bus, and controls communications with the host device 2. The host interface 23 transfers instructions and data received from the host device 2 to the CPU 21, the memory 22, and the buffer memory 30, respectively. In response to an instruction from the CPU 21, the host interface 23 transfers data in the buffer memory 30 to the host device 2.

The ECC circuit 24 executes error correction processing on data. At the time of a write operation, the ECC circuit 24 generates parity based on write data received from the host device 2, and adds the generated parity to the write data. At the time of a read operation, the ECC circuit 24 generates a syndrome based on read data received from the semiconductor memory device 10, and detects and corrects errors in the read data based on the generated syndrome.

The NAND interface 25 is coupled to the semiconductor memory device 10 via a NAND bus, and controls communications with the semiconductor memory device 10. The NAND interface 25 transmits various signals to and receives various signals from the semiconductor memory device 10 based on instructions received from the CPU 21.

1.1.3 Configuration of Semiconductor Memory Device 10

Next, a configuration of the semiconductor memory device 10 will be described. As shown in FIG. 1, the semiconductor memory device 10 includes the plurality of memory chips 10_$n$. The memory chip 10_$n$ includes, for example, a NAND flash memory capable of storing data in a non-volatile manner.

1.1.3.1 Configuration of Memory Chip

A configuration of the memory chip 10_$n$ will be described with reference to FIG. 2. FIG. 2 is a block diagram illustrating a configuration of the memory chip 10_$n$ in the semiconductor memory device 10. The memory chip 10_$n$ includes a memory cell array 11, an input/output circuit 12, a logic control circuit 13, a ready/busy circuit 14, a register group 15, a sequencer (or a control circuit) 16, a voltage generator 17, a driver 18, a row decoder module 19, a column decoder 31, and a sense amplifier module 32. The register group 15 includes a status register 15A, an address register 15B, a command register 15C, and a register 15D.

The memory cell array 11 includes one or more blocks BLK0, BLK1, BLK2, . . . , and BLKm (where m is an integer equal to or greater than 0). Each of the blocks BLK0 to BLKm includes a plurality of memory cell transistors (hereinafter also referred to as "memory cells") each associated with a row and a column. The memory cell transistors are nonvolatile memory cells capable of being electrically erased and programmed. The memory cell array 11 includes a plurality of word lines, a plurality of bit lines, and a source line for applying voltages to the memory cell transistors. Hereinafter, a "block BLKr" (where r is an integer equal to or greater than 0 and equal to or less than m) refers to each of the blocks BLK0 to BLKm. A specific configuration of the block BLKr will be described later.

The input/output circuit 12 and the logic controller 13 are coupled to the memory controller 20 via an input/output terminal (or a NAND bus). The input/output circuit 12 transmits and receives an I/O signal DQ (such as DQ0, DQ1, DQ2, . . . , or DQ7) to and from the memory controller 20 via the input/output terminal. The I/O signal DQ communicates a command, an address, data, etc.

The logic controller 13 receives an external control signal from the memory controller 20 via the input/output terminal (or NAND bus). The external control signal includes, for example, a chip enable signal CEn, a command latch enable signal CLE, an address latch enable signal ALE, a write enable signal WEn, a read enable signal REn, and a write protect signal WPn. The symbol "n" assigned to the name of a signal indicates that the signal is active-low.

The chip enable signal CEn allows a memory chip 10_$n$ to be selected, and is asserted when this particular memory chip 10_$n$ is selected. The command latch enable signal CLE allows a command transmitted as a signal DQ to be latched in the command register 15C. The address latch enable signal ALE allows an address transmitted as a signal DQ to be latched in the address register 152. The write enable signal WEn allows data transmitted as a signal DQ to be stored in the input/output circuit 12. The read enable signal REn allows data read from the memory cell array 11 to be output as a signal DQ. The write protect signal WPn is asserted to prohibit writing and erasure with respect to the memory chip 10_$n$.

The ready/busy circuit 14 generates a ready/busy signal R/Bn in response to control by the sequencer 16. The ready/busy signal R/Bn indicates whether the memory chip 10_$n$ is in a ready state or in a busy state. The ready state indicates that an instruction from the memory controller 20 can be received. The busy state indicates that an instruction from the memory controller 20 cannot be received. Through reception of the ready/busy signal R/Bn from the memory chip 10_$n$, the memory controller 20 can recognize whether the memory chip 10_$n$ is in the ready state or in the busy state.

The status register 15A stores status information STS required for operations of the memory chip 10_$n$, and transfers this status information STS to the input/output circuit 12, based on an instruction from the sequencer 16. The address register 152 stores an address ADD transferred from the input/output circuit 12. The address ADD includes a row address and a column address. The row address includes, for example, a block address that specifies an operation target block BLKr, and a page address that specifies an operation target word line WL in the specified block. The command register 15C stores a command CMD transferred from the input/output circuit 12. The command CMD includes, for example, a write command that instructs the sequencer 16 to perform a write operation, and a read command that instructs the sequencer 16 to perform a read operation. The register 15D stores a parameter (for example, a pulse time or an initial voltage value) of the erase voltage VERA transmitted from the memory controller 20 and transferred from the input/output circuit 12. The register 15D includes registers 15D_1 and 15D_2 to be described later. For example, an SRAM is used for the status register 15A, the address register 15B, and the command register 15C, and the register 15D.

The sequencer 16 receives a command from the command register 15C, and collectively controls the memory chip 10_$n$ in accordance with a sequence based on the received command. The sequencer 16 controls the row decoder module 19, the column decoder 31, the sense amplifier module 32, the voltage generator 17, etc., thereby executing a write operation, a read operation, and an erase operation. Specifically, the sequencer 16 controls the row decoder module 19, the driver 18, and the sense amplifier module 32 based on a write command received from the command register 15C, and writes data into a plurality of memory cell transistors each of which is designated by the address ADD. The sequencer 16 controls the row decoder module 19, the driver 18, the column decoder 31, and the sense amplifier module 32 based on a read command received from the command register 15C, and reads data from the memory cell transistors each of which is designated by the address ADD. The sequencer 16 further controls the row decoder module 19, the driver 18, the column decoder 31, and the sense amplifier module 32 based on an erase command received from the command register 15C, and erases data stored in a block designated by the address ADD.

The voltage generator 17 receives a power supply voltage via a power supply terminal (not shown) from outside of the memory chip 10_n. By using this power supply voltage, the voltage generator 17 generates voltages required for a write operation, a read operation, and an erase operation. The voltage generator 17 supplies the generated voltages to the memory cell array 11, the driver 18, and the sense amplifier module 32.

The driver 18 receives a plurality of voltages from the voltage generator 17. Of the voltages supplied from the voltage generator 17, the driver 18 supplies voltages respectively selected for a read operation, a write operation, and an erase operation to the row decoder module 19 via a plurality of signal lines. The driver 18 supplies, for example, the erase voltage VERA to a well interconnect CPWELL to be described later, at the time of an erase operation.

The row decoder module 19 receives a row address from the address register 15B, and decodes the received row address. The row decoder module 19 selects one of the blocks based on a result of decoding the row address, and selects a word line WL in the selected block BLKr. The row decoder module 19 transfers voltages supplied from the driver 18 to the selected block BLKr.

The column decoder 31 receives a column address from the address register 15B, and decodes the received column address. The column decoder 31 selects a bit line based on a result of decoding the column address.

In a read operation of data, the sense amplifier module 32 detects and amplifies data read from memory cell transistors to a corresponding bit line. The sense amplifier module 32 temporarily stores read data DAT read from the memory cell transistors, and transfers the read data DAT stored therein to the input/output circuit 12. During a write operation of data, the sense amplifier module 32 temporarily stores write data DAT transferred from the input/output circuit 12. The sense amplifier module 32 transfers the write data DAT to a corresponding bit line.

1.1.3.2 Configuration of Block

Next, a circuit configuration of the memory cell array 11 in the memory chip 10_n will be described with reference to FIG. 3. The memory cell array 11 includes a plurality of blocks BLK0 to BLKm, as described above. A description will be given of a circuit configuration of only a single block BLKr; however, the configurations of the other blocks are similar thereto.

Figure 3:
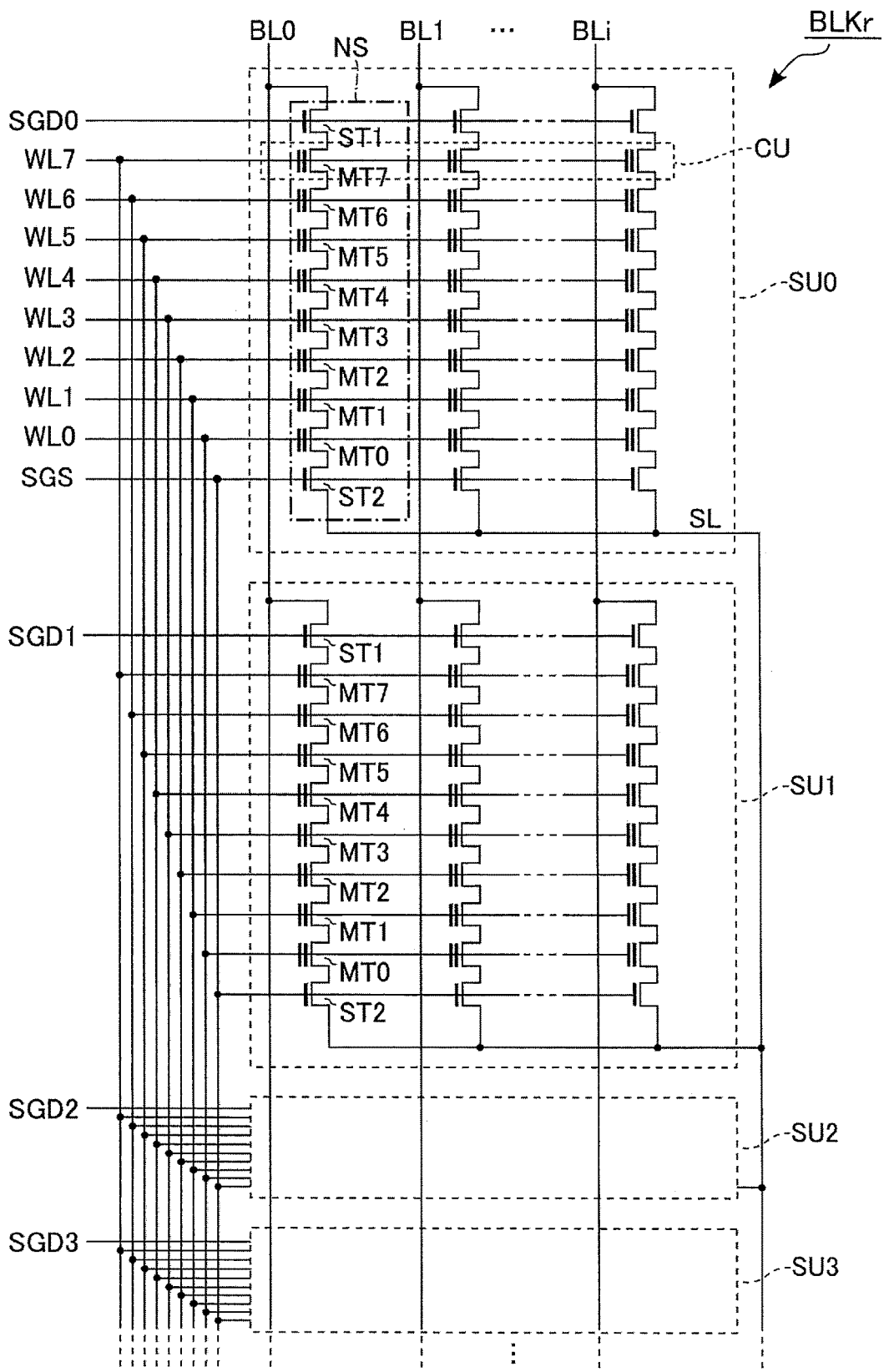
FIG. 3 is a circuit diagram of a block in a memory cell array.

FIG. 3 is a circuit diagram of a block BLKr in the memory cell array 11. The block BLKr includes, for example, a plurality of string units SU0, SU1, SU2, and SU3. The following description assumes that a "string unit SU" refers to each of the string units SU0 to SU3. Each of the string units SU0 to SU3 includes a plurality of NAND strings (or memory strings) NS.

The NAND strings NS each include a plurality of memory cell transistors MT0, MT1, MT2, . . . , and MT7, and select transistors ST1 and ST2. For simplicity of description, a case in which each NAND string NS includes eight memory cell transistors MT0 to MT7 and two select transistors ST1 and ST2 will be described herein as an example. The following description assumes that a "memory cell transistor MT" refers to each of the memory cell transistors MT0 to MT7.

The memory cell transistors MT0 to MT7 each include a control gate and a charge storage layer, and store data in a non-volatile manner. The memory cell transistors MT0 to MT7 are coupled in series between a source of the select transistor ST1 and a drain of the select transistor ST2.

The memory cell transistor MT is capable of storing one-bit data, or data of 2 or more bits.

Gates of select transistors ST1 included in a string unit SU0 are coupled to a select gate line SGD0. Similarly, gates of select transistors ST1 in the string units SU1 to SU3 are respectively coupled to select gate lines SGD1 to SGD3. The select gate lines SGD0 to SGD3 are each independently controlled by the row decoder module 19.

Gates of select transistors ST2 included in the string unit SU0 are coupled to a select gate line SGS. Similarly, gates of select transistors ST2 in the string units SU1 to SU3 are coupled to the select gate line SGS. The gates of the select transistors ST2 in the string units SU0 to SU3 may be coupled to respective select gate lines SGS. The select transistors ST1 and ST2 are used to select a string unit SU in various operations.

Control gates of memory cell transistors MT0 to MT7 included in the block BLKr are respectively coupled to word lines WL0 to WL7. The word lines WL0 to WL7 are each independently controlled by the row decoder module 19.

Bit lines BL0 to BLi (where i is an integer equal to or greater than 0) are each coupled to a plurality of blocks BLK0 to BLKm, and are respectively coupled to corresponding NAND strings NS in string units SU included in the block BLKr. That is, of a plurality of NAND strings NS arranged in a matrix pattern in the block BLKr, each of the bit lines BL0 to BLi is coupled to drains of select transistors ST1 of a corresponding set of NAND strings NS in the same column. A source line SL is coupled to the blocks BLK0 to BLKm. That is, the source line SL is coupled to sources of the plurality of select transistors ST2 included in the block BLKr.

In short, each string unit SU includes a plurality of NAND strings NS that are coupled to different bit lines BL and coupled to the same select gate line SGD. Moreover, the block BLKr includes a plurality of string units SU that share the same word lines WL. Furthermore, the memory cell array 11 includes a plurality of blocks BLK0 to BLKm that share the same bit lines BL.

The block BLKr is, for example, a unit of data erasure. That is, data stored in memory cell transistors MT included in the block BLKr is erased in a batch. Data may be erased in units of string units SU or in smaller units.

A plurality of memory cell transistors MT that share a word line WL in one string unit SU will be referred to as a "cell unit CU". A set of one-bit data items respectively stored in the memory cell transistors MT included in the cell unit CU will be referred to as a "page". A cell unit CU varies in storage capacity according to the number of bits of data stored in the respective memory cell transistors MT. For example, the cell unit CU stores 1-page data when each memory cell transistor MT stores one-bit data, stores 2-page data when each memory cell transistor MT stores two-bit data, and stores 3-page data when each memory cell transistor MT stores three-bit data.

A write operation and a read operation are performed on the cell unit CU on a page-by-page basis. In other words, a read operation and a write operation are collectively performed on a plurality of memory cell transistors MT coupled to a single word line WL provided in a single string unit SU.

The string units provided in the block BLKr are not limited to SU0 to SU3, and the number of the string units may be designated as any number. The number of NAND strings NS included in each string unit SU, and the number of memory cell transistors and select transistors included in each NAND string NS may also be designated as any number. Furthermore, each memory cell transistor MT may be a metal-oxide-nitride-oxide-silicon (MONOS) type, which uses an insulating film as a charge storage layer, or a floating-gate (FG) type, which uses a conductive layer as a charge storage layer.

Next, a cross-sectional structure of the block BLKr will be described with reference to FIG. 4. FIG. 4 is a cross-sectional view of a partial region of the block BLKr. As shown in FIG. 4, a p-well region 40P is provided above a semiconductor substrate 40. A plurality of NAND strings NS are provided above the p-well region 40P. Specifically, an interconnect layer 41, eight interconnect layers 42, and an interconnect layer 43 are sequentially stacked above the p-well region 40P. The interconnect layer 41 functions as a select gate line SGS. The interconnect layers 42 respectively function as word lines WL0 to WL7. The interconnect layer 43 functions as a select gate line SGD. Insulating layers (not shown) are provided between these stacked interconnect layers.

A pillar-shaped conductor 44, which extends through the interconnect layers 41, 42, and 43 to reach the p-well region 40P, is provided. On the side surface of the conductor 44, a gate insulating layer 45, a charge storage layer (insulating layer) 46, and a block insulating layer 47 are sequentially provided. With these, the memory cell transistors MT and select transistors ST1 and ST2 are provided. The conductor 44 functions as a current path of each NAND string NS, and is used as a region in which a channel of each transistor is formed. The upper end of the conductor 44 is coupled to a metal interconnect layer 49 with a via 48 interposed therebetween. The metal interconnect layer 49 functions as a bit line BL.

In a surface region of the p-well region 40P, an n$^+$-type impurity diffusion layer 40S is provided. A contact plug 50 is provided on the diffusion layer 40S. The contact plug 50 is coupled to a metal interconnect layer 51. The metal interconnect layer 51 functions as a source line SL.

In the surface region of the p-well region 40P, a p$^+$-type impurity diffusion layer 40C is also provided. A contact plug 52 is provided on the diffusion layer 40C. The contact plug 52 is coupled to a metal interconnect layer 53. The metal interconnect layer 53 functions as a well interconnect CPWELL. The well interconnect CPWELL is used to apply a potential to the conductor 44 via the p-well region 40P.

A plurality of configurations described above are arranged in the direction perpendicular to the sheet of FIG. 4 (the depth direction), and a set of a plurality of NAND strings NS aligned in the depth direction form a string unit SU.

The memory cell array 11 may have other configurations. For example, the memory cell array 11 may have the configuration described in U.S. patent application Ser. No. 12/407,403, entitled "THREE DIMENSIONAL STACKED NONVOLATILE SEMICONDUCTOR MEMORY", filed on Mar. 19, 2009. The memory cell array 11 may also have the configuration described in each of U.S. patent application Ser. No. 12/406,524, entitled "THREE DIMENSIONAL STACKED NONVOLATILE SEMICONDUCTOR MEMORY", filed on Mar. 18, 2009; U.S. patent application Ser. No. 12/679,991, entitled "NON-VOLATILE SEMICONDUCTOR STORAGE DEVICE AND METHOD OF MANUFACTURING THE SAME", filed on Mar. 25, 2010; and U.S. patent application Ser. No. 12/532,030, entitled "SEMICONDUCTOR MEMORY AND METHOD FOR MANUFACTURING SAME", filed on Mar. 23, 2009. The entire contents of these patent applications are incorporated herein by reference.

Data erasing can be performed in units of blocks BLK, or smaller units. The erasing method is described in, for example, U.S. patent application Ser. No. 13/235,389, entitled "NONVOLATILE SEMICONDUCTOR MEMORY DEVICE", filed on Sep. 18, 2011. The erasing method is also described in U.S. patent application Ser. No. 12/694,690, entitled "NON-VOLATILE SEMICONDUCTOR STORAGE DEVICE", filed on Jan. 27, 2010. Furthermore, the method is described in U.S. patent application Ser. No. 13/483,610, entitled "NONVOLATILE SEMICONDUCTOR MEMORY DEVICE AND DATA ERASE METHOD THEREOF", filed on May 30, 2012. The entire contents of these patent applications are incorporated herein by reference.

1.1.3.3 Threshold Voltage Distributions of Memory Cell Transistors

Figure 5A:
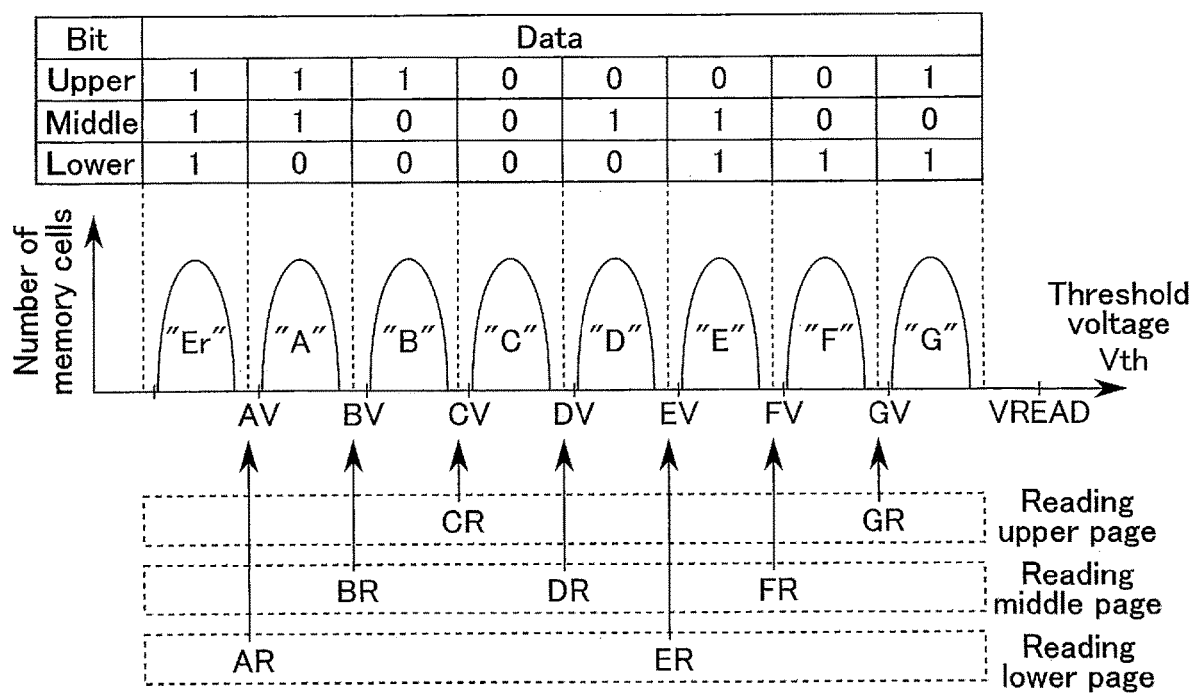
FIG. 5A is a diagram showing a relationship between data and threshold voltage distributions that may be observed in memory cell transistors.

Next, a relationship between data and threshold voltage distributions that may be observed in memory cell transistors MT according to the present embodiment will be described. FIG. 5A is a diagram showing a relationship between data and threshold voltage distributions that may be observed in memory cell transistors MT. An example described herein is a case in which a triple-level cell (TLC) method by which three-bit data can be stored in a single memory cell transistor MT is adopted as a storage method of the memory cell transistors MT. The present embodiment is applicable to cases using other storage methods such as a single-level cell (SLC) method by which one-bit data can be stored in a single memory cell transistor MT, a multi-level cell (MLC) method by which two-bit data can be stored in a single memory cell transistor MT, a quad-level cell (QLC) method by which four-bit data can be stored in a single memory cell transistor MT, etc.

3-bit data that a memory cell transistor MT can store is constituted by a lower bit, a middle bit, and an upper bit. In the case of a memory cell transistor MT storing three bits, the memory cell transistor MT may take any of the eight states corresponding to a plurality of threshold voltages. The eight states are referred to as a state "Er", a state "A", a state "B" a state "C" a state "D", a state "E", a state "F", and a state "G" in ascending order. The plurality of memory cell transistors MT each belonging to any of the states "Er", "A", "B", "C", "D", "E", "F", and "G" form threshold voltage distributions such as shown in FIG. 5A.

For example, data "111", "110", "100", "000", "010", "011", "001", and "101" are respectively allocated to the states "Er", "A", "B", "C", "D", "E", "F", and "G". Data alignment is expressed as "Z, Y, X" where "X" represents a lower bit, "Y" represents a middle bit, and "Z" represents an upper bit. Threshold voltage distributions and data allocation may be set freely.

In order to read data stored in a memory cell transistor MT which is a target of a read, a state to which a threshold voltage of this memory cell transistor MT belongs is judged. To judge a state, read voltages AR, BR, CR, DR, ER, FR, and GR are used.

The state "Er" corresponds to, for example, a state in which data has been erased (an erasure state). The threshold voltages of memory cell transistors MT, which belong to the state "Er", are lower than the voltage AR and take on a negative value, for example.

The states "A" to "G" correspond to states in which a charge is injected into the charge storage layer and data is written into the memory cell transistor MT. The threshold voltages of memory cell transistors MT, which belong to the states "A" to "G", take on a positive value, for example. The threshold voltages of memory cell transistors MT, which belong to the state "A", are higher than the read voltage AR and are equal to lower than the read voltage BR. The threshold voltages of memory cell transistors MT, which belong to the state "B", are higher than the read voltage BR and are equal to lower than the read voltage CR. The threshold voltages of memory cell transistors MT, which belong to the state "C", are higher than the read voltage CR and are equal to lower than the read voltage DR. The threshold voltages of memory cell transistors MT, which belong to the state "D", are higher than the read voltage DR and are equal to lower than the read voltage ER. The threshold voltages of memory cell transistors MT, which belong to the state "E", are higher than the read voltage ER and are equal to lower than the read voltage FR. The threshold voltages of memory cell transistors MT, which belong to the state "F", are higher than the read voltage FR and are equal to lower than the read voltage GR. The threshold voltages of memory cell transistors MT, which belong to the state "G", are higher than the read voltage GR and are equal to lower than a read voltage VREAD.

The voltage VREAD is a voltage which is applied to the word lines WL connected to the memory cell transistors MT in the cell unit CU, which is not a target of a read, and is higher than the threshold voltages of the memory cell transistors MT in any state. Accordingly, when the voltage VREAD is applied to a control gate of a memory cell transistor MT, this memory cell transistor MT is turned on regardless of data stored therein.

A verify voltage used in a write operation is set between neighboring threshold voltage distributions. Specifically, verify voltages AV, BV, CV, DV, EV, FV, and GV are respectively set in correspondence with the states "A", "B", "C", "D", "E", "F", and "G". For example, the verify voltages AV, BV, CV, DV, EV, FV, and GV are set to voltages slightly higher than the read voltages AR, BR, CR, DR, ER, FR, and GR, respectively.

As described above, each memory cell transistor MT can be set to any of the eight states, and is capable of storing three-bit data. A write and a read are performed on a page-by-page basis in a single cell unit CU. In the case where three-bit data is stored in each memory cell transistor MT, each lower bit, each middle bit, and each upper bit are respectively allocated to three pages in a single cell unit CU. With respect to a lower bit, a middle bit, and an upper bit, a page that is written by one write operation or is read by one read operation, that is, a set of lower bits, a set of middle bits, and a set of upper bits held in a cell unit CU are respectively referred to as a lower page, a middle page, and an upper page.

In the case where the data allocation described above is applied, the lower page is confirmed by a read operation using the read voltages AR and ER. The middle page is confirmed by a read operation using the read voltages BR, DR, and FR. The upper page is confirmed by a read operation using the read voltages CR and GR.

1.2 Operation

An erase operation in the memory system 1 according to the first embodiment will be described below. The erase operation is an operation to set memory cells to an erasure state. In other words, the erase operation is an operation in which electrons stored in a charge storage layer of each memory cell transistor MT is drawn out, thereby causing the threshold voltage of the memory cell transistor MT to transition to a threshold voltage distribution corresponding to the state "Er".

FIG. 5B is a diagram showing the threshold voltage distributions of memory cell transistors MT after the erase operation. When the erase operation is performed on the memory cell transistors MT, the erasure state of memory cell transistors MT which belong to the state "Er" transitions to any of an insufficient erasure state, an appropriate erasure state, and an excessive erasure state.

The insufficient erasure state is a state in which, as shown by (a) in FIG. 5B, the state "Er" enters into the tail of the state "A" in the threshold voltage distributions, and in which drawing out of electrons stored in a charge storage layer of each memory cell transistor MT is insufficient. The appropriate erasure state is a state in which, as shown by (b) in FIG. 5B, the state "Er" and the state "A" are separated from each other by an appropriate interval in the threshold voltage distributions, and in which the amount of electrons stored in a charge storage layer of each memory cell transistor MT is appropriate. The excessive erasure state is a state in which, as shown by (c) in FIG. 5B, the state "Er" and the state "A" are separated from each other by an interval greater than an appropriate interval, and in which drawing out of electrons stored in a charge storage layer of each memory cell transistor MT is excessive.

After the erase operation, the erasure state of memory cell transistors MT is any of the insufficient erasure state, the appropriate erasure state, and the excessive erasure state. The erasure state of memory transistors MT after the erase operation is defined as the degree of erasure.

Damage caused to a memory cell can be reduced by preventing the transition of memory cell transistors MT into the excessive erasure state, in other words, preventing the memory cell transistors MT from increasing in degree of erasure. Furthermore, read errors can be reduced in page reads by preventing the transition of memory cell transistors MT into the insufficient erasure state, in other words, preventing the memory cell transistors MT from decreasing in degree of erasure.

1.2.1 Erase Operation of Memory System

The erase operation of data stored in the semiconductor memory device 10 is executed under an erase instruction output from the memory controller 20 to the semiconductor memory device 10. The erase operation in the semiconductor memory device 10 can be performed, for example, in units of blocks or smaller units, as described above. Herein, a case in which the erase operation is performed in units of blocks is described as an example.

Figure 6:
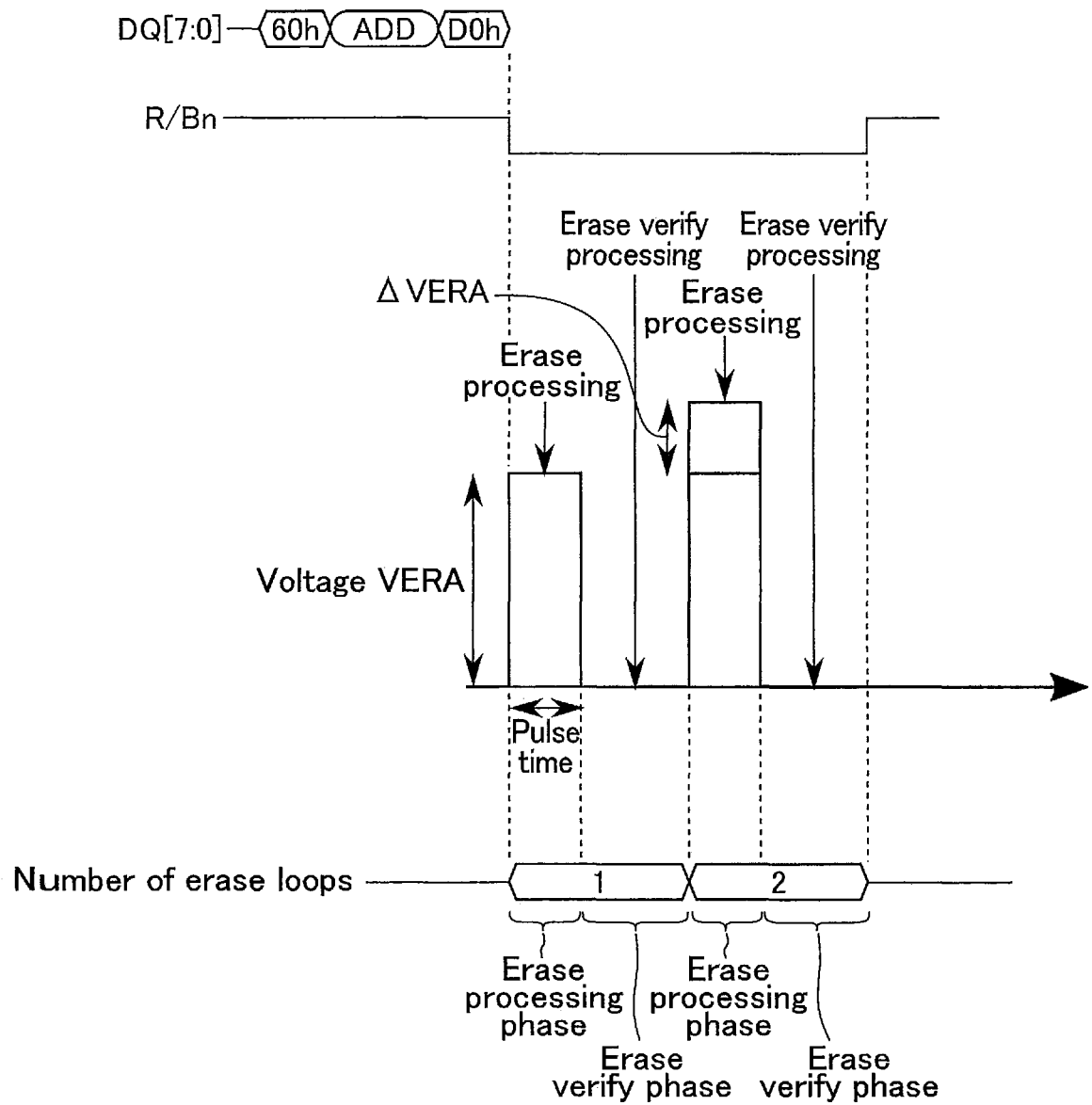
FIG. 6 is a diagram showing a basic erase operation in the memory system according to the first embodiment.

Hereinafter, a basic data erase operation in the memory system 1 will be described. FIG. 6 is a diagram showing the basic erase operation in the memory system 1. In FIG. 6, a command output in the form of I/O signals DQ0 to DQ7 from the memory controller 20 is expressed by a hexagon, whereas an address is expressed by a rounded corner square (or an ellipse).

As shown in FIG. 6, the memory controller 20 outputs, to the semiconductor memory device 10, an erase setup command "60h", an address "ADD" of an erasure target block, and thereafter an erase execution command "D0h". The sequencer 16 acknowledges receipt of an erase instruction by the command register 15C storing the erase setup command "60h". Furthermore, in response to receipt of the erase execution command "D0h", the sequencer 16 starts the erase operation. As shown in FIG. 6, the erase operation includes data erase processing and erase verify processing. In tandem with the start of the erase operation, the sequencer 16 causes the ready/busy signal R/Bn to transition from the ready state to the busy state (R/Bn="L"). In a command (or an address), the letter "h" assigned thereto indicates that a corresponding value is hexadecimal.

The erase operation is an operation to erase data stored in memory cell transistors MT in an erasure target block. More specifically, the erase operation is an operation in which electrons are drawn out from a charge storage layer of each memory cell transistor MT in an erasure target block by applying the erase voltage VERA to a well interconnect CPWELL. A pulse time of the erase voltage VERA to be applied may be set to a predetermined value. The pulse time is a time during which a voltage level of the erase voltage VERA is maintained, and is also referred to as a pulse width or a pulse length. The erase verify processing is an operation to verify erasure of data in memory cell transistors MT by the erase operation. In other words, the erase verify processing is an operation to confirm whether or not a threshold voltage of each memory cell transistor MT has transitioned to a threshold voltage in the erasure state.

In the erase operation, a single erase loop consists of erase processing and erase verify processing performed after the erase processing. The example in FIG. 6 shows a first verify loop and a second verify loop. In verification by the erase verify processing, if the number of memory cell transistors MT, which have a threshold voltage higher than a certain value, is less than a predetermined number, it is judged that an erasure target block has passed the erase verify. On the other hand, if the number of memory cell transistors MT, which have a threshold voltage higher than a certain value, is more than a predetermined number, it is judged that an erasure target block has failed the erase verify. Upon completion of these judgments, the sequencer 16 terminates the erase verify processing. A pair of the erase processing and the erase verify processing described above corresponds to a single erase loop. If an erasure target block fails the erase verify, the sequencer 16 repeats the erase loop. If the block passes the erase verify, the sequencer 16 terminates the erase operation.

Electrons injected into a charge storage layer of each memory cell transistor MT drop below a predetermined number through a plurality of erase loops, not in one stroke by the first erase loop. For example, as shown in FIG. 6, if an erase verify in the first erase loop fails, the second erase loop is carried out. The erase voltage VERA increased by AVERA is set every time erase processing is performed in the repeated erase loop. When an erasure target block passes the erase verify and the erase operation is terminated, the sequencer 16 causes the semiconductor memory device 10 to transition from the busy state to the ready state. After this transition to the ready state, the erase processing is terminated.

Figure 7:
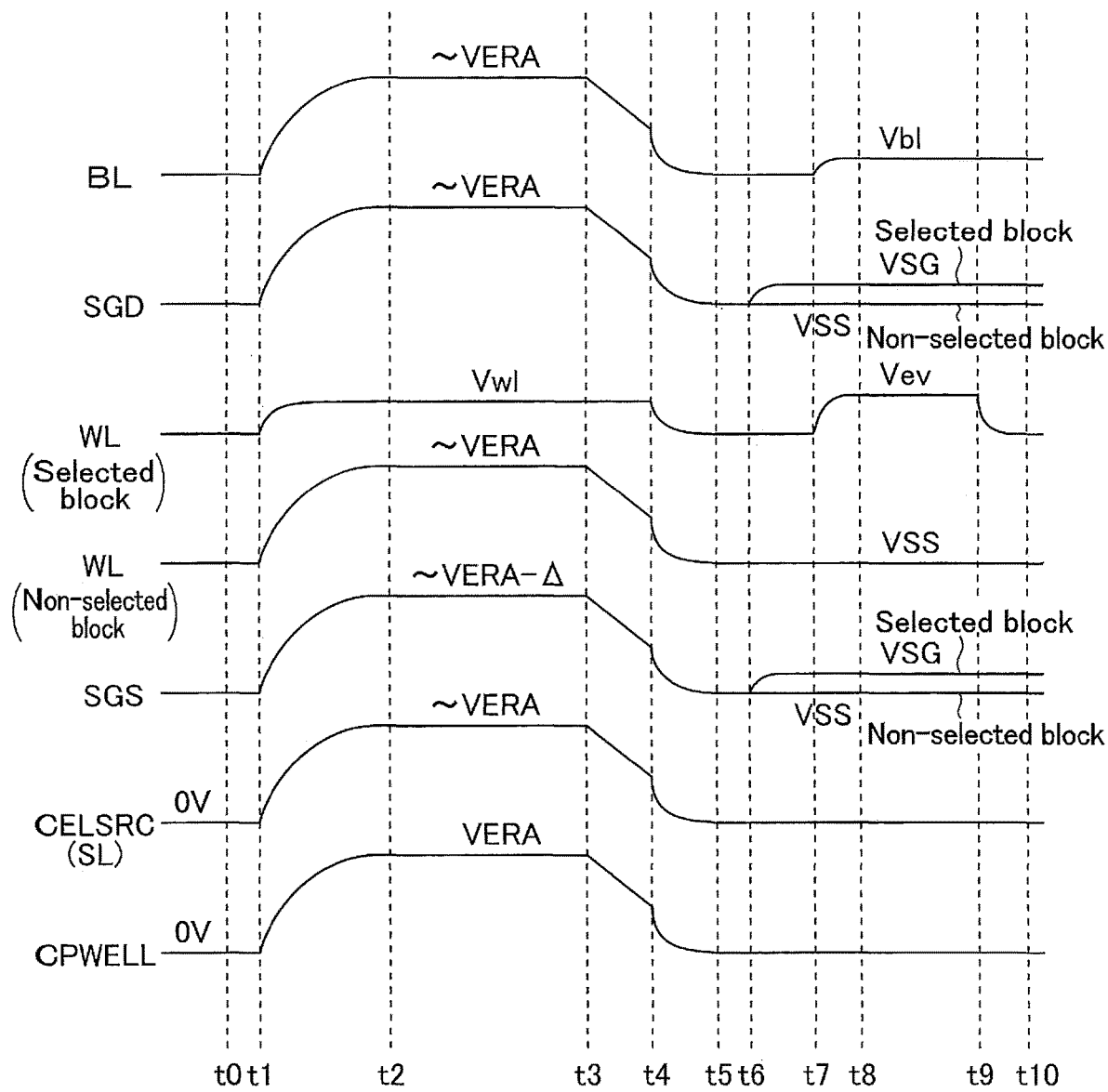
FIG. 7 is a diagram showing voltage waveforms of respective signals in the erase operation.

FIG. 7 is a diagram showing voltage waveforms of respective signals in the erase operation.

First, the erase processing is executed from time t0 to time t5, and thereafter, the erase verify processing is executed from time t5 to time t10. This processing sequence from t0 to t10 corresponds to a single erase loop.

Hereinafter, the erase processing will be described. At time to, a bit line BL, select gate lines SGD and SGS, word lines WL, a source line SELSRC, and a well interconnect CPWELL are set to a voltage VSS (for example, 0 V).

Next, from time t1 to time t3, for example, the driver 18 applies the erase voltage VERA to the well interconnect CPWELL. Accordingly, from time t1 to time t3, a channel region of a memory transistor MT is increased to the erase voltage VERA. Furthermore, because of capacitance coupling caused by the voltage VERA applied to the well interconnect CPWELL, the bit line BL, the select gate lines SGD and SGS, word lines WL of blocks which are not an erasure target (or non-selected blocks), and the source line SELSRC are increased to the voltage VERA. The select gate line SGS is increased to a voltage lower by a voltage Δ than the voltage VERA.

From time t1 to time t3, furthermore, the row decoder module 19 applies a voltage Vwl lower than the erase voltage VERA to word lines WL of an erasure target block (or a selected block). This causes a potential difference between the erase voltage VERA in the channel region of each memory cell transistor MT and the voltage Vwl of word lines WL of an erasure target block, so that electrons are drawn out from a charge storage layer to a channel layer in each memory cell transistor MT in the erasure target block. That is, data in the memory cell transistors MT in the erasure target block is erased.

Thereafter, from time t3 to time t5, the bit line BL, the select gate lines SGD and SGS, the word lines WL, the source line SELSRC, and the well interconnect CPWELL are set to the voltage VSS. The erase operation is thus completed.

Next, the erase verify processing from time t5 to time t10 will be described.

At time t6, the row decoder module 19 applies a voltage VSG to the select gate lines SGD and SGS of the selected block. The voltage VSG is a voltage that sets the select transistors ST1 and ST2 to the ON state.

Next, from time t7 to time t9, the row decoder module 19 applies an erase verify voltage Vev to the word lines WL of the erasure target block. The row decoder module 19 further applies the voltage VREAD to word lines WL of blocks which are not an erasure target. The erase verify voltage Vev is a read voltage for judging the erasure state of each memory cell transistor MT in an erasure target block.

With this, the sense amplifier module 32 senses and amplifies data read out to the bit line BL. In accordance with a result of this read, the sequencer 16 judges whether or not the erase operation on an erasure target block has been completed, that is, whether the block has passed or failed the erase verify. If the erase operation is not completed, the erase operation including the erase processing and the erase verify processing is repeatedly executed on the erasure target block.

1.2.2 Erase Operation in First Embodiment

In the erase operation according to the first embodiment, the pulse time of the erase voltage VERA is adjusted (or changed) based on an erase result of memory cells after an erase operation or based on an erase result of memory cells after a write operation subsequent to the erase operation. For example, the pulse time of the erase voltage VERA is extended or shortened. The erase result of memory cells indicates a determination result about the degree of erasure in memory cells after the erase operation. In other words, the erase result of memory cells indicates any of the insufficient erasure state, the appropriate erasure state, and the excessive erasure state that memory cells have after the erase operation.

1.2.2.1 First Example of Erase Operation

In the first example, after the erase operation, the pulse time of the erase voltage VERA is updated based on the erase result of memory cells belonging to a word line WL and a string unit SU which are a measurement target in an erasure target block. An example described herein is a case in which the pulse time of the erase voltage VERA is extended based on an erase result of memory cells.

Figure 8:
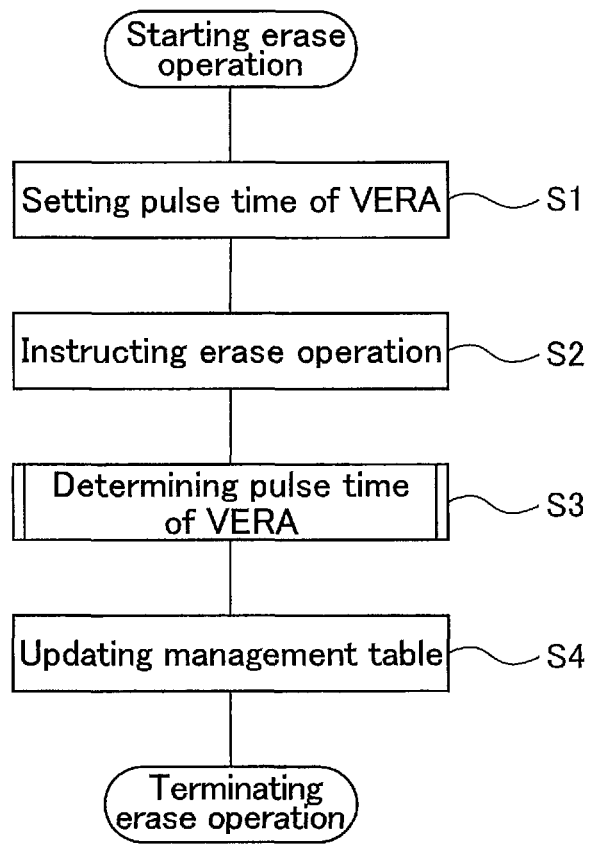
FIG. 8 is a flowchart showing a first example of the erase operation in the memory system according to the first embodiment.
Figure 10:
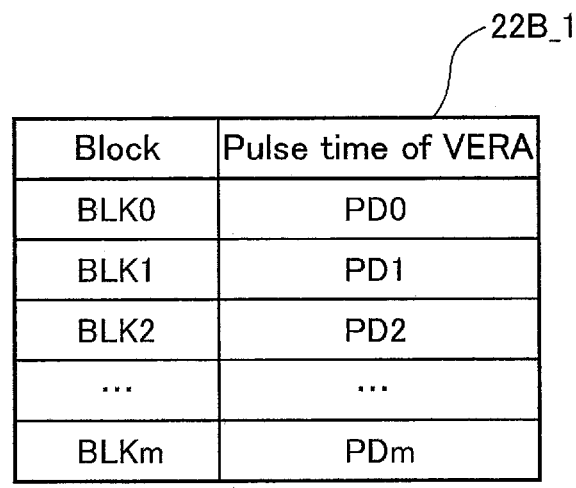
FIG. 10 is a diagram showing an example of a pulse time management table provided in a memory of the memory controller.

FIG. 8 is a flowchart showing a first example of the erase operation in the memory system 1 according to the first embodiment. FIG. 9 is a diagram showing operations performed between the memory controller 20 and the semiconductor memory device 10. FIG. 10 is a diagram showing an example of a pulse time management table 22B_1 provided in the memory 22 of the memory controller 20. The pulse time management table 22B_1 manages the pulse time of the erase voltage VERA. In the pulse time management table 22B_1, a block BLKr (where r is an integer equal to or greater than 0 and equal to or less than m) is associated with a pulse time PDr used for the erase operation on this block BLKr. The processing shown in FIG. 8 is instructed and controlled by the memory controller 20 (or the CPU 21).

As shown in FIGS. 8 and 9, when the erase operation is started, first, the memory controller 20 transmits to the semiconductor memory device 10 a pulse time PDr of the erase voltage VERA corresponding to the erasure target block BLKr in the pulse time management table 22B_1, thereby setting the pulse time PDr to the register 15D_1 of the semiconductor memory device 10. More specifically, the memory controller 20 obtains from the pulse time management table 22B_1 the pulse time PDr of the erase voltage VERA corresponding to the erasure target block BLKr, transmits the obtained pulse time PDr to the semiconductor memory device 10, and causes the register 15D_1 to store the pulse time PDr (step S1). For example, when an erasure target block is the block BLK0, the memory controller 20 transmits a pulse time PD0 associated with the block BLK0 to the semiconductor memory device 10, thereby causing the register 15D_1 to store the pulse time PD0.

Next, the memory controller 20 instructs the semiconductor memory device 10 to perform the erase operation (step S2). The sequencer 16 of the semiconductor memory device 10 executes the erase operation on the erasure target block BLKr using the pulse time PDr of the erase voltage VERA stored in the register 15D_1.

Next, after the semiconductor memory device 10 transitions to the ready state, the memory controller 20 obtains from the semiconductor memory device 10 an erase result of the erase operation on memory cells. Based on the erase result of the memory cells obtained from the semiconductor memory device 10, the memory controller 20 determines whether to update the pulse time PDr of the erase voltage VERA (hereinafter, this determination is also described as "determining the pulse time of the erase voltage VERA") (step S3). For example, the processing of "determining the pulse time of the erase voltage VERA" in step S3 is performed every time the erase operation is executed, every time the write operation/erase operation is executed a predetermined number of times, or when the number of times the write operation/erase operation is executed reaches a predetermined number. The processing of "determining the pulse time of the erase voltage VERA" in step S3 will be described later in detail.

Next, based on a determination result of "determining the pulse time of the erase voltage VERA" in step S3, the memory controller 20 updates or maintains without updating the pulse time PDr associated with the erasure target block BLKr in the pulse time management table 22B_1 of the memory 22 (step S4). The erase operation is thus completed.

Figure 11A:
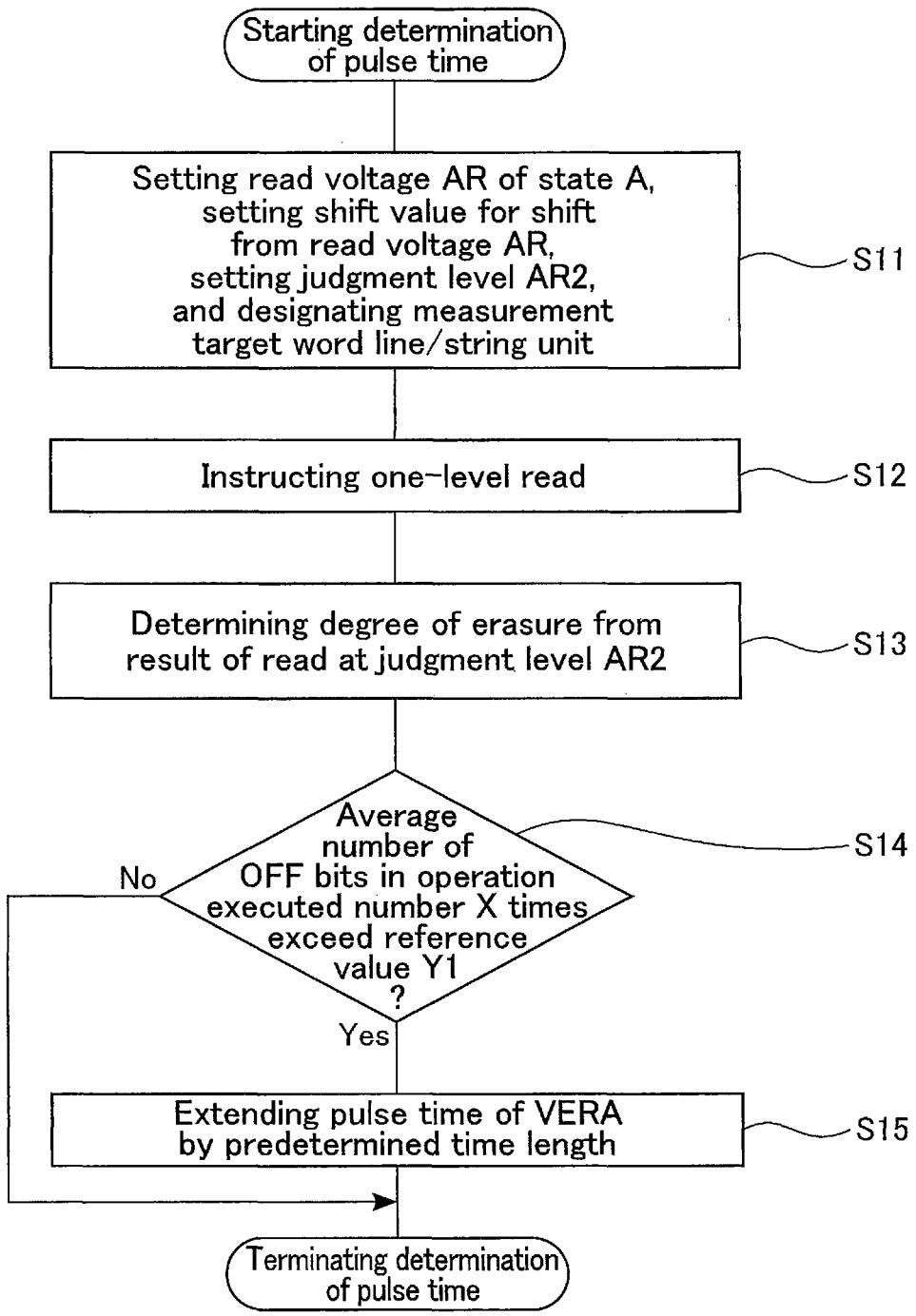
FIG. 11A is a flowchart showing processing of "determining a pulse time of an erase voltage VERA" in FIG. 8.
Figure 12:
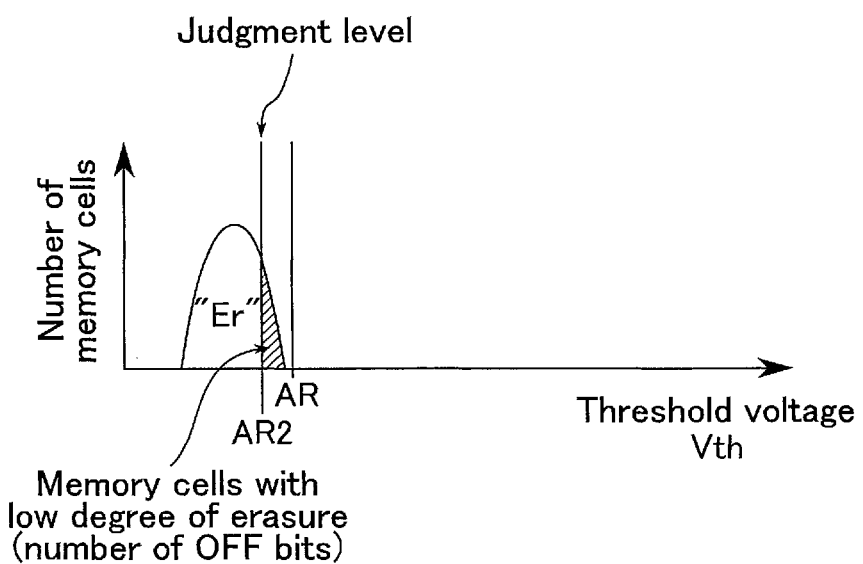
FIG. 12 is a diagram showing a threshold voltage distribution and a judgment level, which indicate a method of determining the degree of erasure in the first example of the erase operation.

Next, the processing of "determining the pulse time of the erase voltage VERA" in step S3 in the flowchart shown in FIG. 8 will be described in detail. FIG. 11A is a flowchart showing the processing of "determining the pulse time of the erase voltage VERA" in step S3. FIG. 12 is a diagram showing a judgment level and a threshold voltage distribution that shows a method of determining the degree of erasure in the first example of the erase operation. The processing shown in FIG. 11A is instructed and controlled by the memory controller 20 (or the CPU 21).

First, the read operation for determining the degree of erasure in memory cells after the erase operation is performed. As shown in step S11 in FIG. 11A, the memory controller 20 sets the read voltage AR of the state "A" as a read voltage, and further sets a shift value (voltage value) used for shifting the read voltage AR toward a low voltage side. As shown in FIG. 12, a read voltage shifted from the read voltage AR by the shift value is defined as a judgment level AR2. The judgment level AR2 is a voltage level used for determining the degree of erasure in memory cells after the erase operation. The memory controller 20 sets to the semiconductor memory device 10 the judgment level AR2 shifted from the read voltage AR by the shift value. Depending on the degree of erasure in memory cells, the read voltage AR may be used as the judgment level AR2 by making no change or by making a shift toward a high voltage side. Furthermore, the memory controller 20 designates a word line WL and a string unit SU both serving as a measurement target in an erasure target block (step S11). The number of measurement target word lines WL may be one or more, or all of the word lines WL may be a measurement target.

The memory controller 20 instructs the semiconductor memory device 10 to perform a "one-level read" of the state "A" (step S12). The "one-level read" is processing for acquiring read data indicative of the magnitude of threshold voltage with respect to the read voltage corresponding to one state. For example, in the case of TLC, the read voltage corresponding to any of the states "A" to "G" is designated. Herein, the read operation is executed using the judgment level AR2 obtained by shifting the read voltage AR by the shift value. Upon receipt of the instruction for the "one-level read" of the state "A", the sequencer 16 of the semiconductor memory device 10 executes the read operation using the set judgment level AR2 on measurement target memory cells. In this read operation, as shown in FIG. 12, a memory cell having a threshold voltage higher than the judgment level AR2 transitions to the OFF state, not into the ON state. The sequencer 16 outputs a read result RA2R of the read operation using the judgment level AR2, from the semiconductor memory device 10 to the memory controller 20. As an erase result after the erase operation, the memory controller 20 counts the number "DO1" of memory cells in the OFF state (hereinafter, referred to as the number of OFF bits). The number of OFF bits is stored in the buffer 22A in the memory 22.

Next, based on the read result of the read operation using the judgment level AR2, the memory controller 20 determines the degree of erasure in memory cells after the erase operation (step S13). That is, the memory controller 20 determines the degree of erasure in memory cells after the erase operation, from the number of OFF bits obtained through the read operation using the judgment level AR2. More specifically, the memory controller 20 executes the read operation using the judgment level AR2 either every time the erase operation is executed on an erasure target block BLKr or at the ratio of one read operation to several erase operations. In the erase operation, when the number of times the read operation is performed at the judgment level AR2 has reached the number X (for example, 4), the memory controller 20 determines whether or not the average number of OFF bits in the read operation performed the number X times exceeds a reference value Y1 (step S14). In the case where the average number of OFF bits exceeds the reference value Y1 (Yes), the memory controller 20 extends the pulse time PDr of the erase voltage VERA by a predetermined time length (step S15). On the other hand, if the average number of OFF bits does not exceed the reference value Y1 (No), the memory controller 20 terminates the processing of "determining the pulse time of the erase voltage VERA".

In step S14, the average number of OFF bits in the read operation performed the number X times is compared with the reference value Y1. However, the maximum number of OFF bits on one or more word lines WL when the read operation is performed the number X times may be compared with the reference value Y1. Alternatively, the maximum number of OFF bits on all word lines WL when the read operation is performed the number X times may be compared with the reference value Y1.

Figure 11B:
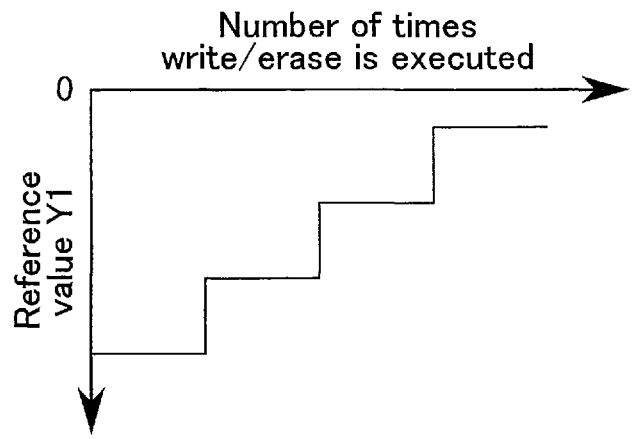
FIG. 11B is a diagram showing a relationship between a reference value Y1 in FIG. 11A and the number of times a write operation/erase operation is performed.

The reference value Y1 may be changed depending on the number of times the write operation/erase operation is performed on memory cells. FIG. 11B shows an example of a relationship between the number of times the write operation/erase operation is performed and the reference value Y1. As shown in FIG. 11B, the reference value Y1 may be decreased as the number of times the write operation/erase operation is performed on memory cells increases. More specifically, the reference value Y1 may be decreased in stages every time the number of times the write operation/erase operation is performed increases by a predetermined number. The increased number of times the write operation/erase operation is performed encourages the wearing out of memory cells. By setting the reference value Y1 in accordance with an increase in the number of times the write operation/erase operation is performed, the degree of erasure in memory cells can be stabilized in smaller units.

Next, the determination as to whether the number of OFF bits in step S14 exceeds the reference value Y1 will be described with reference to FIGS. 13 and 14. That is, a specific example of the determination of whether to update the pulse time PDr is described. FIGS. 13 and 14 are diagrams showing the number of OFF bits stored in the buffer 22A at the time when measurement target memory cells are read using the judgment level AR2. Herein, t-3 represents the number of OFF bits obtained through the read operation performed three times before, t-2 represents the number of OFF bits obtained through the read operation performed two times before, and t-1 represents the number of OFF bits obtained through the read operation performed one time before (that is, the last time). Furthermore, t-0 represents the number of OFF bits obtained through the latest read operation (the read operation this time). Herein, the reference value Y1 is set to, for example, 30.

FIG. 13 shows an example in which t-3, t-2, and t-1 of the buffer 22A respectively store 29, 35, and 29 as the number of bits, and t-0 stores 23 as the latest number of OFF bits. In this example case, the average number of OFF bits stored in t-3, t-2, t-1, and t-0 is equal to 29. Since the average number of OFF bits is 29, which is below the reference value of 30, the memory controller 20 terminates the processing without changing the pulse time PDr of the erase voltage VERA. For example, the CPU 21 of the memory controller 20 is equipped with a circuit configured to calculate the pulse time PDr using the average number of OFF bits and the reference value. This allows the memory controller 20 to calculate the pulse time PDr from the average number of OFF bits and to reflect the calculated pulse time PDr in the pulse time management table 22B_1 of the memory 22.

Furthermore, at the time of termination, the memory controller 20 deletes the earliest number of OFF bits stored in t-3 of the buffer 22A, and sequentially shifts the values in t-2, t-1, and t-0. After shifting, t-3, t-2, and t-1 of the buffer 22A respectively store 35, 29, and 23.

FIG. 14 shows an example in which t-3, t-2, and t-1 of the buffer 22A respectively store 29, 35, and 29 as the number of bits, and t-0 stores 32 as the latest number of OFF bits. In this example case, the average number of OFF bits stored in t-3, t-2, t-1, and t-0 is equal to 31. Since the average number of OFF bits is 31, which exceeds the reference value of 30, the memory controller 20 extends the pulse time PDr of the erase voltage VERA by a predetermined time length, and then terminates the processing.

At the time of termination, the memory controller 20 clears all of these t3, t2, and t1 of the buffer 22A.

Described next is input/output of commands, addresses, and data between the memory controller 20 and the semiconductor memory device 10 in the first example of the erase operation described above.

FIG. 15 is a diagram showing a command sequence in the first example of the erase operation according to the first embodiment. The command sequence shown in FIG. 15 includes an input/output cycle of commands, addresses, and data. A command is expressed by a hexagon, an address is expressed by a rounded corner square (or an ellipse), and a data input/output cycle is expressed by a square. Output of commands and addresses from the memory controller 20 to the semiconductor memory device 10 and input/output of data between the memory controller 20 and the semiconductor memory device 10, which will be described below, are performed using the I/O signals DQ0 to DQ7.

As shown in FIG. 15, the command sequence includes: a phase P1 corresponding to "setting the pulse time of the erase voltage VERA (step ST)"; a phase P2 corresponding to "instructing the erase operation (step S2)"; a phase P3 corresponding to "setting the judgment level AR2 (step S11)" for a shift read in the one-level read; and phases P3 and P4 corresponding to "instructing the one-level read (step S12)" in the shift read.

First, in the phase P1 for setting the pulse time of the erase voltage VERA, the memory controller 20 sequentially outputs a command "0Xh", an address "00h", and data "PDr" to the semiconductor memory device 10. The command "0Xh" is a command for designating an erase mode. The address "00h" is an address for setting the pulse time of the erase voltage VERA. The data "PDr" is data indicative of the pulse time of the erase voltage VERA corresponding to an erasure target block BLKr and is stored in the register 15D_1. In this manner, the memory controller 20 designates an erase mode for the semiconductor memory device 10, and sets to the register 15D_1 of the semiconductor memory device 10 the pulse time PDr of the erase voltage VERA used in the erase operation on the erasure target block BLKr.

Next, in the phase P2 for instructing the erase operation, the memory controller 20 sequentially outputs an erase setup command "60h", an address "ADD" of the erasure target block BLKr, and the erase execution command "D0h" to the semiconductor memory device 10. In this manner, the sequencer 16 executes the erase operation on the erasure target block BLKr by applying the erase voltage VERA having the pulse time PDr to the well interconnect CPWELL. During the execution of this erase operation, the sequencer 16 causes the ready/busy signal R/Bn to transition from the ready state to the busy state (R/Bn="L").

Thereafter, the memory controller 20 outputs a status read command "70h" to the semiconductor memory device 10. Upon receipt of the status read command "70h", the semiconductor memory device 10 outputs to the memory controller 20 data indicative of whether an erasure target block has passed or failed the erase operation. Herein, for example, the semiconductor memory device 10 outputs to the memory controller 20 data "PASS" indicating that an erasure target block has passed the erase operation.

Next, in the phase P3 for setting the judgment level AR2, the memory controller 20 sequentially outputs to the semiconductor memory device 10 a one-level read command "X1h" and an address "01h" indicative of the read voltage AR of the state "A". Furthermore, the memory controller 20 sequentially outputs, to the semiconductor memory device 10, a shift read command "X2h", an address "01h", and data "SHIFT" indicative of a shift value from the read voltage AR. In this manner, the memory controller 20 sets to the semiconductor memory device 10 the judgment level AR2 used for the shift read in the one-level read.

Next, in the phase P4 for instructing the read, the memory controller 20 sequentially outputs to the semiconductor memory device 10 a read setup command "00h", addresses "ADD1 to ADD5" of measurement target memory cells, and a read execution command "30h" for instructing the start of the read operation. Upon receipt of the read execution command "30h", the sequencer 16 of the semiconductor memory device 10 executes the read operation using the judgment level AR2 on measurement target memory cells, which are designated by the addresses "ADD1 to ADD5". During the execution of this read operation, the sequencer 16 causes the ready/busy signal R/Bn to transition from the ready state to the busy state (R/Bn="L"). Thereafter, the sequencer 16 outputs a read result RA2R of the read operation using the judgment level AR2, from the semiconductor memory device 10 to the memory controller 20. The memory controller 20 counts the number "DO1" (that is, the number of OFF bits) of memory cells which remain in the OFF state without transitioning to the ON state.

As described above, in the first example, through the read operation after the erase operation, the memory controller 20 counts the number of OFF bits among measurement target memory cells in the erasure target block BLKr. The memory controller 20, based on the number of OFF bits, updates the pulse time PDr of the erase voltage VERA or maintains without updating the pulse time PDr of the erase voltage VERA.

<First Modification of First Example>

Next, a modification of the first example of the erase operation according to the first embodiment will be described. The present modification describes an example in which the pulse time of the erase voltage VERA is shortened or extended based on the erase result of memory cells after an erase operation.

Figure 16:
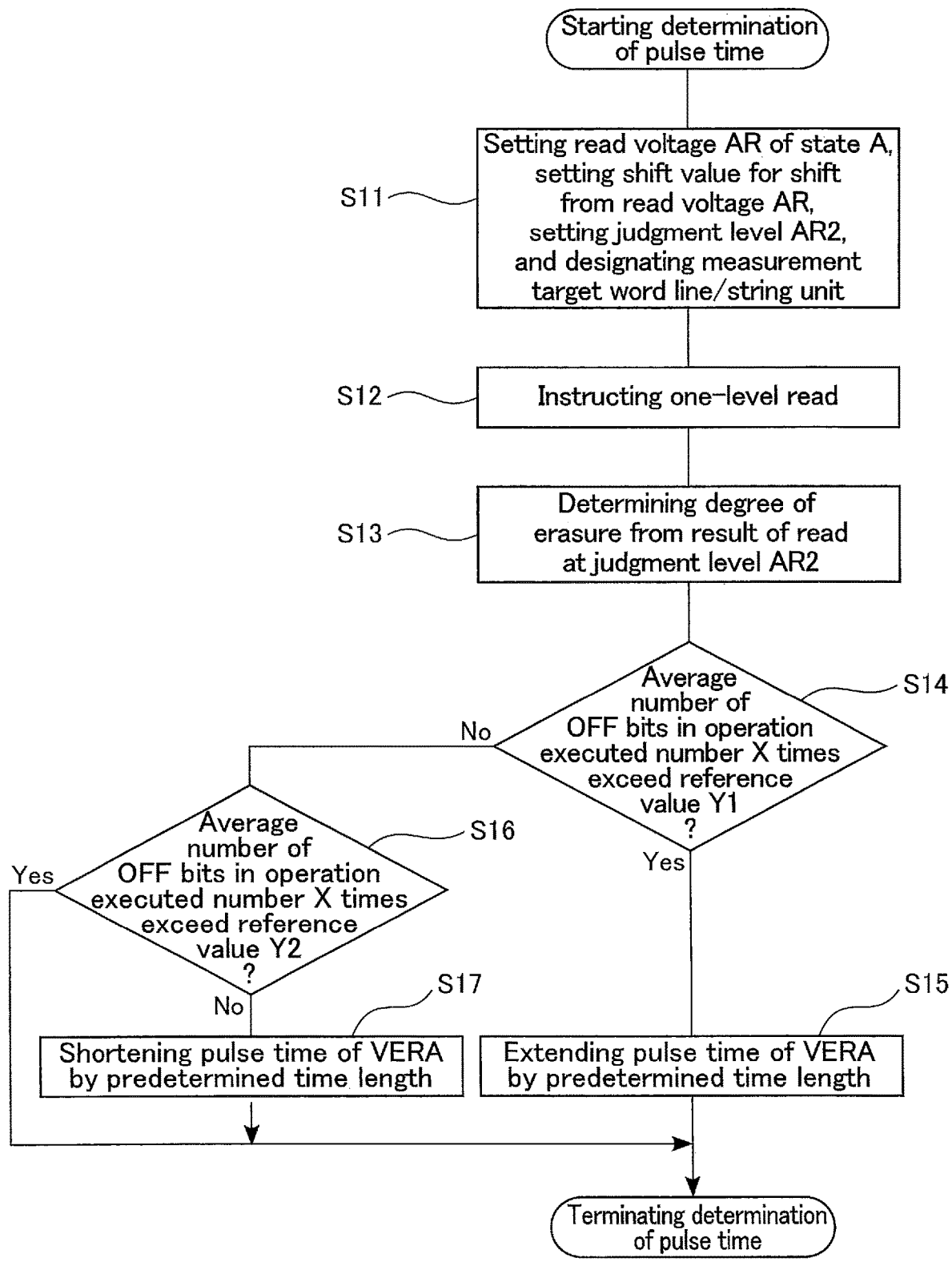
FIG. 16 is a flowchart showing processing of "determining a pulse time of an erase voltage VERA" in a modification of the first example.

The erase operation in the modification is executed in accordance with the flowchart of the erase operation shown in FIG. 8 just as with the first example described above. The processing in step S3 in the flowchart shown in FIG. 8 is replaced with the processing shown in FIG. 16. FIG. 16 is a flowchart showing the processing of "determining the pulse time of the erase voltage VERA" (step S3) in the modification. The processing shown in FIG. 16 is instructed and controlled by the memory controller 20 (or the CPU 21).

The processing from steps S11 to S15 shown in FIG. 16 is similar to the processing from steps S11 to S15 shown in FIG. 11A described above. That is, the memory controller 20 sets to the semiconductor memory device 10, the judgment level AR2 used to determine the degree of erasure in memory cells after the erase operation. Furthermore, the memory controller 20 designates a word line WL and a string unit SU serving as a measurement target in an erasure target block BLKr (step S11).

Next, the memory controller 20 instructs the semiconductor memory device 10 to perform the "one-level read" (step S12). Upon receipt of the instruction for the "one-level read", the sequencer 16 of the semiconductor memory device 10 executes the read operation at the set judgment level AR2 on, for example, measurement target memory cells.

Next, based on the number of OFF bits calculated from a read result RA2R of the read operation using the judgment level AR2, the memory controller 20 determines the degree of erasure in memory cells after the erase operation (step S13). More specifically, the memory controller 20 executes the read operation using the judgment level AR2 in the case of determining the degree of erasure in memory cells after the erase operation. When the number of times the read operation is performed at the judgment level AR2 has reached the number X, the memory controller 20 determines whether or not the average number of OFF bits in the read operation performed the number X times exceeds the reference value Y1 (step S14). If it is determined in step S14 that the average number of OFF bits in the read operation performed the number X times exceeds the reference value Y1 (Yes), the memory controller 20 extends the pulse time PDr of the erase voltage VERA by a predetermined time length (step S15), and terminates the processing. On the other hand, if the average number of OFF bits in the read operation performed the number X times does not exceed the reference value Y1 (No), the memory controller 20 determines whether or not the average number of OFF bits in the read operation performed the number X times has reached the reference value Y2 (step S16).

If it is determined in step S16 that the average number of OFF bits in the read operation performed the number X times has not reached the reference value Y2 (No), the memory controller 20 shortens the pulse time PDr of the erase voltage VERA by a predetermined time length (step S17), and terminates the processing. On the other hand, if the average number of OFF bits in the read operation performed the number X times has reached the reference value Y2 (Yes), the memory controller 20 terminates the processing without updating the pulse time of the erase voltage VERA.

As described above, in the modification of the first example, through the read operation after the erase operation, the number of OFF bits among measurement target memory cells in the erasure target block BLKr is output from the semiconductor memory device 10 to the memory controller 20. Based on the number of OFF bits, the memory controller 20 determines which one of the insufficient erasure state, the appropriate erasure state, and the excessive erasure state the memory cells after undergoing the erase operation are in. In the case of memory cells being in the excessive erasure state (No in step S16), the memory controller 20 shortens the pulse time PDr of the erase voltage VERA (step S17). In the case of memory cells being in the appropriate erasure state (Yes in step S16), the memory controller 20 does not update the pulse time PDr. In the case of memory cells being in the insufficient erasure state (Yes in step S14), the memory controller 20 extends the pulse time PDr (step S15).

1.2.2.2 Second Example of Erase Operation

In the second example, after the erase operation subsequent to the erase operation, the pulse time of the erase voltage VERA is updated based on the erase result of memory cells belonging to a word line WL and a string unit SU serving as a measurement target in an erasure target block. An example described herein is a case in which the pulse time is extended. In the second example, the write operation is added between the erase operation and the determination as to whether to update the pulse time.

FIG. 17 is a flowchart showing the second example of the erase operation in the memory system 1 according to the first embodiment. The processing shown in FIG. 17 is instructed and controlled by the memory controller 20 (or the CPU 21).

As with the first example, the memory controller 20 transmits to the semiconductor memory device 10 the pulse time PDr of the erase voltage VERA corresponding to the erasure target block BLKr in the pulse time management table 22B_1, thereby setting the pulse time PDr to the register 15D_1 of the semiconductor memory device 10 (step S1). The memory controller 20 instructs the semiconductor memory device 10 to perform the erase operation (step S2). Upon receipt of the instruction for the erase operation, the sequencer 16 of the semiconductor memory device 10 executes the erase operation on the erasure target block BLKr.

After execution of the erase operation on the erasure target block BLKr, the memory controller 20 instructs the semiconductor memory device 10 to execute the write operation (step S5). Upon receipt of the write operation, the sequencer 16 of the semiconductor memory device 10 executes the write operation on memory cells which are a target of a write in the erasure target block BLKr. The instruction for the write operation is repeated until when a write in a part of the block is completed or a write in the entire block is completed (step S6).

Next, based on the erasure state of memory cells after the write operation, the memory controller 20 determines whether to update the pulse time PDr of the erase voltage VERA (step S3A). For example, as with the first example, the processing of "determining the pulse time of the erase voltage VERA" in step S3A is performed every time the write operation is executed after the erase operation, or every time the write operation/erase operation is executed a predetermined number of times, or when the number of times the write operation/erase operation is executed reaches a predetermined number. The processing of "determining the pulse time of the erase voltage VERA" in step S3A will be described later in detail.

Next, based on a determination result of "determining the pulse time of the erase voltage VERA" in step S3A, the memory controller 20 updates or maintains without updating the pulse time PDr associated with the erasure target block BLKr in the pulse time management table 22B_1 of the memory 22 (step S4). The erase operation is thus completed.

Figure 18:
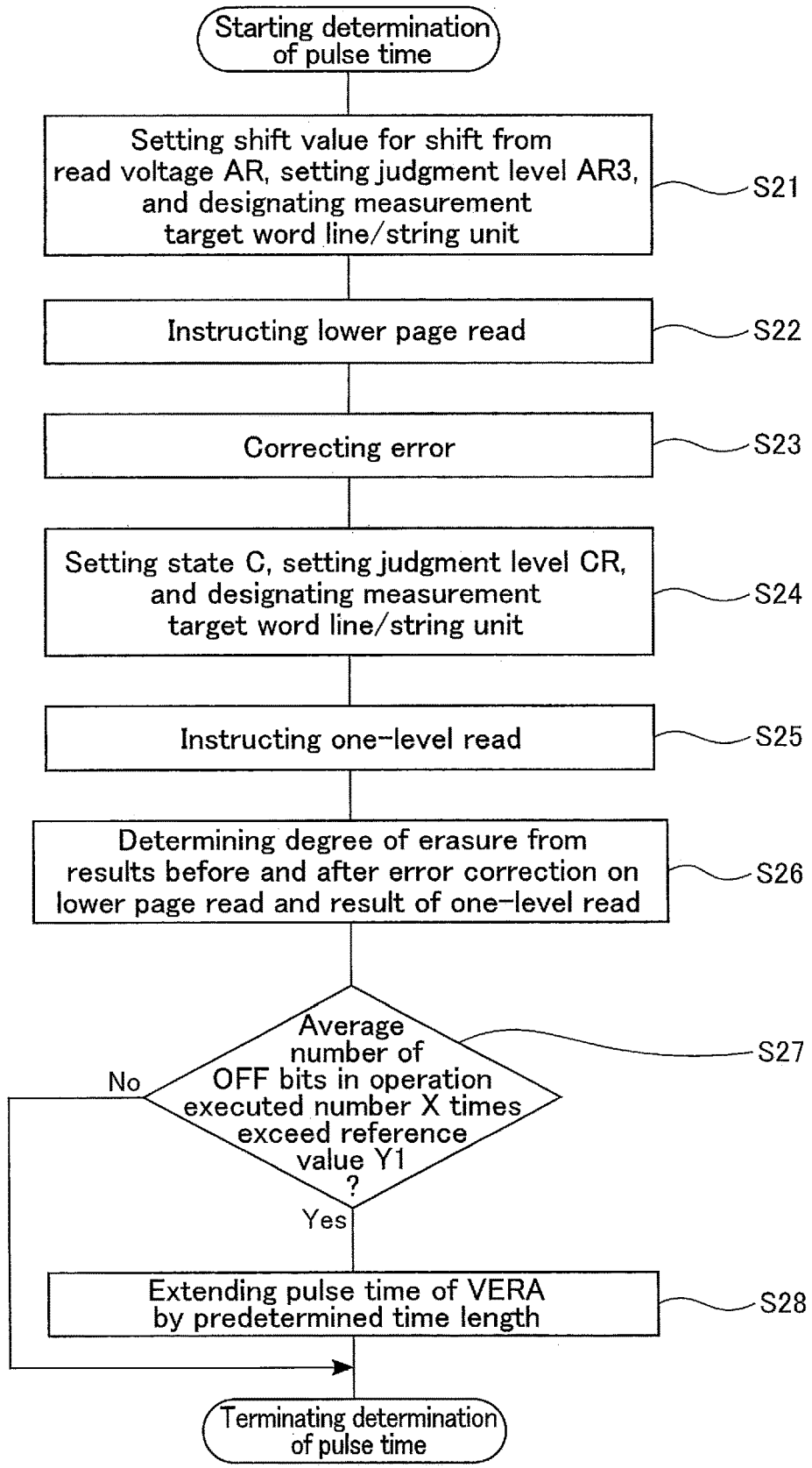
FIG. 18 is a flowchart showing processing of "determining a pulse time of an erase voltage VERA" in FIG. 17.
Figure 19:
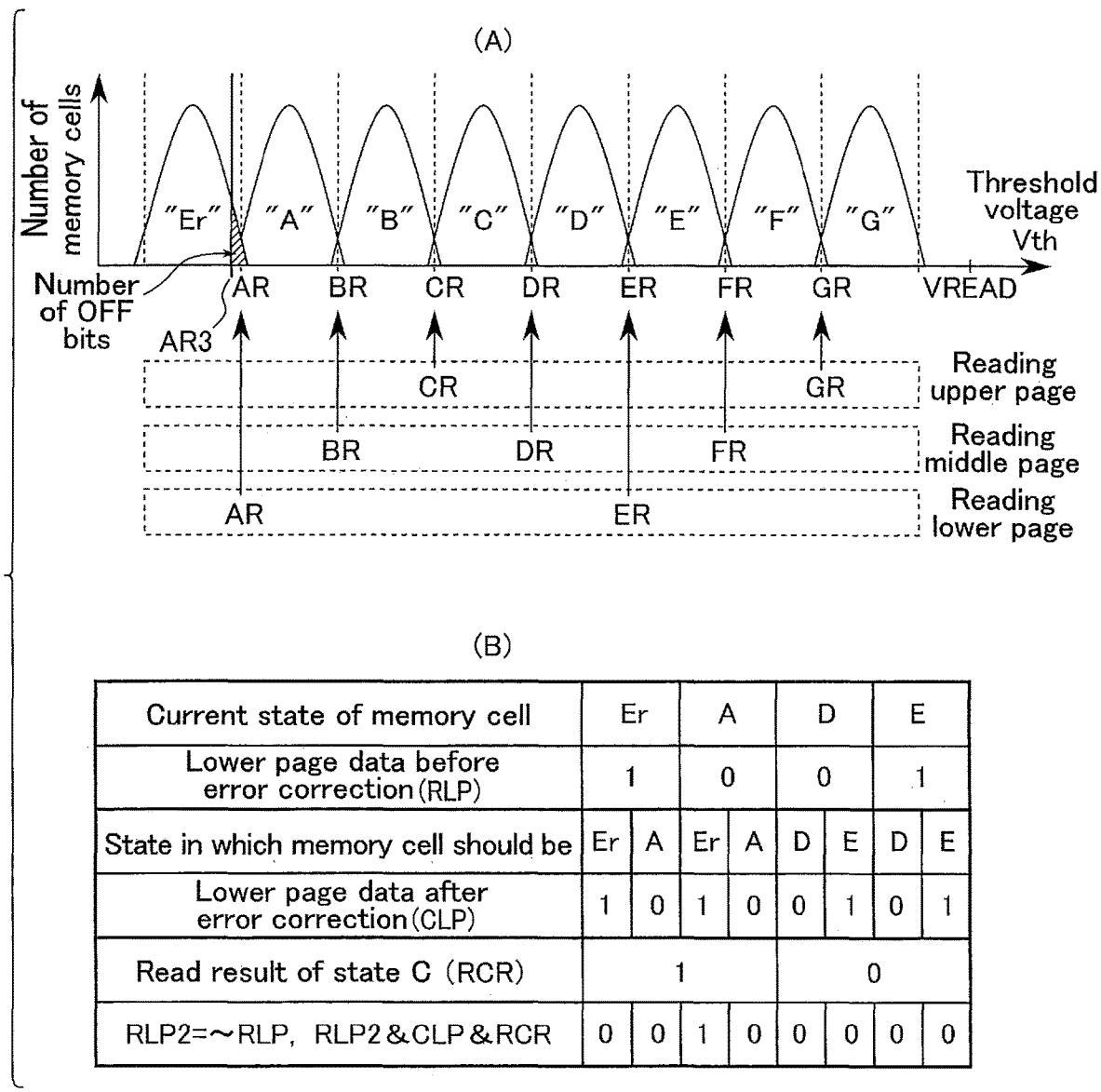
FIG. 19 is a diagram showing threshold voltage distributions and judgment levels, which indicate a method of determining the degree of erasure in the second example of the erase operation, and data used for calculating the number of OFF bits.

Next, the processing of "determining the pulse time of the erase voltage VERA" in step S3A in the flowchart shown in FIG. 17 will be described in detail. FIG. 18 is a flowchart showing the processing of "determining the pulse time of the erase voltage VERA" in step S3A. FIG. 19 is a diagram showing threshold voltage distributions and judgment levels, for explaining a method of determining the degree of erasure in the second example of the erase operation, and data for calculating the number of OFF bits. The processing shown in FIG. 18 is instructed and controlled by the memory controller 20 (or the CPU 21).

First, as shown in FIG. 18, the memory controller 20 sets a shift value for making a shift from the read voltage AR. Herein, as shown in FIG. 19(A), a read voltage shifted from the read voltage AR by the shift value is defined as a judgment level AR3. The judgment level AR3 is a voltage level used for determining the degree of erasure in memory cells after the write operation. The memory controller 20 sets to the semiconductor memory device 10 the judgment level AR3 shifted from the read voltage AR by the shift value. Depending on the degree of erasure in memory cells, the read voltage AR may be used as the judgment level AR3 by making no change or by making a shift toward a high voltage side. Furthermore, the memory controller 20 designates a word line WL and a string unit SU serving as a measurement target in an erasure target block BLKr (step S21). The number of measurement target word lines WL may be one or more, or all of the word lines WL may be a measurement target. The following description assumes a read based on memory mapping shown in FIG. 5A. In FIG. 5A, the read voltage AR is mapped on a read on the "lower page".

Next, the memory controller 20 instructs the semiconductor memory device 10 to execute a "lower page read" including the read voltage AR (step S22). The "lower page read" is to read data from a lower page by the read operation using, for example, the read voltages AR and ER. Herein, the judgment level AR3 is used instead of the read voltage AR. Upon receipt of the instruction for the "lower page read", the sequencer 16 of the semiconductor memory device 10 executes the read operation using the set judgment level AR3 and read voltage ER on, for example, measurement target memory cells, and obtains lower page data RLP before being subjected to error correction shown in FIG. 19(B). The lower page data RLP is data immediately after a read using the judgment level AR3 and the read voltage ER, and is not yet subjected to the error correction.

Next, the memory controller 20 receives from the semiconductor memory device 10 the lower page data RLP before being subjected to the error correction, obtained through the read operation using the judgment level AR3 and the read voltage ER. The memory controller 20 causes the ECC circuit 24 to correct an error in the lower page data RLP before being subjected to the error correction, and obtains the lower page data CLP after being subjected to the error correction shown by (B) in FIG. 19 (step S23).

Next, the memory controller 20 separates data read at only the judgment level AR3 from the read lower page data. For example, the memory controller 20 sets the read voltage CR of the state "C" to the semiconductor memory device 10. In this embodiment, a set state is not limited to the state "C", and may be any of the states B, C, and D which enable the separation between the states "A" and "E". The memory controller 20 further designates to the semiconductor memory device 10 a word line WL and a string unit SU serving as a measurement target in an erasure target block BLKr (step S24).

Next, the memory controller 20 instructs the semiconductor memory device 10 to perform the "one-level read" of the state "C (step S25)". Upon receipt of the instruction for the "one-level read", for example, the sequencer 16 of the semiconductor memory device 10 executes the read operation at the read voltage CR on measurement target memory cells, and obtains a read result RCR of the state "C" shown by (B) in FIG. 19.

The memory controller 20 performs an AND operation on the data RLP2 and two data pieces CLP and RCR, thereby counting the number of OFF bits to determine the degree of erasure. Herein, the data RLP2 is data obtained by performing a NOT operation on the lower page data RLP before being subjected to the error correction, obtained in step S22, and the two data pieces CLP and RCR are data obtained in steps S23 and S25. The memory controller 20 stores the obtained number of OFF bits in the buffer 22A within the memory 22.

Next, based on the erasure state of memory cells after the write operation, the memory controller 20 determines the degree of erasure in memory cells which are a target of erasure after the write operation. That is, the memory controller 20 determines the degree of erasure in memory cells which are a target of erasure after the write operation, from the number of OFF bits stored in the buffer 22A (step S26). More specifically, in the case of determining the degree of erasure after the write operation subsequent to the erase operation, the memory controller 20 executes the processing in steps S22, S23, and S25 on measurement target memory cells. When the number of times the processing in steps S22, S23, and S25 is performed has reached the number X (for example, 4), the memory controller 20 determines whether or not the average number of OFF bits in the aforementioned processing performed the number X times exceeds a reference value Y1 (step S27). In the case where the average number of OFF bits in the processing performed the number X times exceeds the reference value Y1 (Yes), the memory controller 20 extends the pulse time PDr of the erase voltage VERA by a predetermined time length (step S28). On the other hand, if the average number of OFF bits in the processing performed the number X times does not exceed the reference value Y1 (No), the memory controller 20 terminates the processing of "determining the pulse time of the erase voltage VERA".

In step S27, the average number of OFF bits in the aforementioned processing performed the number X times is compared with the reference value Y1. However, the maximum number of OFF bits on one or more word lines WL when the aforementioned processing is performed the number X times may be compared with the reference value Y1. Alternatively, the maximum number of OFF bits on all word lines WL when the aforementioned processing is performed the number X times may be compared with the reference value Y1.

The determination as to whether the number of OFF bits in step S27 described above exceeds the reference value Y1, that is, a specific example of the determination as to whether to update the pulse time, is similar to that of the first example. In the case where the average number of OFF bits stored in t-3, t-2, t-1, and t-0 of the buffer 22A does not exceed the reference value of 30, the memory controller 20 terminates the processing without changing the pulse time of the erase voltage VERA. On the other hand, if the average number of OFF bits stored in t-3, t-2, t-1, and t-0 of the buffer 22A exceeds the reference value of 30, the memory controller 20 extends the pulse time of the erase voltage VERA by a predetermined time length, and then terminates the processing.

The following description is about input/output of commands, addresses, and data between the memory controller 20 and the semiconductor memory device 10 in the second example of the erase operation according to the first embodiment.

Figure 20:
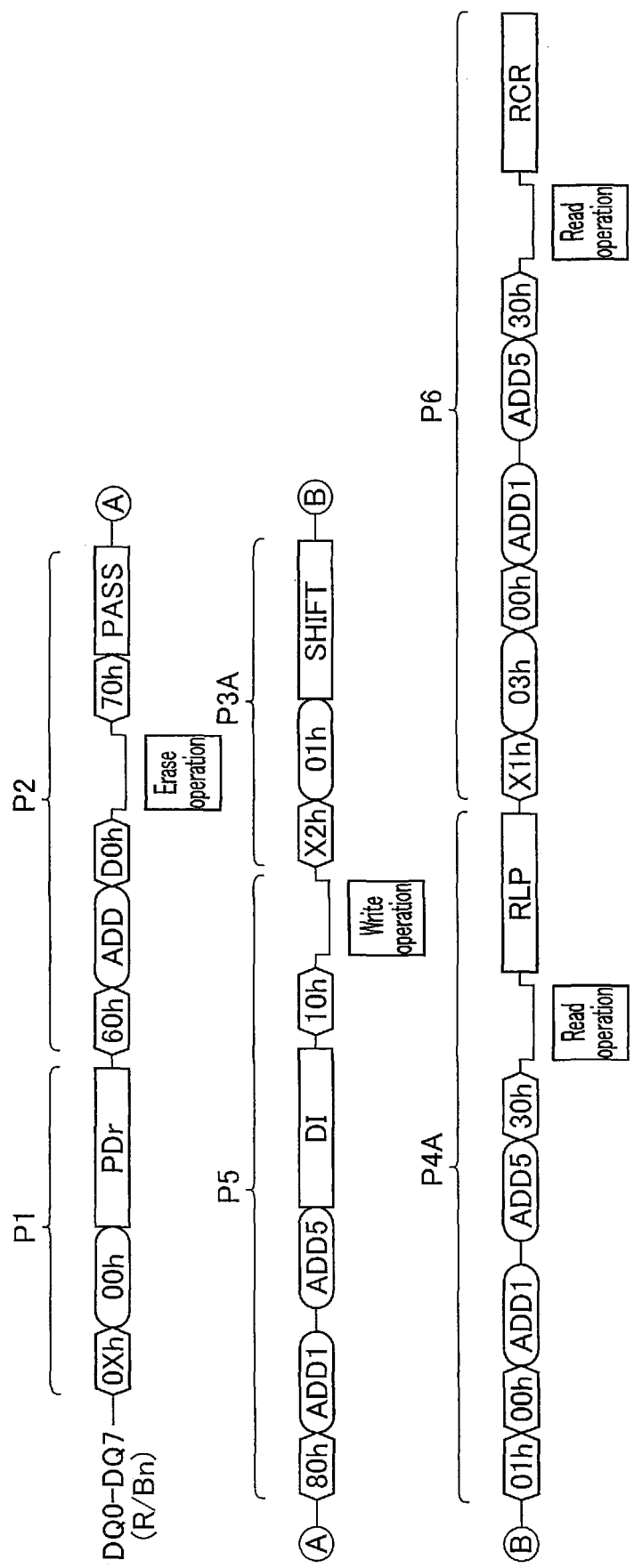
FIG. 20 is a diagram showing a command sequence in the second example of the erase operation according to the first embodiment.

FIG. 20 is a diagram showing a command sequence in the second example of the erase operation according to the first embodiment. The I/O signals DQ0 to DQ7 are used for output of commands and addresses from the memory controller 20 to the semiconductor memory device 10 and for input/output of data between the memory controller 20 and the semiconductor memory device 10, which will be described below. The command sequence shown in FIG. 20 includes an input/output cycle of commands, addresses, and data. A command is expressed by a hexagon, an address is expressed by a rounded corner square (or an ellipse), and a data input/output cycle is expressed by a square.

As shown in FIG. 20, the command sequence includes: a phase P1 corresponding to "setting the pulse time of the erase voltage VERA (step S1)"; a phase P2 corresponding to "instructing the erase operation (step S2)"; a phase P5 corresponding to "instructing the write operation (step S5)"; a phase P3A corresponding to "setting the judgment level AR3 (step S21)" for a shift read in the lower page read; a phase P4A corresponding to "instructing the lower page read (step S22)" in the shift read; and a phase P6 corresponding to "instructing the one-level read (step S25)". The phases P1 and P2 are similar to the above-described phases P1 and P2 shown in FIG. 15.

First, in the phase P1 for setting the pulse time of the erase voltage VERA, the memory controller 20 sequentially outputs a command "0Xh", an address "00h", and data "PDr" to the semiconductor memory device 10. In this manner, the memory controller 20 designates an erase mode for the semiconductor memory device 10, and sets to the register 15D_1 of the semiconductor memory device 10 the pulse time PDr of the erase voltage VERA used in the erase operation on the erasure target block BLKr.

Next, in the phase P2 for instructing the erase operation, the memory controller 20 sequentially outputs an erase setup command "60h", an address "ADD" of the erasure target block BLKr, and the erase execution command "D0h" to the semiconductor memory device 10. Upon receipt of the erase execution command "D0h", the sequencer 16 of the semiconductor memory device 10 executes the erase operation on the erasure target block BLKr by applying the erase voltage VERA of the pulse time PDr to the well interconnect CPWELL. Subsequently, the memory controller 20 outputs a status read command "70h" to the semiconductor memory device 10. Upon receipt of the status read command "70h", the semiconductor memory device 10 outputs to the memory controller 20 data "PASS" indicating that an erasure target block has passed the erase operation.

Next, in the phase P5 for instructing the write operation, the memory controller 20 sequentially outputs to the semiconductor memory device 10 a write setup command "80h", addresses "ADD1 to ADD5" of memory cells which are a target of a write, write data "DI", and a write execution command "10h". Upon receipt of the write execution command "10h", the sequencer 16 of the semiconductor memory device 10 executes the write operation according to the write data "DI" on memory cells which are a target of a write and are designated by the addresses "ADD1 to ADD5". During the execution of this write operation, the sequencer 16 causes the ready/busy signal R/Bn to transition from the ready state to the busy state (R/Bn="L"). The phase P5 is a write operation with respect to a specific address in a block. In order to perform the write operation with respect to a part or all of the addresses in the block, the memory controller 20 may repeatedly perform the phase P5.

Next, in the phase P3A for setting the judgment level AR3, the memory controller 20 sequentially outputs to the semiconductor memory device 10 a shift read command "X2h", an address "01h" indicative of the read voltage AR, and data "SHIFT" indicative of a shift value from the read voltage AR. In this manner, the memory controller 20 sets to the semiconductor memory device 10 the judgment level AR3 used for the shift read in the lower page read.

Next, in the phase P4A for instructing the lower page read, the memory controller 20 sequentially outputs to the semiconductor memory device 10 a command "01h" indicative of a lower page, a read setup command "00h", addresses "ADD1 to ADD5" of measurement target memory cells, and a read execution command "30h". Upon receipt of the read execution command "30h", the sequencer 16 of the semiconductor memory device 10 executes the read operation using the judgment level AR3 and the read operation at the read voltage ER of the state "E" on measurement target memory cells, which are designated by the addresses "ADD1 to ADD5". During the execution of this read operation, the sequencer 16 causes the ready/busy signal R/Bn to transition from the ready state to the busy state (R/Bn="L"). Thereafter, the sequencer 16 outputs to the memory controller 20 the lower page data RLP before the error correction, obtained through the read operation using the judgment level AR3 and the read voltage ER. The memory controller 20 causes the ECC circuit 24 to perform the error correction on the received lower page data RLP before being subjected to the error correction, thereby calculating the lower page data CLP after being subjected to the error correction.

Next, in the phase P6 for instructing the one-level read, the memory controller 20 sequentially outputs to the semiconductor memory device 10 the one-level read command "X1h", the address "03h" indicative of the read voltage CR of the state "C", the read setup command "00h", the measurement target addresses "ADD1 to ADD5", and the read execution command "30h". Upon receipt of the read execution command "30h", the sequencer 16 of the semiconductor memory device 10 executes the read operation at the read voltage CR on measurement target memory cells, which are designated by the addresses "ADD1 to ADD5". During the execution of this read operation, the sequencer 16 causes the ready/busy signal R/Bn to transition from the ready state to the busy state (R/Bn="L"). Thereafter, the semiconductor memory device 10 outputs to the memory controller 20 the read result RCR obtained through the read operation using the read voltage CR.

Thereafter, as described above, the memory controller 20 performs an AND operation on the data RLP2 obtained by performing a NOT operation on the lower page data RLP before being subjected to the error correction, and two data pieces CLP and RCR, thereby counting the number of OFF bits to determine the degree of erasure.

In the second example, through the read operation after the write operation, the memory controller 20 counts the number of OFF bits among measurement target memory cells in the erasure target block BLKr. The memory controller 20, based on the number of OFF bits, updates the pulse time PDr of the erase voltage VERA or maintains without updating the pulse time PDr of the erase voltage VERA.

1.3 Effects of First Embodiment

According to the first embodiment, erasure with respect to memory cells through the erase operation can be optimized by adjusting or updating the pulse time of the erase voltage VERA after the erase operation or the write operation. In other words, by adjusting or updating the pulse time of the erase voltage VERA, memory cells can be prevented from transitioning to the insufficient erasure state or excessive erasure state through the erase operation.

By preventing memory cells from transitioning to the excessive erasure state through the erase operation, damage caused to the memory cells through the erase operation can be reduced. Furthermore, by preventing memory cells from transitioning to the insufficient erasure state through the erase operation, for example, read errors can be reduced in page reads including a read of the state A.

Figure 21:
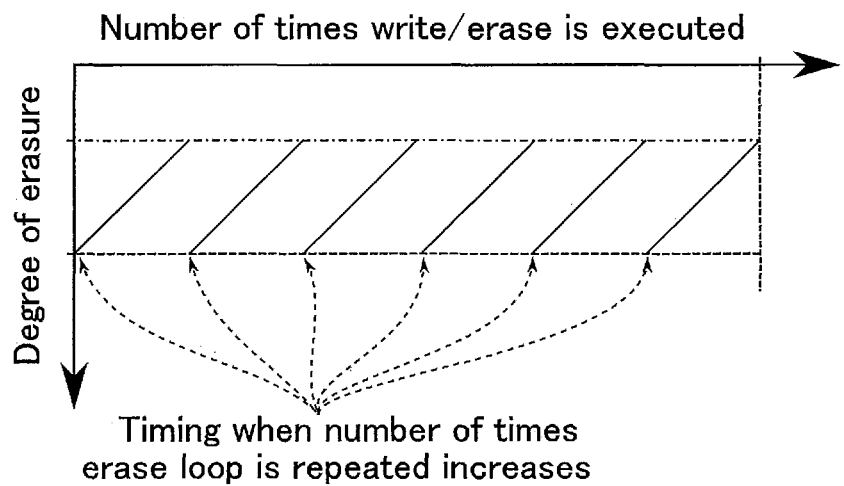
FIG. 21 is a diagram showing a relationship between the number of times a write operation/erase operation as a comparative example is performed and the degree of erasure in memory cells by the erase operation.

Hereinafter, advantageous effects of the first embodiment will be described in detail by referring to a comparative example. FIG. 21 is a diagram showing a relationship between the number of times a write/erase is performed on memory cells and the degree of erasure in the memory cells by the erase operation. The increased number of times the write/erase is performed encourages the wearing out of memory cells. Thus, as the number of times the write/erase is performed increases, even if the erase operation is performed on memory cells, the amount of drawn out electrons stored in a charge storage layer of each memory cell is gradually reduced and the degree of erasure is gradually decreased. Therefore, as shown in FIG. 21, when the erase operation is performed while the number of times the erase loop is repeated is set to a fixed number, the degree of erasure in memory cells is gradually decreased to approach the upper limit of an acceptable range for the degree of erasure. Accordingly, the number of times the erase loop is repeated is increased before the degree of erasure exceeds its allowable range. If the number of times the erase loop is repeated is increased, the degree of erasure in memory cells increases immediately after the increased number of times. This causes the wearing out of memory cells.

In the first embodiment described above, based on an erase result (or an erasure state or the degree of erasure) in memory cells which are a target of erasure after the erase operation or the write operation, the pulse time of the erase voltage VERA used for a next erase operation on the erasure target memory cells is adjusted or updated.

More specifically, the determination is made from a threshold voltage distribution state of memory cells in the state "Er" after the erase operation or the write operation, as to whether the degree of erasure in the memory cells corresponds to the insufficient erasure state, the appropriate erasure state, or the excessive erasure state. Based on a state corresponding to the degree of erasure, the pulse time of the erase voltage VERA is adjusted or updated. For example, if the degree of erasure in memory cells corresponds to the insufficient erasure state, the pulse time of the erase voltage VERA is extended. On the other hand, if the degree of erasure in memory cells corresponds to the excessive erasure state, the pulse time of the erase voltage VERA is shortened.

Figure 22:
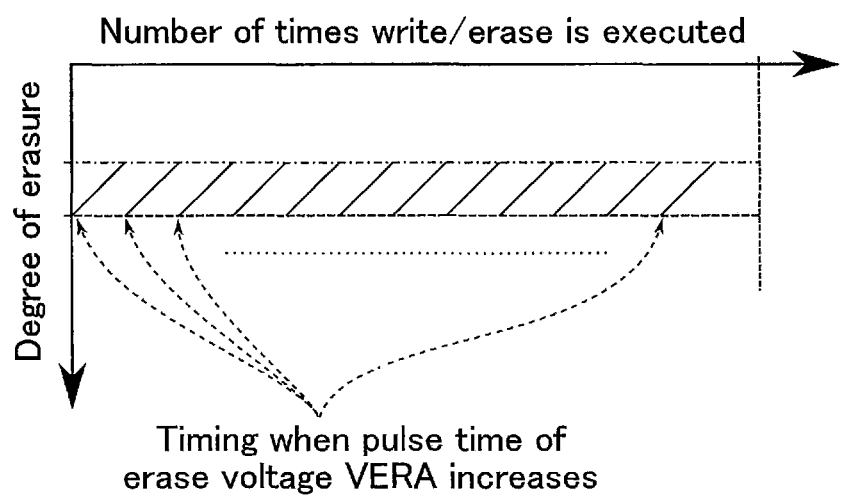
FIG. 22 is a diagram showing a relationship between the number of times a write operation/erase operation according to the first embodiment is performed and the degree of erasure in memory cells by the erase operation.

FIG. 22 shows a relationship between the number of times the write/erase is performed on memory cells and the degree of erasure by the erase operation according to the first embodiment. As described above, in the first embodiment, by adjusting the pulse time of the erase voltage VERA, memory cells can be erased delicately, and as shown in FIG. 22, memory cells can be prevented from increasing and decreasing in degree of erasure as compared to the comparative example in FIG. 21. By preventing memory cells from increasing in degree of erasure, in other words, preventing memory cells from transitioning to the excessive erasure state, damage caused to the memory cells can be reduced. Furthermore, by preventing memory cells from decreasing in degree of erasure, in other words, preventing memory cells from transitioning to the insufficient erasure state, read errors can be reduced in page reads.

As described above, according to the first embodiment, it is possible to provide a memory system and a semiconductor memory device which are capable of reducing damage and read errors in memory cells and improving the performance of erase operation.

2. Second Embodiment

Hereinafter, an erase operation in the memory system 1 according to a second embodiment will be described below. A configuration of the memory system 1 according to the second embodiment is similar to that of the first embodiment. The explanation of the second embodiment will focus mainly on the points that differ from the first embodiment.

2.1 Erase Operation in Second Embodiment

In the erase operation according to the second embodiment, the initial voltage value of the erase voltage VERA is adjusted (or changed) based on an erase result of memory cells after an erase operation or based on an erase result of memory cells after a write operation subsequent to the erase operation. For example, the initial voltage value of the erase voltage VERA is increased or decreased. In the second embodiment, the initial voltage value of the erase voltage VERA, which is adjusted in this second embodiment, is a voltage value of the erase voltage VERA in the first erase loop.

2.1.1 First Example of Erase Operation

In the first example, after the erase operation, the initial voltage value of the erase voltage VERA is updated based on the erase result of memory cells belonging to a word line WL and a string unit SU serving as a measurement target in an erasure target block. An example described herein is a case in which the initial voltage value of the erase voltage VERA is increased based on an erase result of memory cells.

Figure 23:
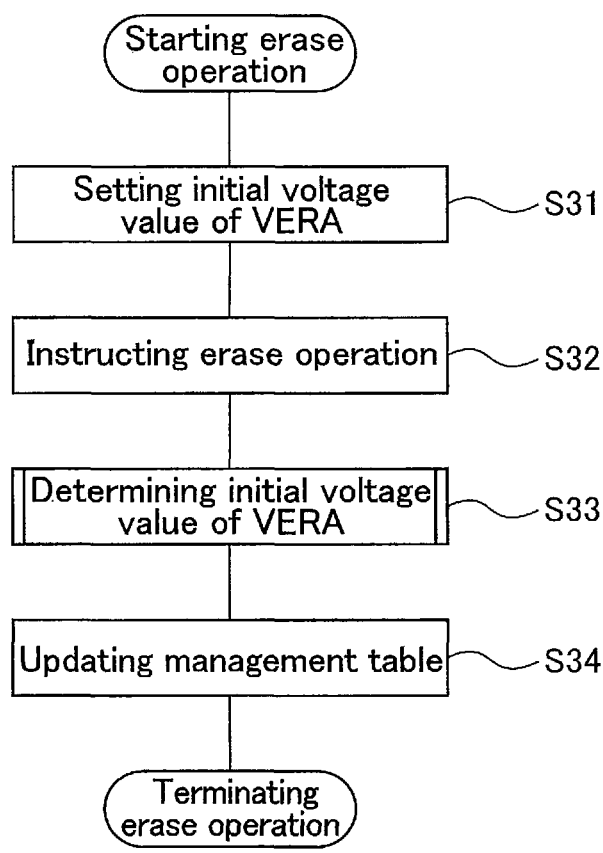
FIG. 23 is a flowchart showing a first example of the erase operation in the memory system according to a second embodiment.
Figures 24, 25:
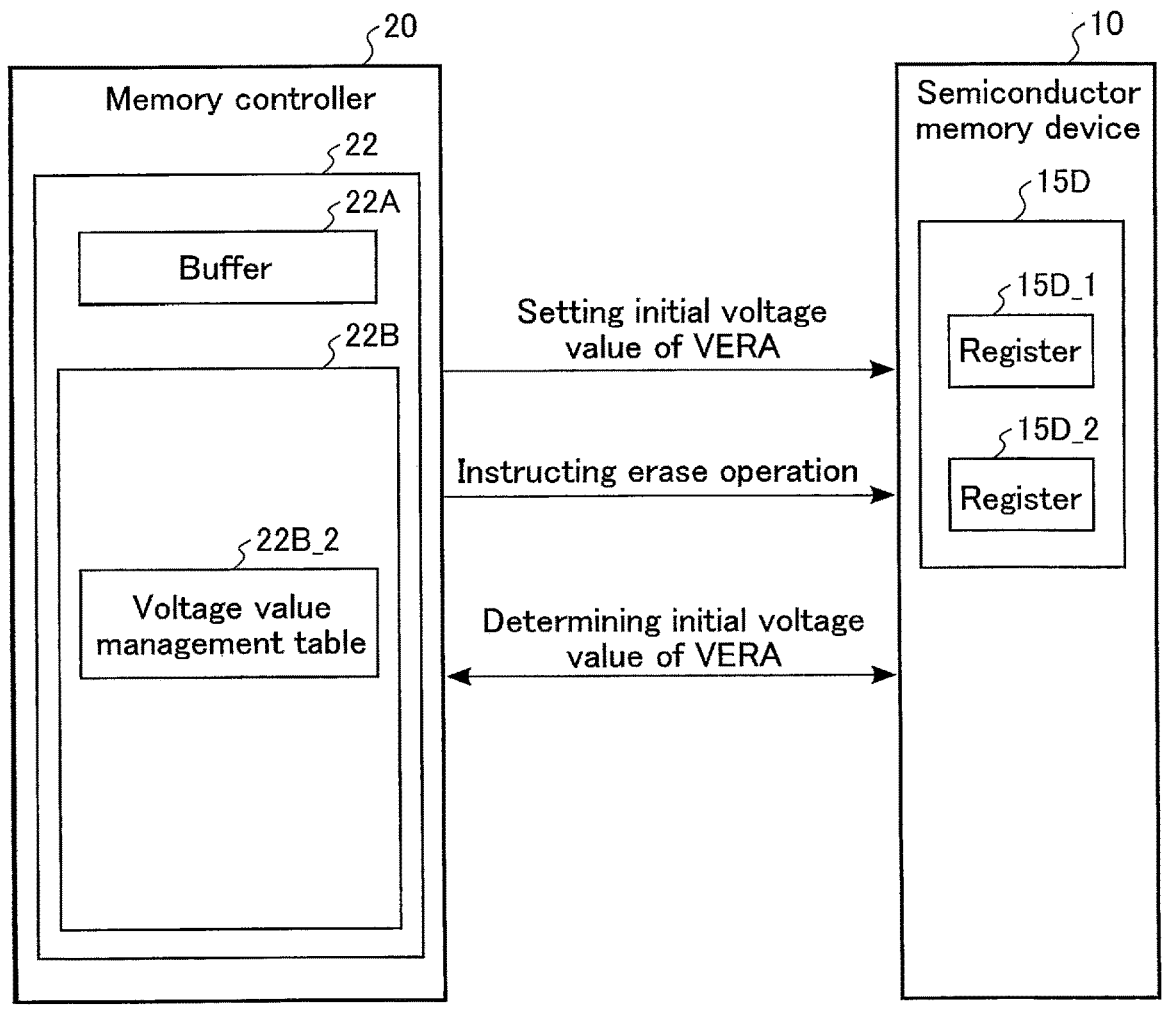
FIG. 24 is a diagram showing operations performed between a memory controller and the semiconductor memory device.
FIG. 25 is a diagram showing an example of a voltage value management table provided in a memory of the memory controller.

FIG. 23 is a flowchart showing the first example of the erase operation in the memory system 1 according to the second embodiment. FIG. 24 is a diagram showing operations performed between the memory controller 20 and the semiconductor memory device 10. FIG. 25 is a diagram showing an example of a voltage value management table 22B_2 provided in the memory 22 of the memory controller 20. The voltage value management table 22B_2 manages the initial voltage value of the erase voltage VERA. In the voltage value management table 22B_2, a block BLKr (where r is an integer equal to or greater than 0 and equal to or less than m) is associated with an initial voltage value PAr used for the erase operation on this block BLKr. The processing shown in FIG. 23 is instructed and controlled by the memory controller 20 (or the CPU 21).

As shown in FIGS. 23 and 24, when the erase operation starts, first, the memory controller 20 transmits to the semiconductor memory device 10 an initial voltage value PAr of the erase voltage VERA corresponding to the erasure target block BLKr in the voltage value management table 22B_2, thereby setting the initial voltage value PAr to the register 15D_2 of the semiconductor memory device 10. More specifically, the memory controller 20 obtains from the voltage value management table 22B_2 the initial voltage value PAr of the erase voltage VERA corresponding to the erasure target block BLKr, transmits the obtained initial voltage value PAr to the semiconductor memory device 10, and causes the register 15D_2 to store the initial voltage value PAr (step S31). For example, when an erasure target block is the block BLK0, the memory controller 20 transmits an initial voltage value PA0 associated with the block BLK0 to the semiconductor memory device 10, thereby causing the register 15D_2 to store the initial voltage value PA0.

Next, the memory controller 20 instructs the semiconductor memory device 10 to perform the erase operation (step S32). The sequencer 16 of the semiconductor memory device 10 executes the erase operation on the erasure target block BLKr, using the initial voltage value PAr of the erase voltage VERA stored in the register 15D_2.

Next, the memory controller 20 obtains from the semiconductor memory device 10 an erase result of the erase operation on memory cells. Based on the erase result of the memory cells, obtained from the semiconductor memory device 10, the memory controller 20 determines whether to update the initial voltage value PAr of the erase voltage VERA (hereinafter, this determination is also described as "determining the initial voltage value of the erase voltage VERA") (step S33). For example, the processing of "determining the initial voltage value of the erase voltage VERA" in step S33 is performed every time the erase operation is executed, every time the write operation/erase operation is executed a predetermined number of times, or when the number of times the write operation/erase operation is executed reaches a predetermined number. The processing of "determining the initial voltage value of the erase voltage VERA" in step S33 will be described later in detail.

Next, based on a determination result of "determining the initial voltage value of the erase voltage VERA" in step S33, the memory controller 20 updates or maintains without updating the initial voltage value PAr associated with the erasure target block BLKr in the voltage value management table 22B_2 of the memory 22 (step S34). The erase operation is thus completed.

Figure 26:
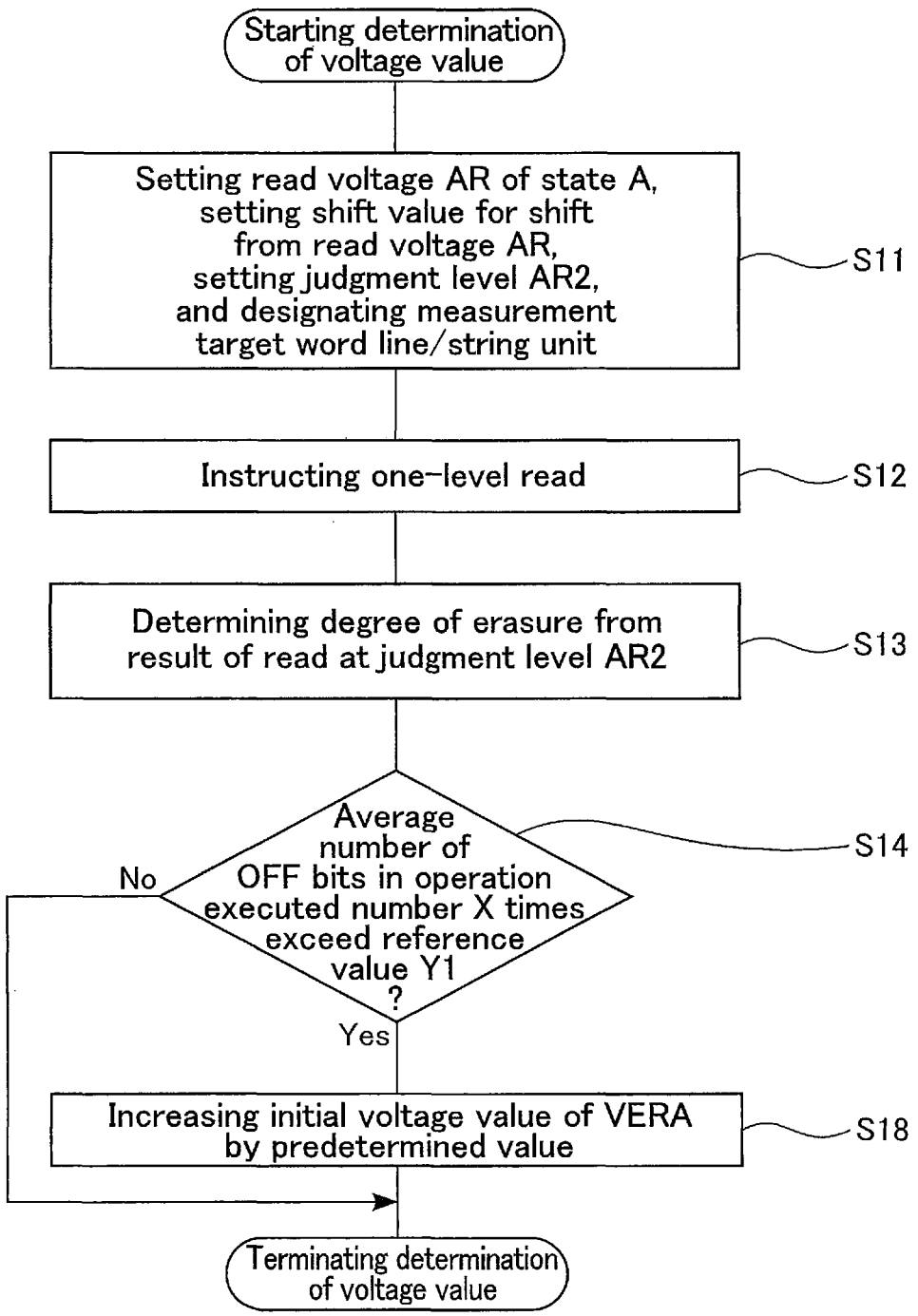
FIG. 26 is a flowchart showing processing of "determining an initial voltage value of the erase voltage VERA" in FIG. 23.

Next, the processing of "determining the initial voltage value of the erase voltage VERA" in step S33 in the flowchart shown in FIG. 23 will be described in detail. FIG. 26 is a flowchart showing the processing of "determining the initial voltage value of the erase voltage VERA" in step S33. The processing shown in FIG. 26 is instructed and controlled by the memory controller 20 (or the CPU 21).

The processing from steps S11 to S14 shown in FIG. 26 is similar to the processing from steps S11 to S14 shown in FIG. 11A described above.

As shown in step S11 in FIG. 26, the memory controller 20 sets the read voltage AR of the state "A" as a read voltage, and further sets a shift value used for making a shift from the read voltage AR. Herein, a read voltage shifted from the read voltage AR by the shift value is defined as a judgment level AR2. The judgment level AR2 is a voltage level used for determining the degree of erasure in memory cells after the erase operation. The memory controller 20 sets to the semiconductor memory device 10 the judgment level AR2 shifted from the read voltage AR by the shift value. The memory controller 20 further designates to the semiconductor memory device 10 a word line WL and a string unit SU serving as a measurement target in an erasure target block BLKr (step S11).

The memory controller 20 instructs the semiconductor memory device 10 to perform the "one-level read" of the state "A" (step S12). Upon receipt of the instruction for the "one-level read" of the state "A", the sequencer 16 of the semiconductor memory device 10 executes the read operation at the set judgment level AR2 on measurement target memory cells. The sequencer 16 outputs a read result RA2R of the read operation using the judgment level AR2, from the semiconductor memory device 10 to the memory controller 20. As an erase result after the erase operation, the memory controller 20 counts the number of OFF bits from the read result RA2R. The number of OFF bits is stored in the buffer 22A in the memory 22.

Next, based on the read result of the read operation using the judgment level AR2, the memory controller 20 determines the degree of erasure in memory cells after the erase operation. That is, the memory controller 20 determines the degree of erasure in memory cells after the erase operation, from the obtained number of OFF bits (step S13). More specifically, the memory controller 20 executes the read operation using the judgment level AR2 in the case of determining the degree of erasure in memory cells after the erase operation. When the number of times the read operation is performed has reached the number X, the memory controller 20 determines whether or not the average number of OFF bits in the read operation performed the number X times exceeds the reference value Y1 (step S14).

If it is determined in step S14 that the average number of OFF bits exceeds the reference value Y1 (Yes), the memory controller 20 increases the initial voltage value PAr of the erase voltage VERA by a predetermined value (step S18). On the other hand, if the average number of OFF bits does not exceed the reference value Y1 (No), the memory controller 20 terminates the processing of "determining the initial voltage value of the erase voltage VERA".

A specific example of the determination in S14 as to whether the number of OFF bits exceeds the reference value Y1 is similar to that of the first embodiment. In the case where the average number of OFF bits stored in t-3, t-2, t-1, and t-0 of the buffer 22A does not exceed the reference value of 30, the memory controller 20 terminates the processing without changing the initial voltage value PAr of the erase voltage VERA. On the other hand, if the average number of OFF bits stored in t-3, t-2, t-1, and t-O of the buffer 22A exceeds the reference value of 30, the memory controller 20 increases the initial voltage value PAr of the erase voltage VERA by a predetermined value, and then terminates the processing.

The following description is about input/output of commands, addresses, and data between the memory controller 20 and the semiconductor memory device 10 in the first example of the erase operation according to the second embodiment.

FIG. 27 is a diagram showing a command sequence in the first example of the erase operation according to the second embodiment. Output of commands and addresses from the memory controller 20 to the semiconductor memory device 10 and input/output of data between the memory controller 20 and the semiconductor memory device 10, which will be described below, are performed using the I/O signals DQ0 to DQ7. The command sequence shown in FIG. 27 includes an input/output cycle of commands, addresses, and data. A command is expressed by a hexagon, an address is expressed by a rounded corner square (or an ellipse), and a data input/output cycle is expressed by a square.

As shown in FIG. 27, the command sequence includes: a phase P11 corresponding to "setting the initial voltage value of the erase voltage VERA (step S21)"; a phase P2 corresponding to "instructing the erase operation (step S22)"; a phase P3 corresponding to "setting the judgment level AR2 (step S11)" for a shift read in the one-level read; and phases P3 and P4 corresponding to "instructing the one-level read (step S12)" in the shift read. The phases P2, P3 and P4 are similar to the above-described phases P2, P3 and P4 shown in FIG. 15.

First, in the phase P11 for setting the initial voltage value of the erase voltage VERA, the memory controller 20 sequentially outputs a command "0Xh", an address "01h", and data "PAr" to the semiconductor memory device 10. The command "0Xh" is a command for designating an erase mode. The address "01h" is an address for setting the initial voltage value of the erase voltage VERA. The data "PAr" is data indicative of the initial voltage value of the erase voltage VERA corresponding to an erasure target block BLKr. In this manner, the memory controller 20 designates an erase mode for the semiconductor memory device 10, and sets to the register 15D_2 of the semiconductor memory device 10 the initial voltage value PAr of the erase voltage VERA used in the erase operation on the erasure target block BLKr.

Next, in the phase P2 for instructing the erase operation, the memory controller 20 sequentially outputs an erase setup command "60h", an address "ADD" of the erasure target block BLKr, and the erase execution command "D0h" to the semiconductor memory device 10. Upon receipt of the erase execution command "D0h", the sequencer 16 of the semiconductor memory device 10 executes the erase operation on the erasure target block BLKr by applying the erase voltage VERA having the initial voltage value PAr to the well interconnect CPWELL.

Thereafter, the memory controller 20 outputs a status read command "70h" to the semiconductor memory device 10. Upon receipt of the status read command "70h", the semiconductor memory device 10 outputs to the memory controller 20 data indicative of whether an erasure target block has passed or failed the erase operation. Herein, for example, the semiconductor memory device 10 outputs to the memory controller 20 data "PASS" indicating that an erasure target block has passed the erase operation.

Next, in the phase P3 for setting the judgment level AR2, the memory controller 20 sequentially outputs to the semiconductor memory device 10 a one-level read command "X1h" of the state "A", and an address "01h" indicative of the read voltage AR of the state "A". Furthermore, the memory controller 20 sequentially outputs to the semiconductor memory device 10 a shift read command "X2h", an address "01h", and data "SHIFT" indicative of a shift value from the read voltage AR. In this manner, the memory controller 20 sets to the semiconductor memory device 10 the judgment level AR2 used for the shift read in the one-level read.

Next, in the phase P4 for instructing the read, the memory controller 20 sequentially outputs to the semiconductor memory device 10 a read setup command "00h", addresses "ADD1 to ADD5" of measurement target memory cells, and a read execution command "30h". Upon receipt of the read execution command "30h", the sequencer 16 of the semiconductor memory device 10 executes the read operation using the judgment level AR2 on measurement target memory cells, which are designated by the addresses "ADD1 to ADD5". Thereafter, the sequencer 16 outputs a read result RA2R obtained through the read operation using the judgment level AR2, from the semiconductor memory device 10 to the memory controller 20. The memory controller 20 counts the number "DO2" of OFF bits which remain, according to the read result RA2R, in the OFF state without transitioning to the ON state.

As described above, the example in which the initial voltage value PAr of the erase voltage VERA is increased was described as the first example. However, the initial voltage PAr of the erase voltage VERA may be increased or decreased based on the erase result of memory cells, as with the modification of the first example of the first embodiment.

In the first example, through the read operation after the erase operation, the semiconductor memory device 10 outputs to the memory controller 20 the number of OFF bits among measurement target memory cells in the erasure target block BLKr. Based on the number of OFF bits, the memory controller 20 updates or maintains without updating the initial voltage value PAr of the erase voltage VERA.

2.1.2 Second Example of Erase Operation

In the second example, after the write operation subsequent to the erase operation, the initial voltage value of the erase voltage VERA is updated based on the erase result of memory cells belonging to a word line WL and a string unit SU serving as a measurement target in an erasure target block. An example described herein is a case in which the initial voltage value of the erase voltage VERA is increased based on an erase result of memory cells. In the second example, the write operation is added between the erase operation and the determination as to whether to update the initial voltage value.

Figure 28:
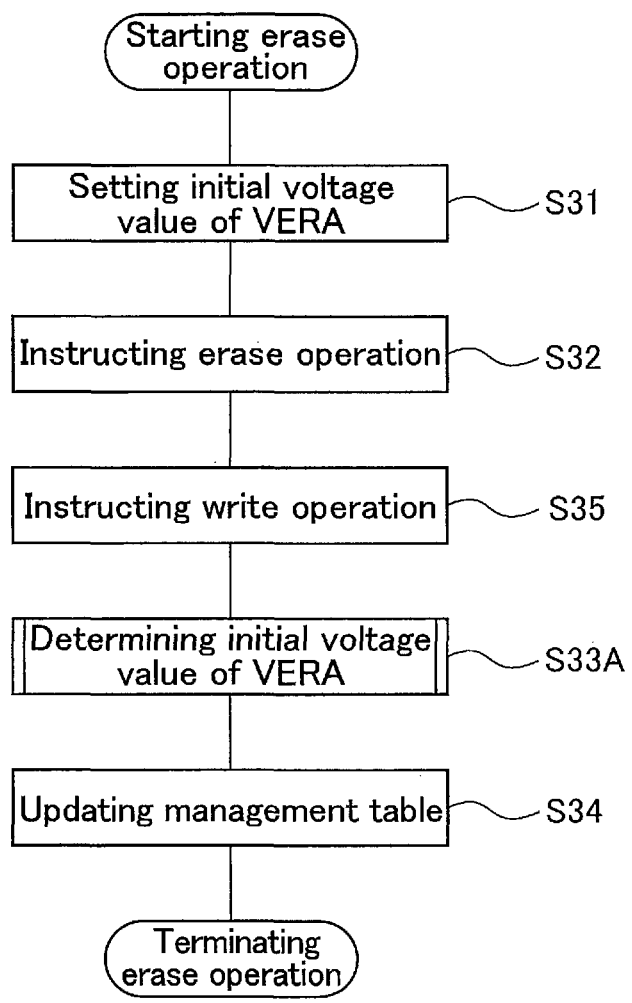
FIG. 28 is a flowchart showing a second example of the erase operation in the memory system according to the second embodiment.

FIG. 28 is a flowchart showing the second example of the erase operation in the memory system 1 according to the second embodiment. The processing shown in FIG. 28 is instructed and controlled by the memory controller 20 (or the CPU 21).

As with the first example, the memory controller 20 transmits to the semiconductor memory device 10 the initial voltage value PAr of the erase voltage VERA corresponding to the erasure target block BLKr in the voltage value management table 22B_2 and causes the register 15D_2 of the semiconductor memory device 10 to store the initial voltage value PAr (step S31). The memory controller 20 instructs the semiconductor memory device 10 to perform the erase operation (step S32). Upon receipt of the instruction for the erase operation, the sequencer 16 of the semiconductor memory device 10 executes the erase operation on the erasure target block BLKr.

After execution of the erase operation on the erasure target block BLKr, the memory controller 20 instructs the semiconductor memory device 10 to execute the write operation (step S35). Upon receipt of the instruction for the write operation, the sequencer 16 of the semiconductor memory device 10 executes the write operation on write target memory cells in the erasure target block BLKr.

Next, based on the erase state of memory cells after the write operation, the memory controller 20 determines whether to update the initial voltage value PAr of the erase voltage VERA (hereinafter, this determination is also described as "determining the initial voltage value of the erase voltage VERA") (step S33A). For example, as with the first example, the processing of "determining the initial voltage value of the erase voltage VERA" in step S33A is performed every time the write operation is executed after the erase operation, or every time the write operation/erase operation is executed a predetermined number of times, or when the number of times the write operation/erase operation is executed reaches a predetermined number. The processing of "determining the initial voltage value of the erase voltage VERA" in step S33A will be described later in detail.

Next, based on a determination result of "determining the initial voltage value of the erase voltage VERA" in step S33A, the memory controller 20 updates or maintains without updating the initial voltage value PAr associated with the erasure target block BLKr in the voltage value management table 22B_2 of the memory 22 (step S34). The erase operation is thus completed.

Figure 29:
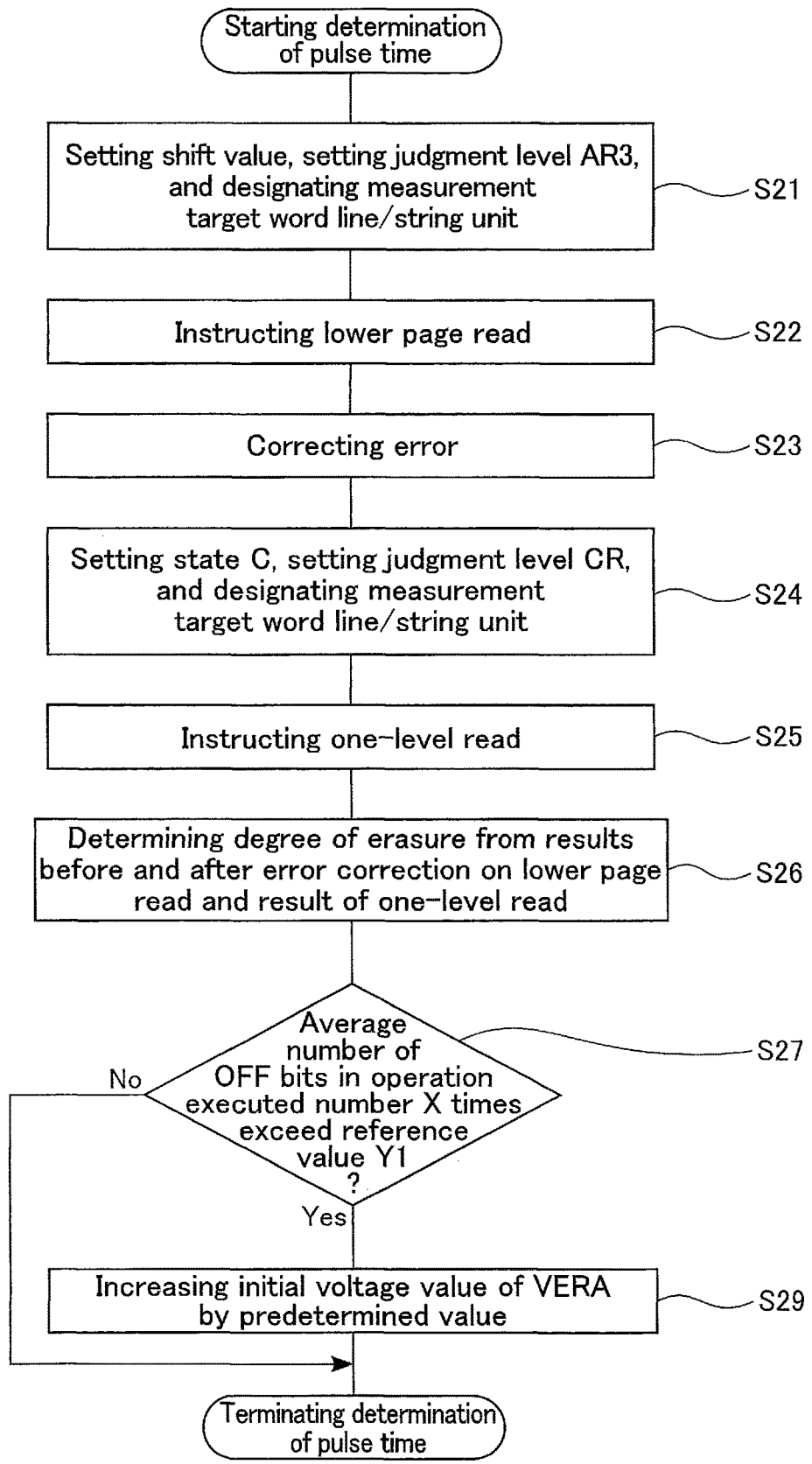
FIG. 29 is a flowchart showing processing of "determining an initial voltage value of the erase voltage VERA" in FIG. 28.

Next, the processing of "determining the initial voltage value of the erase voltage VERA" in step S33A in the flowchart shown in FIG. 28 will be described in detail. FIG. 29 is a flowchart showing the processing of "determining the initial voltage value of the erase voltage VERA" in step S33A. The processing shown in FIG. 29 is instructed and controlled by the memory controller 20 (or the CPU 21).

The processing from steps S21 to S27 shown in FIG. 29 is similar to the processing from steps S21 to S27 shown in FIG. 18 described above.

As shown in FIG. 29, the memory controller 20 sets the read voltage AR of the state "A" as a read voltage, and further sets a shift value used for making a shift from the read voltage AR. Herein, a read voltage shifted from the read voltage AR by the shift value is defined as a judgment level AR3. The judgment level AR3 is a voltage level used to determine the degree of erasure in memory cells after the erase operation. The memory controller 20 sets to the semiconductor memory device 10 the judgment level AR3 shifted from the read voltage AR by the shift value. The memory controller 20 further designates to the semiconductor memory device 10 a word line WL and a string unit SU serving as a measurement target in an erasure target block BLKr (step S21).

Next, the memory controller 20 instructs the semiconductor memory device 10 to execute a "lower page read" (step S22). Upon receipt of the instruction for the "lower page read", the sequencer 16 of the semiconductor memory device 10 executes the read operation using the set judgment level AR3 and read voltage ER on, for example, measurement target memory cells, and obtains lower page data RLP before being subjected to error correction. The lower page data RLP is data immediately after a read using the judgment level AR3 and the read voltage ER, and is not yet subjected to the error correction.

Next, the memory controller 20 receives from the semiconductor memory device 10 the lower page data RLP before being subjected to the error correction. The memory controller 20 causes the ECC circuit 24 to correct an error in the lower page data RLP before being subjected to the error correction, and obtains the lower page data CLP after being subjected to the error correction (step S23).

Next, the memory controller 20 sets the read voltage CR of the state "C" to the semiconductor memory device 10. The memory controller 20 further designates to the semiconductor memory device 10 a word line WL and a string unit SU serving as a measurement target in an erasure target block BLKr (step S24).

Next, the memory controller 20 instructs the semiconductor memory device 10 to perform the "one-level read" of the state "C" (step S25). Upon receipt of the instruction for the "one-level read" of the state "C", the sequencer 16 executes the read operation at the read voltage CR on, for example, measurement target memory cells, obtains a read result RCR of the state "C", and outputs it to the memory controller 20.

The memory controller 20 performs an AND operation on the data RLP2 and two data pieces CLP and RCR, thereby obtaining the number of OFF bits to determine the degree of erasure. Herein, the data RLP2 is data obtained by performing a NOT operation on the lower page data RLP before being subjected to the error correction, obtained in step S22, and the two data pieces CLP and RCR are data obtained in steps S23 and S25. The memory controller 20 stores the obtained number of OFF bits in the buffer 22A within the memory 22.

Next, based on the erasure state of memory cells after the write operation, the memory controller 20 determines the degree of erasure in erasure target memory cells after the write operation. That is, the memory controller 20 determines the degree of erasure in erasure target memory cells after the write operation, from the number of OFF bits stored in the buffer 22A (step S26). More specifically, in the case of determining the degree of erasure after the write operation subsequent to the erase operation, the memory controller 20 executes the processing in steps S22, S23, and S25 on measurement target memory cells. When the number of times the processing in steps S22, S23, and S25 is performed has reached the number X, the memory controller 20 determines whether or not the average number of OFF bits in the aforementioned processing performed the number X times exceeds a reference value Y1 (step S27). If it is determined that the average number of OFF bits in the aforementioned processing performed the number X times exceeds the reference value Y1 (Yes), the memory controller 20 increases the initial voltage value PAr of the erase voltage VERA by a predetermined value (step S29). On the other hand, if the average number of OFF bits in the aforementioned processing performed the number X times does not exceed the reference value Y1 (No), the memory controller 20 terminates the processing of "determining the initial voltage value of the erase voltage VERA".

A specific example of the determination in step S27 as to whether the number of OFF bits exceeds the reference value Y1 is similar to that of the first embodiment.

The following description is about input/output of commands, addresses, and data between the memory controller 20 and the semiconductor memory device 10 in the second example of the erase operation according to the second embodiment.

Figure 30:
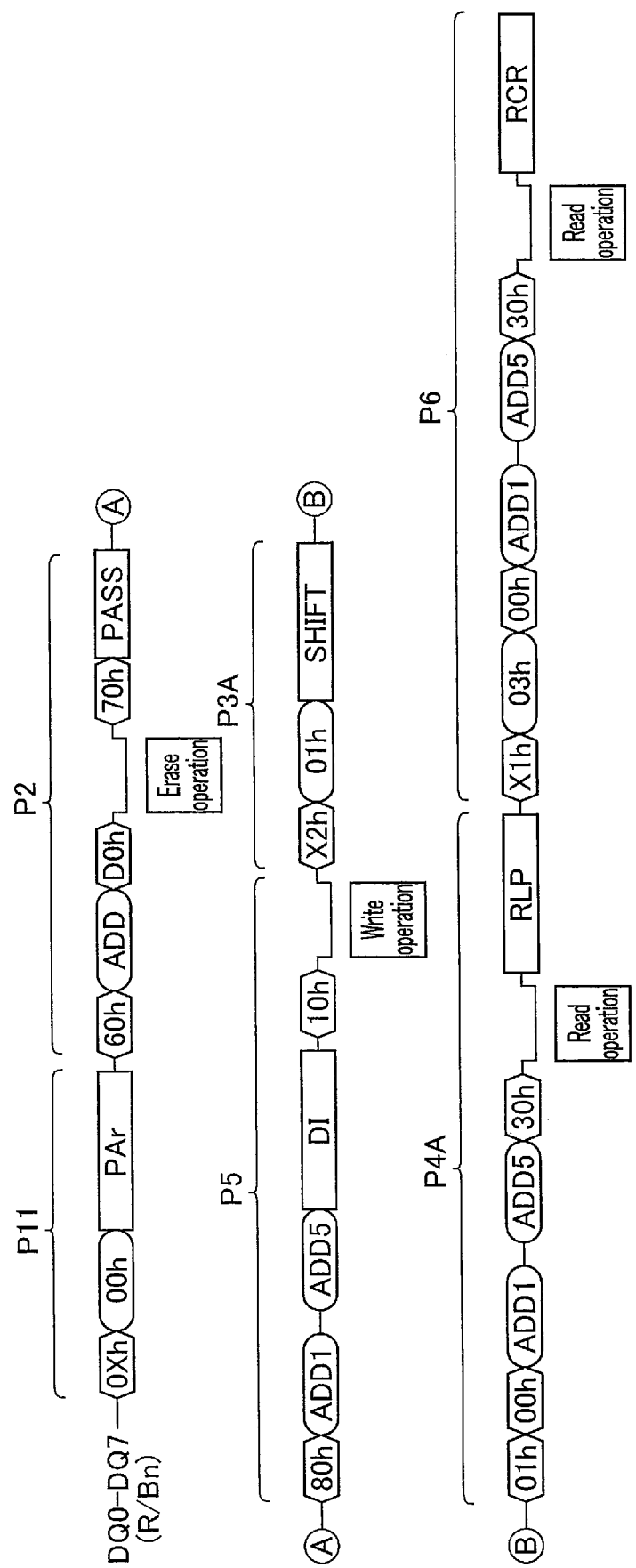
FIG. 30 is a diagram showing a command sequence in the second example of the erase operation according to the second embodiment.

FIG. 30 is a diagram showing a command sequence in the second example of the erase operation according to the second embodiment Output of commands and addresses from the memory controller 20 to the semiconductor memory device 10 and input/output of data between the memory controller 20 and the semiconductor memory device 10, which will be described below, are performed using the I/O signals DQ0 to DQ7. The command sequence shown in FIG. 30 includes an input/output cycle of commands, addresses, and data. A command is expressed by a hexagon, an address is expressed by a rounded corner square (or an ellipse), and a data input/output cycle is expressed by a square.

As shown in FIG. 30, the command sequence includes: a phase P11 corresponding to "setting the initial voltage value of the erase voltage VERA (step S31)"; a phase P2 corresponding to "instructing the erase operation (step S32)"; a phase P5 corresponding to "instructing the write operation (step S35)"; a phase P3A corresponding to "setting the judgment level AR3 (step S21)" for a shift read in the lower page read; a phase P4A corresponding to "instructing the lower page read (step S22)" in the shift read; and a phases P6 corresponding to "instructing the one-level read (step S25)". The phase P11 is similar to the above-described phase P11 shown in FIG. 27, and the phases P2, P5, P3A, P4A, and P6 are similar to the above-described phases P2, P5, P3A, P4A, and P6 shown in FIG. 20.

First, in the phase P11 for setting the initial voltage value of the erase voltage VERA, the memory controller 20 sequentially outputs a command "0Xh" for designating the erase mode, an address "00h", and data "PAr" to the semiconductor memory device 10. In this manner, the memory controller 20 designates an erase mode for the semiconductor memory device 10, and sets to the register 15D_2 of the semiconductor memory device 10 the initial voltage value PAr of the erase voltage VERA used in the erase operation on the erasure target block BLKr.

Next, in the phase P2 for instructing the erase operation, the memory controller 20 sequentially outputs an erase setup command "60h", an address "ADD" of the erasure target block BLKr, and the erase execution command "D0h" to the semiconductor memory device 10. Upon receipt of the erase execution command "D0h", the sequencer 16 of the semiconductor memory device 10 executes the erase operation on the erasure target block BLKr by applying the erase voltage VERA having the initial voltage value PAr to the well interconnect CPWELL. Subsequently, the memory controller 20 outputs a status read command "70h" to the semiconductor memory device 10. Upon receipt of the status read command "70h", the semiconductor memory device 10 outputs to the memory controller 20 data "PASS" indicating that an erasure target block has passed the erase operation.

Next, in the phase P5 for instructing the write operation, the memory controller 20 sequentially outputs to the semiconductor memory device 10 a write setup command "80h", addresses "ADD1 to ADD5" of write target memory cells, write data "DI", and a write execution command "10h". Upon receipt of the write execution command "10h", the sequencer 16 of the semiconductor memory device 10 executes the write operation according to the write data "DI" on write target memory cells which are designated by the addresses "ADD1 to ADD5". The phase P5 is a write operation with respect to a specific address in a block. In order to perform the write operation with respect to a part or all of the addresses in the block, the memory controller 20 may repeatedly perform the phase P5.

Next, in the phase P3A for setting the judgment level AR3, the memory controller 20 sequentially outputs to the semiconductor memory device 10 a shift read command "X2h", an address "01h" indicative of the read voltage AR, and data "SHIFT" indicative of a shift value from the read voltage AR. In this manner, the memory controller 20 sets to the semiconductor memory device 10 the judgment level AR3 used for the shift read in the lower page read.

Next, in the phase P4A for instructing the lower page read, the memory controller 20 sequentially outputs to the semiconductor memory device 10 a command "01h" indicative of a lower page, a read setup command "00h", addresses "ADD1 to ADD5" of measurement target memory cells, and a read execution command "30h". Upon receipt of the read execution command "30h", the sequencer 16 of the semiconductor memory device 10 executes the read operation using the judgment level AR3 and the read operation at the read voltage ER on measurement target memory cells which are designated by the addresses "ADD1 to ADD5". Thereafter, the sequencer 16 outputs to the memory controller 20 the lower page data "RLP" before the error correction, obtained through the read operation using the judgment level AR3 and the read voltage ER. The memory controller 20 causes the ECC circuit 24 to perform the error correction on the received lower page data "RLP" before being subjected to the error correction, thereby calculating the lower page data CLP after being subjected to the error correction.

Next, in the phase P6 for instructing the one-level read, the memory controller 20 sequentially outputs to the semiconductor memory device 10 the one-level read command "X1h", the address "03h" indicative of the read voltage CR of the state "C", the read setup command "00h", the measurement target addresses "ADD1 to ADD5", and the read execution command "30h". Upon receipt of the read execution command "30h", the sequencer 16 of the semiconductor memory device 10 executes the read operation at the read voltage CR on measurement target memory cells which are designated by the addresses "ADD1 to ADD5". Thereafter, the semiconductor memory device 10 outputs to the memory controller 20 the read result RCR obtained through the read operation using the read voltage CR.

Thereafter, as described above, the memory controller 20 performs an AND operation on the data RLP2 obtained by performing a NOT operation on the lower page data RLP before being subjected to the error correction, and two data pieces CLP and RCR, thereby counting the number of OFF bits to determine the degree of erasure.

In the second example, through the read operation after the write operation, the memory controller 20 counts the number of OFF bits among measurement target memory cells in the erasure target block BLKr. Based on the number of OFF bits, the memory controller 20 updates the initial voltage value PAr of the erase voltage VERA or maintains without updating the initial voltage value PAr of the erase voltage VERA.

2.2 Advantageous Effects of Second Embodiment

According to the second embodiment, erasure with respect to memory cells through the erase operation can be optimized by adjusting or updating the initial voltage value of the erase voltage VERA in the first erase loop after the erase operation or the write operation. In other words, by adjusting or updating the initial voltage value of the erase voltage VERA in the first erase loop, memory cells can be prevented from transitioning to the insufficient erasure state or excessive erasure state through the erase operation.

By preventing memory cells from transitioning to the excessive erasure state through the erase operation, damage caused to the memory cells through the erase operation can be reduced. Furthermore, by preventing memory cells from transitioning to the insufficient erasure state through the erase operation, for example, read errors can be reduced in page reads including a read of the state A, for example. The rest of the configuration and advantageous effects are similar to those of the first embodiment.

3. Third Embodiment

Hereinafter, the erase operation in the memory system 1 according to a third embodiment will be described. The configuration of the memory system 1 according to the third embodiment is similar to that of the first embodiment. The explanation of the third embodiment will focus mainly on the points that differ from the first and second embodiments.

3.1 Erase Operation in Third Embodiment

In the erase operation according to the third embodiment, at least one of the initial voltage value or the pulse time of the erase voltage VERA is adjusted (or changed) based on an erase result of memory cells after an erase operation or based on an erase result of memory cells after a write operation subsequent to the erase operation. In the third embodiment, the initial voltage value of the erase voltage VERA, which is adjusted in this third embodiment, is a voltage value of the erase voltage VERA in the first erase loop.

3.1.1 First Example of Erase Operation

In the first example, after the erase operation, at least one of the initial voltage value or the pulse time of the erase voltage VERA is updated based on the erase result of memory cells belonging to a word line WL and a string unit SU both serving as a measurement target in an erasure target block. In the example described herein, if the initial voltage value of the erase voltage VERA does not exceed a reference value, a determination is made as to whether to update the initial voltage value of the erase voltage VERA, and if the initial voltage value of the erase voltage VERA exceeds a reference value, a determination is made as to whether to update the pulse time of the erase voltage VERA.

Figure 31:
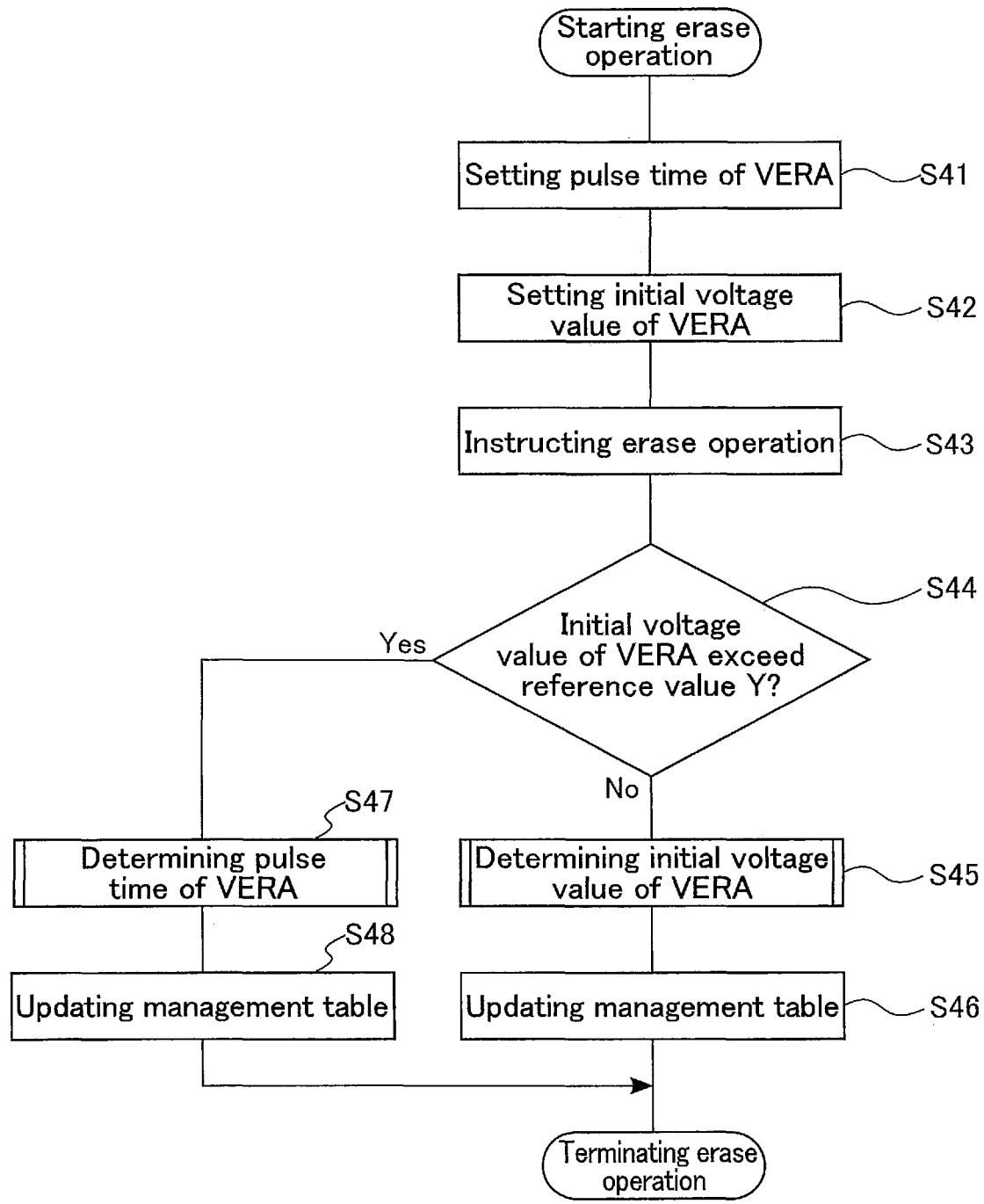
FIG. 31 is a flowchart showing a first example of an erase operation in a memory system according to a third embodiment.

FIG. 31 is a flowchart showing the first example of the erase operation in the memory system 1 according to the third embodiment. FIG. 32 is a diagram showing operations performed between the memory controller 20 and the semiconductor memory device 10. FIG. 33 is a diagram showing an example of a management table 22B_3 for a pulse time and a voltage value, provided in the memory 22 of the memory controller 20. The management table 22B_3 manages the pulse time and the initial voltage value of the erase voltage VERA. In the management table 22B_3, each block BLKr is associated with a pulse time PDr and an initial voltage value PAr used for the erase operation on each associated block BLKr. The processing shown in FIG. 31 is instructed and controlled by the memory controller 20 (or the CPU 21).

As shown in FIGS. 31 and 32, when the erase operation starts, first, the memory controller 20 transmits to the semiconductor memory device 10 a pulse time PDr of the erase voltage VERA corresponding to the erasure target block BLKr in the management table 22B_3, thereby causing the register 15D_1 of the semiconductor memory device 10 to store the pulse time PDr (step S41).

Next, the memory controller 20 transmits to the semiconductor memory device 10 the initial voltage value PAr of the erase voltage VERA corresponding to the erasure target block BLKr in the management table 22B_3, and causes the register 15D_2 of the semiconductor memory device 10 to store the initial voltage value PAr (step S42).

Next, the memory controller 20 instructs the semiconductor memory device 10 to perform the erase operation (step S43). Upon receipt of the instruction for the erase operation, the sequencer 16 of the semiconductor memory device 10 executes the erase operation on the erasure target block BLKr, using the pulse time PDr and the initial voltage value PAr stored in registers 15D_1 and 15D_2.

Next, the memory controller 20 determines whether or not the initial voltage value PAr of the erase voltage VERA used for the erase operation exceeds a reference value Y (step S44). If the initial voltage value PAr does not exceed the reference value Y (No), the memory controller 20 shifts to the processing of "determining the initial voltage value PAr of the erase voltage VERA" (step S45). This processing in step S45 is similar to the processing in step S33 shown in FIG. 23 described above.

Subsequently, based on a determination result of "determining the initial voltage value of the erase voltage VERA" in step S45, the memory controller 20 updates the initial voltage value PAr associated with the erasure target block BLKr, in the management table 22B_3 of the memory 22 (step S46).

On the other hand, in the determination in step S44, if the initial voltage value PAr of the erase voltage VERA exceeds a reference value Y (Yes), the memory controller 20 shifts to the processing of "determining the pulse time of the erase voltage VERA" (step S47). This processing in step S47 is similar to the processing in step S3 shown in FIG. 8 described above.

Subsequently, based on a determination result of "determining the pulse time of the erase voltage VERA" in step S47, the memory controller 20 updates the pulse time PDr associated with the erasure target block BLKr in the management table 22B_3 of the memory 22 (step S48). The erase operation is thus completed.

The following description is about input/output of commands, addresses, and data between the memory controller 20 and the semiconductor memory device 10 in the first example of the erase operation according to the third embodiment.

Figure 34:
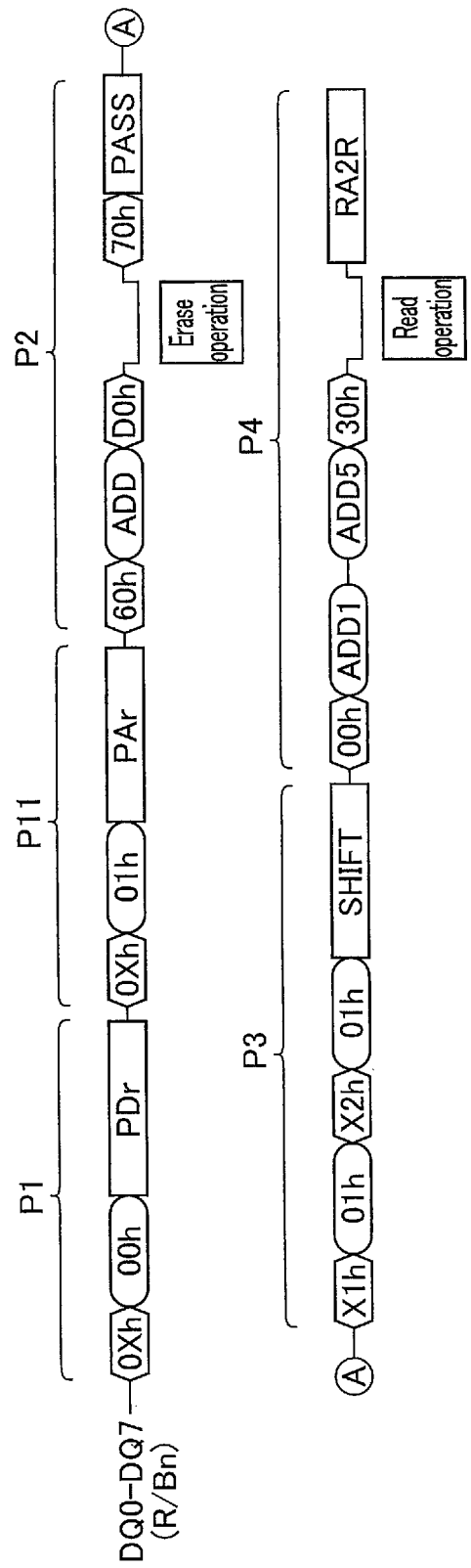
FIG. 34 is a diagram showing a command sequence in the first example of the erase operation according to the third embodiment.

FIG. 34 is a diagram showing a command sequence in the first example of the erase operation according to the third embodiment. The I/O signals DQ0 to DQ7 are used for output of commands and addresses from the memory controller 20 to the semiconductor memory device 10 and for output of data between the memory controller 20 and the semiconductor memory device 10, which will be described below. The command sequence shown in FIG. 34 includes an input/output cycle of commands, addresses, and data. A command is expressed by a hexagon, an address is expressed by a rounded corner square (or an ellipse) and a data input/output cycle is expressed by a square.

As shown in FIG. 34, the command sequence includes: a phase P1 corresponding to "setting the pulse time of the erase voltage VERA (step S41)"; a phase P11 corresponding to "setting the initial voltage value of the erase voltage VERA (step S42)", a phase P2 corresponding to "instructing the erase operation (step S43)", a phase P3 corresponding to "setting the judgment level AR2 (step S11)", and a phase P4 corresponding to "instructing the one-level read (step S12)". The phases P1, P11, P2, P3, and P4 are similar to the above-described phases P1, P11, P2, P3, and P4 shown in FIG. 15 and FIG. 27.

First, in the phase P1 for setting the pulse time of the erase voltage VERA, the memory controller 20 sequentially outputs a command "0Xh", an address "00h", and data "PDr" to the semiconductor memory device 10. The command "0Xh" is a command for designating an erase mode. The address "00h" is an address for setting the pulse time of the erase voltage VERA. The data "PDr" is data indicative of the pulse time of the erase voltage VERA corresponding to an erasure target block BLKr. In this manner, the memory controller 20 designates an erase mode for the semiconductor memory device 10, and sets to the register 15D_1 of the semiconductor memory device 10 the pulse time PDr of the erase voltage VERA used in the erase operation on the erasure target block BLKr.

Next, in the phase P11 for setting the initial voltage value of the erase voltage VERA, the memory controller 20 sequentially outputs a command "0Xh", an address "01h", and data "PAr" to the semiconductor memory device 10. The command "0Xh" is a command for designating an erase mode. The address "01h" is an address for setting the initial voltage value of the erase voltage VERA. The data "PAr" is data indicative of the initial voltage value of the erase voltage VERA corresponding to an erasure target block BLKr. In this manner, the memory controller 20 designates an erase mode for the semiconductor memory device 10, and sets to the register 15D_2 of the semiconductor memory device 10 the initial voltage value PAr of the erase voltage VERA used in the erase operation on the erasure target block BLKr.

Next, in the phase P2 for instructing the erase operation, the memory controller 20 sequentially outputs an erase setup command "60h", an address "ADD" of the erasure target block BLKr, and the erase execution command "D0h" to the semiconductor memory device 10. Upon receipt of the erase execution command "D0h", the sequencer 16 of the semiconductor memory device 10 executes the erase operation on the erasure target block BLKr by applying the erase voltage VERA having the pulse time PDr and the initial voltage value PAr to the well interconnect CPWELL.

Thereafter, the memory controller 20 outputs a status read command "70h" to the semiconductor memory device 10. Upon receipt of the status read command "70h", the semiconductor memory device 10 outputs to the memory controller 20 data "PASS" indicating that an erasure target block has passed the erase operation.

Next, in the phase P3 for setting the judgment level AR2, the memory controller 20 sequentially outputs to the semiconductor memory device 10 a one-level read command "X1h" of the state "A", an address "01h" indicative of the read voltage AR of the state "A", a shift read command "X2h", an address "01h", and data "SHIFT" indicative of a shift value from the read voltage AR. In this manner, the memory controller 20 sets to the semiconductor memory device 10 the judgment level AR2 used for the shift read in the one-level read.

Next, in the phase P4 for instructing the read, the memory controller 20 sequentially outputs to the semiconductor memory device 10 a read setup command "00h", addresses "ADD1 to ADD5", and a read execution command "30h". Upon receipt of the read execution command "30h", the sequencer 16 of the semiconductor memory device 10 executes the read operation using the judgment level AR2 on measurement target memory cells which are designated by the addresses "ADD1 to ADD5". Thereafter, the sequencer 16 outputs a read result RA2R read through the read operation at the judgment level AR2, from the semiconductor memory device 10 to the memory controller 20. The memory controller 20 counts the number "DO3" of OFF bits from the read result RA2R.

In the first example, if the initial voltage value of the erase voltage VERA does not exceed a reference value, the memory controller 20 determines whether to update the initial voltage value of the erase voltage VERA, and if the initial voltage value of the erase voltage VERA exceeds a reference value, the memory controller 20 determines whether to update the pulse time of the erase voltage VERA.

In the first example, the memory controller 20 first determines whether or not the initial voltage value of the erase voltage VERA exceeds a reference value, and if the initial voltage value exceeds the reference value, then determines whether to update the pulse time of the erase voltage VERA. However, the first example is not limited to this. The initial voltage value and the pulse time may be switched in such a manner that the memory controller 20 first determines whether or not the pulse time exceeds a reference value, and if the pulse time exceeds the reference value, then determines whether to update the initial voltage value of the erase voltage VERA.

3.1.2 Second Example of Erase Operation

In the second example, after the write operation subsequent to the erase operation, at least one of the initial voltage value or the pulse time of the erase voltage VERA is updated based on the erase result of memory cells belonging to a word line WL and a string unit SU serving as a measurement target in an erasure target block. In the second example, the write operation is added between the erase operation and the determination as to whether the initial voltage value of the erase voltage VERA exceeds a reference value.

FIG. 35 is a flowchart showing the second example of the erase operation in the memory system 1 according to the third embodiment. The processing shown in FIG. 35 is instructed and controlled by the memory controller 20 (or the CPU 21).

As with the first example, the memory controller 20 transmits to the semiconductor memory device 10 the pulse time PDr of the erase voltage VERA corresponding to the erasure target block BLKr in the management table 22B_3, thereby setting the pulse time PDr to the register 15D_1 of the semiconductor memory device 10 (step S41).

Next, the memory controller 20 transmits to the semiconductor memory device 10 the initial voltage value PAr of the erase voltage VERA corresponding to the erasure target block BLKr in the management table 22B_3, and sets the initial voltage value PAr to the register 15D_2 of the semiconductor memory device 10 (step S42).

The memory controller 20 instructs the semiconductor memory device 10 to perform the erase operation (step S43) Upon receipt of the instruction for the erase operation, the sequencer 16 of the semiconductor memory device 10 executes the erase operation on the erasure target block BLKr.

After execution of the erase operation on the erasure target block BLKr, the memory controller 20 instructs the semiconductor memory device 10 to execute the write operation (step S49). Upon receipt of the instruction for the write operation, the sequencer 16 of the semiconductor memory device 10 executes the write operation on write target memory cells in the erasure target block BLKr.

The subsequent processing in steps S44, S45, S46, and steps S44, S47, and S48 is similar to that of the first example shown in FIG. 31. That is, the memory controller 20 determines whether or not the initial voltage value PAr of the erase voltage VERA that was used for the erase operation exceeds a reference value Y (step S44). If the initial voltage value PAr does not exceed the reference value Y (No), the memory controller 20 determines whether to update the initial voltage value PAr (step S45). Depending on a result of this determination, the memory controller 20 updates or maintains without updating the initial voltage PAr of the erase voltage VERA (step S46).

On the other hand, if the initial voltage value PAr exceeds a reference value Y (Yes) in step S44, the memory controller 20 determines whether to update the pulse time PDr of the erase voltage VERA (step S47). Depending on a result of this determination, the memory controller 20 updates or maintains without updating the pulse time PDr of the erase voltage VERA (step S48). The erase operation is thus completed.

The following description is about input/output of commands, addresses, and data between the memory controller 20 and the semiconductor memory device 10 in the second example of the erase operation according to the third embodiment.

Figure 36:
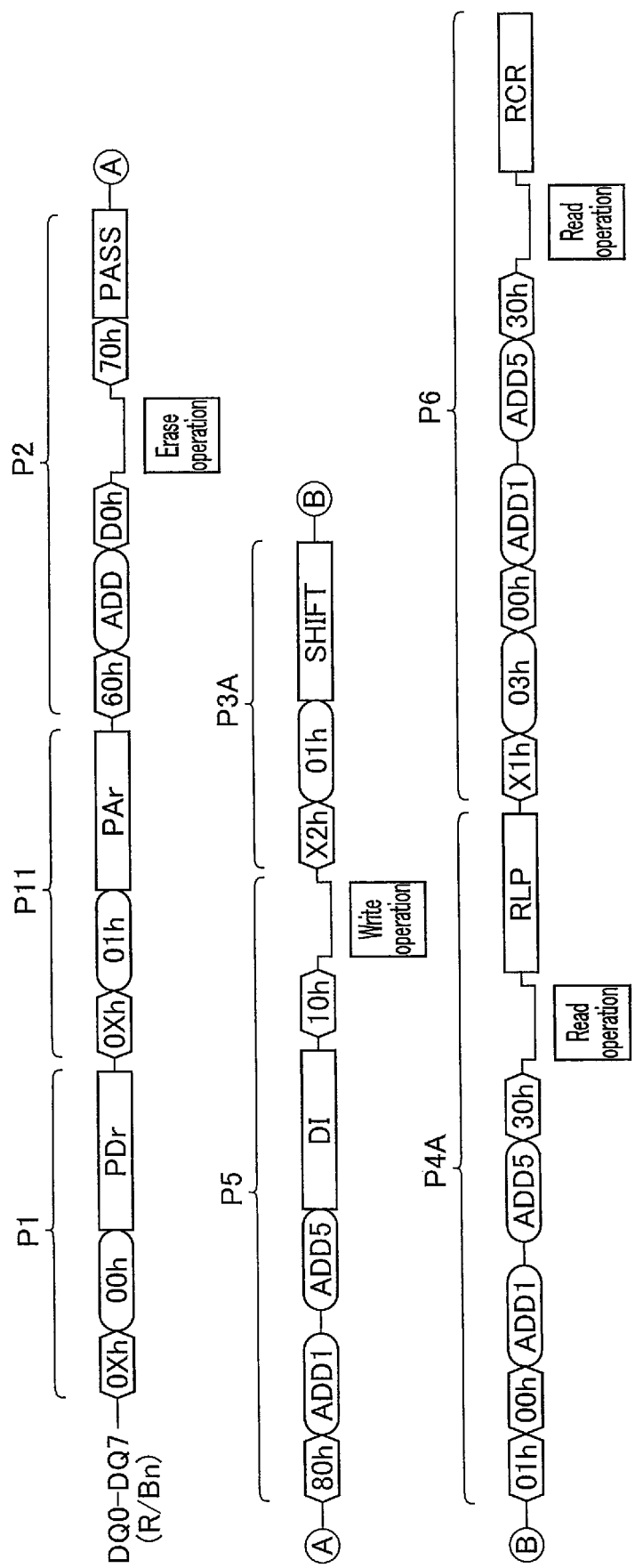
FIG. 36 is a diagram showing a command sequence in the second example of the erase operation according to the third embodiment.

FIG. 36 is a diagram showing a command sequence in the second example of the erase operation according to the third embodiment. Output of commands and addresses from the memory controller 20 to the semiconductor memory device 10 and input/output of data between the memory controller 20 and the semiconductor memory device 10, which will be described below, are performed using the I/O signals DQ0 to DQ7. The command sequence shown in FIG. 36 includes an input/output cycle of commands, addresses, and data. A command is expressed by a hexagon, an address is expressed by a rounded corner square (or an ellipse), and a data input/output cycle is expressed by a square.

As shown in FIG. 36, the command sequence includes: a phase P1 corresponding to "setting the pulse time of the erase voltage VERA (step S41)"; a phase P11 corresponding to "setting the initial voltage value of the erase voltage VERA (step S42)"; a phase P2 corresponding to "instructing the erase operation (step S43)"; a phase P5 corresponding to "instructing the write operation (step S49)"; a phase P3A corresponding to "setting the judgment level AR3 (step S21)" for a shift read in the lower page read; a phase P4A corresponding to "instructing the lower page read (step S22)" in the shift read; and a phases P6 corresponding to "instructing the one-level read (step S25)". The phases P1, P11, P2, P5, P3A, P4A, and P6 are similar to the above-described phases P1, P11, P2, P5, P3A, P4A, and P6 shown in FIGS. 15, 20, and 27.

As with the first example, first, in the phase P1 for setting the pulse time of the erase voltage VERA, the memory controller 20 sequentially outputs a command "0Xh", an address "00h", and data "PDr" indicative of a pulse time to the semiconductor memory device 10. In this manner, the memory controller 20 sets the pulse time PDr of the erase voltage VERA to the register 15D_1 of the semiconductor memory device 10.

Next, in the phase P11 for setting the initial voltage value of the erase voltage VERA, the memory controller 20 sequentially outputs a command "0Xh", an address "01h", and data "PAr" indicative of an initial voltage value to the semiconductor memory device 10. In this manner, the memory controller 20 sets the initial voltage value PAr of the erase voltage VERA to the register 15D_2 of the semiconductor memory device 10.

Next, in the phase P2 for instructing the erase operation, the memory controller 20 sequentially outputs an erase setup command "60h", an address "ADD" of the erasure target block BLKr, and the erase execution command "D0h" to the semiconductor memory device 10. Upon receipt of the erase execution command "D0h", the sequencer 16 of the semiconductor memory device 10 executes the erase processing with respect to the erasure target block BLKr by applying the erase voltage VERA having the pulse time PDr and the initial voltage value PAr to the well interconnect CPWELL.

Thereafter, the memory controller 20 outputs a status read command "70h" to the semiconductor memory device 10. Upon receipt of the status read command "70h", the semiconductor memory device 10 outputs to the memory controller 20 data "PASS" indicating that an erasure target block has passed the erase operation.

Next, in the phase P5 for instructing the write operation, the memory controller 20 sequentially outputs to the semiconductor memory device 10 a write setup command "80h", addresses "ADD1 to ADD5" of write target memory cells, write data "DI", and a write execution command "10h". Upon receipt of the write execution command "10h", the sequencer 16 of the semiconductor memory device 10 executes the write operation according to the write data "DI" on write target memory cells which are designated by the addresses "ADD1 to ADD5". The phase P5 is a write operation with respect to a specific address in a block. In order to perform the write operation with respect to a part or all of the addresses in the block, the memory controller 20 may repeatedly perform the phase P5.

Next, in the phase P3A for setting the judgment level AR3, the memory controller 20 sequentially outputs to the semiconductor memory device 10 a shift read command "X2h", an address "01h" indicative of the read voltage AR, and data "SHIFT" indicative of a shift value from the read voltage AR. In this manner, the memory controller 20 sets to the semiconductor memory device 10 the judgment level AR3 used for the shift read in the lower page read.

Next, in the phase P4A for instructing the lower page read, the memory controller 20 sequentially outputs to the semiconductor memory device 10 a command "01h" indicative of a lower page, a read setup command "00h", addresses "ADD1 to ADD5" of measurement target memory cells, and a read execution command "30h". Upon receipt of the read execution command "30h", the sequencer 16 of the semiconductor memory device 10 executes the read operation using the judgment level AR3 and the read operation at the read voltage ER of the state "E" on measurement target memory cells which are designated by the addresses "ADD1 to ADD5". During the execution of this read operation, the sequencer 16 causes the ready/busy signal R/Bn to transition from the ready state to the busy state (R/Bn="L"). Thereafter, the sequencer 16 outputs to the memory controller 20 the lower page data RLP before being subjected to the error correction, obtained through the read operation using the judgment level AR3 and the read voltage ER. The memory controller 20 causes the ECC circuit 24 to perform the error correction on the received lower page data RLP before being subjected to the error correction, thereby calculating the lower page data CLP after being subjected to the error correction.

Next, in the phase P6 for instructing the one-level read, the memory controller 20 sequentially outputs to the semiconductor memory device 10 the one-level read command "X1h", the address "03h" indicative of the read voltage CR of the state "C", the read setup command "00h", the measurement target addresses "ADD1 to ADD5", and the read execution command "30h". Upon receipt of the read execution command "30h", the sequencer 16 of the semiconductor memory device 10 executes the read operation at the read voltage CR on measurement target memory cells which are designated by the addresses "ADD1 to ADD5". During the execution of this read operation, the sequencer 16 causes the ready/busy signal R/Bn to transition from the ready state to the busy state (R/Bn="L"). Thereafter, the semiconductor memory device 10 outputs to the memory controller 20 the read result RCR obtained through the read operation using the read voltage CR.

Thereafter, as described above, the memory controller 20 performs an AND operation on the data RLP2 obtained by performing a NOT operation on the lower page data RLP before being subjected to the error correction, and two data pieces CLP and RCR, thereby counting the number of OFF bits to determine the degree of erasure.

In the second example, after the write operation subsequent to the erase operation, if the initial voltage value of the erase voltage VERA does not exceed a reference value, the memory controller 20 determines whether to update the initial voltage value of the erase voltage VERA, and if the initial voltage value of the erase voltage VERA exceeds a reference value, determines whether to update the pulse time of the erase voltage VERA.

In the second example also, the memory controller 20 first determines whether the initial voltage value of the erase voltage VERA exceeds a reference value, and if the initial voltage value exceeds the reference value, then determines whether to update the pulse time of the erase voltage VERA. However, the second example is not limited to this. The initial voltage value and the pulse time may be switched in such a manner that the memory controller 20 first determines whether or not the pulse time exceeds a reference value, and if the pulse time exceeds the reference value, then determines whether to update the initial voltage value of the erase voltage VERA. 3.2 Advantageous Effect of Third Embodiment According to the third embodiment, erasure with respect to memory cells through the erase operation can be optimized by adjusting or updating at least one of the initial voltage value or the pulse time of the erase voltage VERA in the first erase loop. In other words, by adjusting or updating at least one of the initial voltage value or the pulse time of the erase voltage VERA in the first erase loop, memory cells can be prevented from transitioning to the insufficient erasure state or excessive erasure state through the erase operation.

By preventing memory cells from transitioning to the excessive erasure state through the erase operation, damage caused to the memory cells through the erase operation can be reduced. Furthermore, by preventing memory cells from transitioning to the insufficient erasure state through the erase operation, for example, read errors can be reduced in page reads including a read of the state A. The rest of the configuration and advantageous effects are similar to those of the first embodiment.

4. Fourth Embodiment

Hereinafter, an erase operation in the memory system 1 according to a fourth embodiment will be described below. A configuration of the memory system 1 according to the fourth embodiment is similar to that of the first embodiment. The explanation of the fourth embodiment will focus mainly on the points that differ from the first embodiment.

4.1 Erase Operation in Fourth Embodiment

The first example and second example of an erase operation according to the fourth embodiment will be described. In the first example, the degree of erasure in memory cells after the erase operation is determined within the semiconductor memory device 10, and the memory controller 20 is notified of a result of this determination. In the second example, the pulse time of the erase voltage VERA is adjusted based on an erase result obtained using a plurality of judgment levels in a read operation.

4.1.1 First Example of Erase Operation

In the first example, after the erase operation, the degree of erasure in memory cells belonging to a word line WL and a string unit SU serving as a measurement target in an erasure target block is determined within the semiconductor memory device 10, and the memory controller 20 is notified of a result of this determination. According to the received result of determination, the memory controller 20 updates the pulse time of the erase voltage VERA.

The following description is about input/output of commands, addresses, and data between the memory controller 20 and the semiconductor memory device 10 in the first example of the erase operation according to the fourth embodiment.

Figure 37:
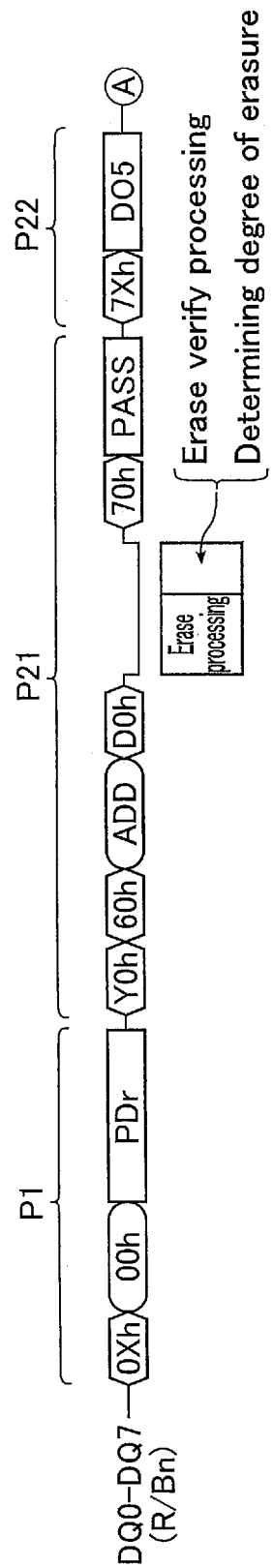
FIG. 37 is a diagram showing a command sequence in a first example of an erase operation according to a fourth embodiment.

FIG. 37 is a diagram showing a command sequence in the first example of the erase operation according to the fourth embodiment. Output of commands and addresses from the memory controller 20 to the semiconductor memory device 10 and input/output of data between the memory controller 20 and the semiconductor memory device 10, which will be described below, are performed using the I/O signals DQ0 to DQ7. Herein, a judgment level prepared in normal erase verify processing is used as a judgment level used for obtaining the number of OFF bits. The command sequence shown in FIG. 37 includes an input/output cycle of commands, addresses, and data. A command is expressed by a hexagon, an address is expressed by a rounded corner square (or an ellipse), and a data input/output cycle is expressed by a square.

As shown in FIG. 37, the command sequence includes: a phase P1 corresponding to "setting the pulse time of the erase voltage VERA"; a phase P21 corresponding to "instructing the erase operation"; and a phase P22 corresponding to "outputting the degree of erasure (determination result)".

The phase P21 includes a command "Y0h", which is a command for instructing the semiconductor memory device 10 to perform the series of operations from the erase operation to the counting of the number of OFF bits. The command "Y0h" includes a phase P3 corresponding to "setting the judgment level AR2 (step S11)"; a phase P4 or P4A corresponding to "instructing the lower page read (step S22)"; and a phase P6 corresponding to "instructing the one-level read (step S25)". Furthermore, the present embodiment includes the processing in which the semiconductor memory device 10 performs the counting of the number of OFF bits, which is performed by the memory controller 20 in the other embodiments. Accordingly, the number of OFF bits indicative of the degree of erasure in memory cells can be obtained by the memory controller 20 designating the phase P21 only, without designating the aforementioned phases P3, P4 (or P4A), and P6, with respect to the semiconductor memory device 10.

First, in the phase P1 for setting the pulse time of the erase voltage VERA, the memory controller 20 sequentially outputs a command "0Xh", an address "00h", and data "PDr" to the semiconductor memory device 10. The command "0Xh" is a command for designating an erase mode. The address "00h" is an address for setting the pulse time of the erase voltage VERA. The data "PDr" is data indicative of the pulse time of the erase voltage VERA corresponding to an erasure target block BLKr. In this manner, the memory controller 20 designates an erase mode for the semiconductor memory device 10, and sets the pulse time PDr of the erase voltage VERA to the register 15D_1 of the semiconductor memory device 10.

Next, in the phase P21 for instructing the erase operation, the memory controller 20 sequentially outputs to the semiconductor memory device 10 an erase command "Y0h" including the counting of the number of OFF bits in the erase operation, an erase setup command "60h", an address "ADD" of the erasure target block BLKr, and the erase execution command "D0h". Upon receipt of the command "Y0h", the sequencer 16 of the semiconductor memory device 10 executes the phase P3 corresponding to "setting the judgment level AR2 (step S11)", the phase P4 or P4A corresponding to "instructing the lower page read (step S22)", and the phase P6 corresponding to "instructing the one-level read (step S25)". Thereafter, upon receipt of the erase execution command "D0h", the sequencer 16 of the semiconductor memory device 10 executes the erase processing on the erasure target block BLKr by applying the erase voltage VERA of the pulse time PDr to the well interconnect CPWELL.

The sequencer 16 further executes the erase verify processing on the erasure target block BLKr, thereby obtaining the number of OFF bits. That is, the sequencer 16 executes the read operation at a judgment level used for the erase verify processing, with respect to memory cells within the erasure target block BLKr, thereby obtaining the number of OFF bits. The sequencer 16 determines from the obtained number of OFF bits, the degree of erasure in memory cells after the erase operation (that is, the insufficient erasure state, the appropriate erasure state, or the excessive erasure state).

Next, the memory controller 20 outputs the status read command "70h" to the semiconductor memory device 10. Upon receipt of the status read command "70h", the semiconductor memory device 10 outputs to the memory controller 20 data "PASS" indicating that an erasure target block has passed the erase operation.

Next, as shown in the phase P22, the memory controller 20 outputs to the semiconductor memory device 10 the status read command "7Xh" for outputting data indicative of the degree of erasure. Upon receipt of the status read command "7Xh", the sequencer 16 of the semiconductor memory device 10 outputs the data "DO5" indicative of the degree of erasure to the memory controller 20.

Thereafter, the memory controller 20 compares the data "DO5" indicative of the degree of erasure with a preset threshold value, and according to a result of this comparison, updates the pulse time PDr of the erase voltage VERA. For example, if the data "DO5" indicative of the degree of erasure indicates the excessive erasure state, the memory controller 20 shortens the pulse time PDr of the erase voltage VERA by a predetermined time length. If the data "DO5" indicative of the degree of erasure indicates the appropriate erasure state, the memory controller 20 maintains without updating the pulse time PDr of the erase voltage VERA. If the data "DO5" indicative of the degree of erasure indicates an insufficient erasure state, the memory controller 20 extends the pulse time PDr of the erase voltage VERA by a predetermined time length.

In the first example, after the erase operation, the sequencer 16 within the semiconductor memory device 10 determines the degree of erasure in memory cells based on the number of OFF bits obtained through the read operation on memory cells in the erasure target block BLKr, thereby notifying the memory controller 20 of data indicative of the degree of erasure. The memory controller 20, based on the data indicative of the degree of erasure, updates the pulse time PDr of the erase voltage VERA or maintains without updating the pulse time PDr of the erase voltage VERA.

In the first example, the memory controller 20 determines based on data indicative of the degree of erasure whether to update the pulse time of the erase voltage VERA; however, instead of this determination, the memory controller 20 may determine based on data indicative of the degree of erasure whether to update the initial voltage value of the erase voltage VERA, and update the initial voltage value.

4.1.2 Second Example of Erase Operation

An example described in the second example is a case where after the erase operation, the pulse time of the erase voltage VERA is updated based on an erase result obtained through the read operation using a plurality of judgment levels.

FIG. 38 is a flowchart showing the second example of the erase operation in the memory system 1 according to the fourth embodiment. The flowchart showing the second example of this erase operation is similar to the flowchart showing the first example of the erase operation according to the first embodiment shown in FIG. 8, except for "determining the pulse time of the erase voltage VERA" (step S3B). Hereinafter, the processing of "determining the pulse time of the erase voltage VERA" in step S3B shown in FIG. 38 will be described.

Figure 39:
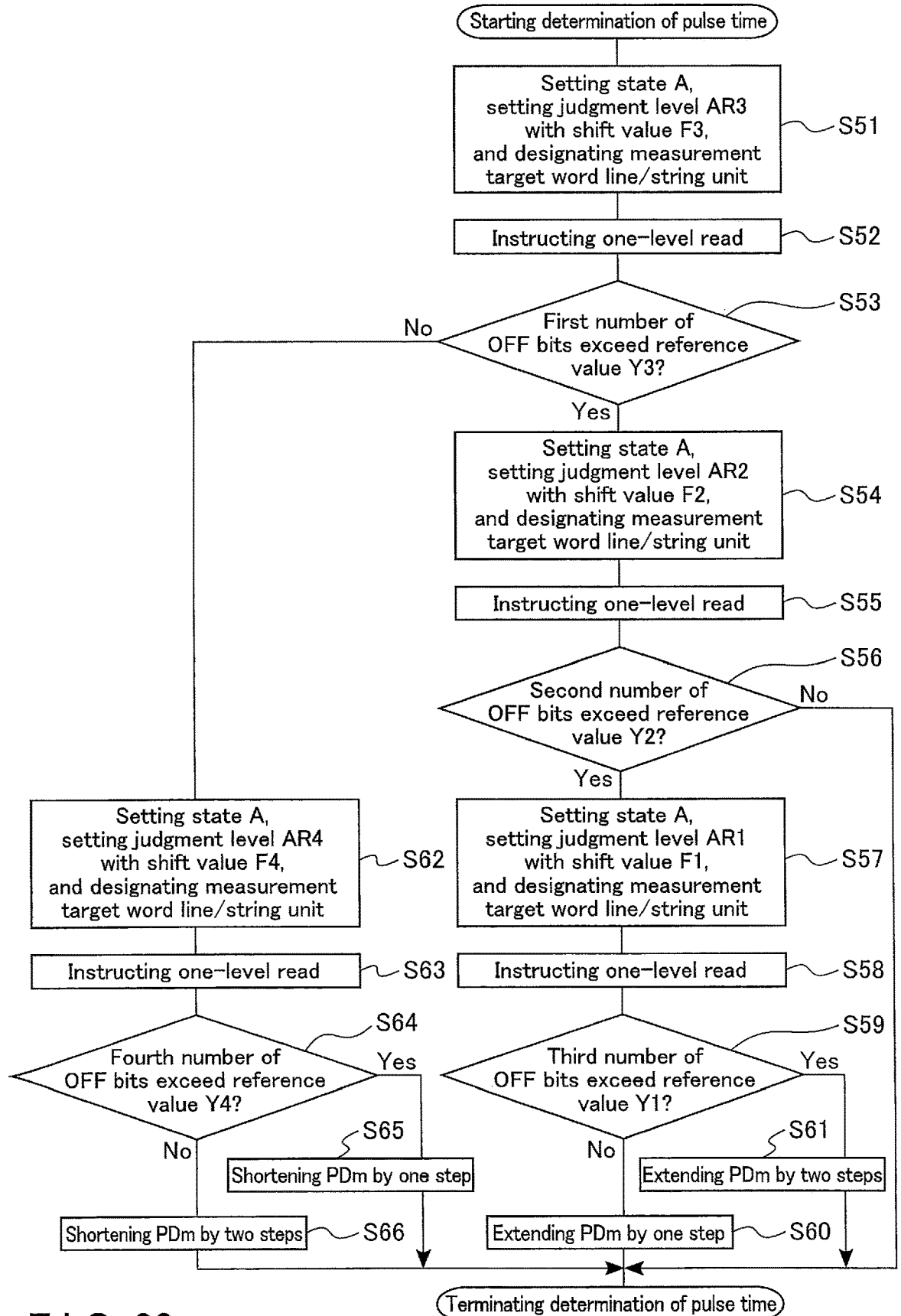
FIG. 39 is a flowchart showing processing of "determining a pulse time of the erase voltage VERA" in FIG. 38.

FIG. 39 is a flowchart showing the processing of "determining the pulse time of the erase voltage VERA" in step S3B shown in FIG. 38. The processing shown in FIG. 39 is instructed and controlled by the memory controller 20 (or the CPU 21). FIG. 40 is a diagram showing threshold voltage distributions of memory cells corresponding to judgment levels AR1 to AR4 used in the determination in step S3B. FIG. 41 is a diagram showing a relationship between the number of OFF bits obtained at the judgment levels AR1 to AR4 and an erasure state. The judgment levels AR1 to AR4 have a magnitude relation expressed as AR4<AR3<AR2<AR1. The degree of erasure is determined to be appropriate in the case where the tail of threshold voltage distribution of memory cells in the erasure state is present between the judgment levels AR3 and AR2.

As shown in FIG. 39, first, the memory controller 20 sets the read voltage AR of the state "A" as a read voltage, and further sets a shift value F3 used for making a shift from the read voltage AR. Herein, a read voltage shifted from the read voltage AR by the shift value F3 is defined as a judgment level AR3. The judgment level AR3 is a voltage level used to determine the degree of erasure in memory cells after the erase operation. The memory controller 20 sets to the semiconductor memory device 10 the judgment level AR3 (see FIG. 40) shifted from the read voltage AR by the shift value F3. The memory controller 20 further designates to the semiconductor memory device 10 a word line WL and a string unit SU serving as a measurement target in an erasure target block BLKr (step S51).

Next, the memory controller 20 instructs the semiconductor memory device 10 to perform the "one-level read" (step S52). Upon receipt of the instruction for the "one-level read", the sequencer 16 of the semiconductor memory device 10 executes the read operation at the set judgment level AR3 on measurement target memory cells. In this read operation, a memory cell having a threshold voltage higher than the judgment level AR3 remains in the OFF state, without transitioning to the ON state. The sequencer 16 outputs a read result RA3R of the read operation using the judgment level AR3, from the semiconductor memory device 10 to the memory controller 20. From the read result RA3R, the memory controller 20 counts the number of memory cells which remain in the OFF state without transitioning to the ON state (hereinafter, referred to as the first number of OFF bits). The memory controller 20 stores the first number of OFF bits in the buffer 22A within the memory 22.

Next, based on the read result of the read operation using the judgment level AR3, the memory controller 20 determines the degree of erasure in memory cells after the erase operation. That is, the memory controller 20 determines the degree of erasure in memory cells after the erase operation, based on the first number of OFF bits obtained through the read operation using the judgment level AR3. Specifically, the memory controller 20 determines whether or not the first number of OFF bits exceeds a reference value Y3 (step S53).

In step S53, if the first number of OFF bits exceeds the reference value Y3 (Yes), the memory controller 20 sets the read voltage AR of the state "A" as a read, and further sets a shift value F2 used for making a shift from the read voltage AR. Herein, a read voltage shifted from the read voltage AR by the shift value F2 is defined as a judgment level AR2. The judgment level AR2 is a voltage level used for determining the degree of erasure in memory cells after the erase operation. The memory controller 20 sets to the semiconductor memory device 10 the judgment level AR2 shifted from the read voltage AR by the shift value F2 (see FIG. 40). The memory controller 20 further designates to the semiconductor memory device 10 a word line WL and a string unit SU both serving as a measurement target in an erasure target block BLKr (step S54).

The memory controller 20 instructs the semiconductor memory device 10 to perform the "one-level read" of the state "A" (step S55). Upon receipt of the instruction for the "one-level read" of the state "A", the sequencer 16 of the semiconductor memory device 10 executes the read operation at the set judgment level AR2 on measurement target memory cells. In this read operation, a memory cell having a threshold voltage higher than the judgment level AR2 remains in the OFF state without transitioning to the ON state. The sequencer 16 outputs a read result RA2R of the read operation using the judgment level AR2, from the semiconductor memory device 10 to the memory controller 20. From the read result RA2R, the memory controller 20 counts the number of memory cells which remain in the OFF state without transitioning to the ON state (hereinafter, referred to as the second number of OFF bits). The memory controller 20 stores the second number of OFF bits in the buffer 22A within the memory 22.

Next, based on the read result of the read operation using the judgment level AR2, the memory controller 20 determines the degree of erasure in memory cells. That is, the memory controller 20 determines the degree of erasure in memory cells based on the second number of OFF bits obtained through the read operation using the judgment level AR2. Specifically, the memory controller 20 determines whether or not the second number of OFF bits exceeds a reference value Y2 (step S56).

In step S56, if the second number of OFF bits does not exceed the reference value Y2 (No), the memory controller 20 determines that the degree of erasure in memory cells is the appropriate erasure state, and terminates the processing of determining a pulse time.

On the other hand, in step S56, if the second number of OFF bits exceeds the reference value Y2 (Yes), the memory controller 20 sets the read voltage AR of the state "A" as a read voltage, and further sets a shift value F1 used for making a shift from the read voltage AR. Herein, a read voltage shifted from the read voltage AR by the shift value F1 is defined as a judgment level AR1. The judgment level AR1 is a voltage level used to determine the degree of erasure in memory cells after the erase operation. The memory controller 20 sets to the semiconductor memory device 10 the judgment level AR1 shifted from the read voltage AR by the shift value F1 (see FIG. 40). The memory controller 20 further designates to the semiconductor memory device 10 a word line WL and a string unit SU serving as a measurement target in an erasure target block BLKr (step S57).

Next, the memory controller 20 instructs the semiconductor memory device 10 to perform the "one-level read" (step S58). Upon receipt of the instruction for the "one-level read", the sequencer 16 of the semiconductor memory device 10 executes the read operation at the set judgment level AR1 on measurement target memory cells. In this read operation, a memory cell having a threshold voltage higher than the judgment level AR1 remains to the OFF state without transitioning to the ON state. The sequencer 16 outputs a read result RA1R of the read operation using the judgment level AR1, from the semiconductor memory device 10 to the memory controller 20. From the read result RA1R, the memory controller 20 counts the number of OFF bits which remain in the OFF state without transitioning to the ON state (hereinafter, referred to as the third number of OFF bits). The memory controller 20 stores the third number of OFF bits in the buffer 22A within the memory 22.

Next, based on the read result of the read operation using the judgment level AR1, the memory controller 20 determines the degree of erasure in memory cells. That is, the memory controller 20 determines the degree of erasure in memory cells on the basis of the third number of OFF bits obtained through the read operation using the judgment level AR1. Specifically, the memory controller 20 determines whether or not the third OFF bits exceed the reference value Y1 (step S59).

In step S59, if the third number of OFF bits does not exceed the reference value Y1 (No), the memory controller 20 determines that the degree of erasure in memory cells is a slightly insufficient erasure state, and extends the pulse time PDr of the erase voltage VERA by one step (step S60). Thereafter, the processing of determining the pulse time is terminated.

On the other hand, in step S59, if the third number of OFF bits exceeds the reference value Y1 (Yes), the memory controller 20 determines that the degree of erasure in memory cells is the insufficient erasure state, and extends the pulse time PDr of the erase voltage VERA by two steps (step S61). Thereafter, the processing of determining the pulse time is terminated.

Furthermore, in step S53, if the first number of OFF bits does not exceed the reference value Y3 (No), the memory controller 20 sets the read voltage AR of the state "A" as a read voltage, and further sets a shift value F4 used for making a shift from the read voltage AR. Herein, a read voltage shifted from the read voltage AR by the shift value F4 is defined as a judgment level AR4. The judgment level AR4 is a voltage level used to determine a degree of erasure in memory cells after the erase operation. The memory controller 20 sets to the semiconductor memory device 10 the judgment level AR4 shifted from the read voltage AR by the shift value F4 (see FIG. 40). The memory controller 20 further designates to the semiconductor memory device 10 a word line WL and a string unit SU serving as a measurement target in an erasure target block BLKr (step S62).

The memory controller 20 instructs the semiconductor memory device 10 to perform the "one-level read" of the state "A" (step S63). Upon receipt of the instruction for the "one-level read" of the state "A", the sequencer 16 of the semiconductor memory device 10 executes the read operation at the set judgment level AR4 on measurement target memory cells. In this read operation, a memory cell having a threshold voltage higher than the judgment level AR4 remains in the OFF state without transitioning to the ON state. The sequencer 16 outputs a read result RA4R of a read operation using the judgment level AR4, from the semiconductor memory device 10 to the memory controller 20. From the read result RA4R, the memory controller 20 counts the number of memory cells which remain in the OFF state without transitioning to the ON state (hereinafter, referred to as the fourth number of OFF bits). The memory controller 20 stores the fourth number of OFF bits in the buffer 22A within the memory 22.

Next, the memory controller 20 determines the degree of erasure in memory cells based on the read result of the read operation using the judgment level AR4. That is, the memory controller 20 determines the degree of erasure in memory cells based on the fourth number of OFF bits obtained through the read operation using the judgment level AR4. Specifically, the memory controller 20 determines whether or not the fourth number of OFF bits exceeds a reference value Y4 (step S64).

In step S64, if the fourth number of OFF bits exceeds the reference value Y4 (Yes), the memory controller 20 determines that the degree of erasure in memory cells is a slightly excessive erasure state, and shortens the pulse time PDr of the erase voltage VERA by one step (step S65). Thereafter, the processing of determining the pulse time is terminated.

On the other hand, in step S64, if the fourth number of OFF bits does not exceed the reference value Y4 (No), the memory controller 20 determines that the degree of erasure in memory cells is the excessive erasure state, and shortens the pulse time PDr of the erase voltage VERA by two steps (step S66). Thereafter, the processing of determining the pulse time is terminated.

In the second example, after the erase operation, the memory controller 20 determines, based on the number of OFF bits obtained through the read operation performed using a plurality of judgment levels on measurement target memory cells in an erasure target block, whether erasure with respect to memory cells corresponds to the excessive erasure state, the slightly excessive erasure state, the appropriate erasure state, the slightly insufficient erasure state, or the insufficient erasure state. Based on results of the above determinations, the memory controller 20 updates the pulse time PDr of the erase voltage VERA by four-stage steps, or maintains without updating the pulse time PDr of the erase voltage VERA.

In the second example, the memory controller 20 determines, based on a determination result of the degree of erasure, whether to update the pulse time PDr of the erase voltage VERA, and updates the pulse time PDr; however, instead of this determination, the memory controller 20 may determine whether to update the initial voltage value PAr of the erase voltage VERA and update the initial voltage value PAr.

4.1.3 Third Example of Erase Operation

A third example corresponds to another aspect of the second example. Described in the third example is another example in which after the erase operation, the pulse time of the erase voltage VERA is updated based on an erase result obtained through the read operation using a plurality of judgment levels.

The flowchart showing the third example of the erase operation is similar to the flowchart showing the second example shown in FIG. 38, except for "determining the pulse time of the erase voltage VERA" (step S3B).

Figure 42:
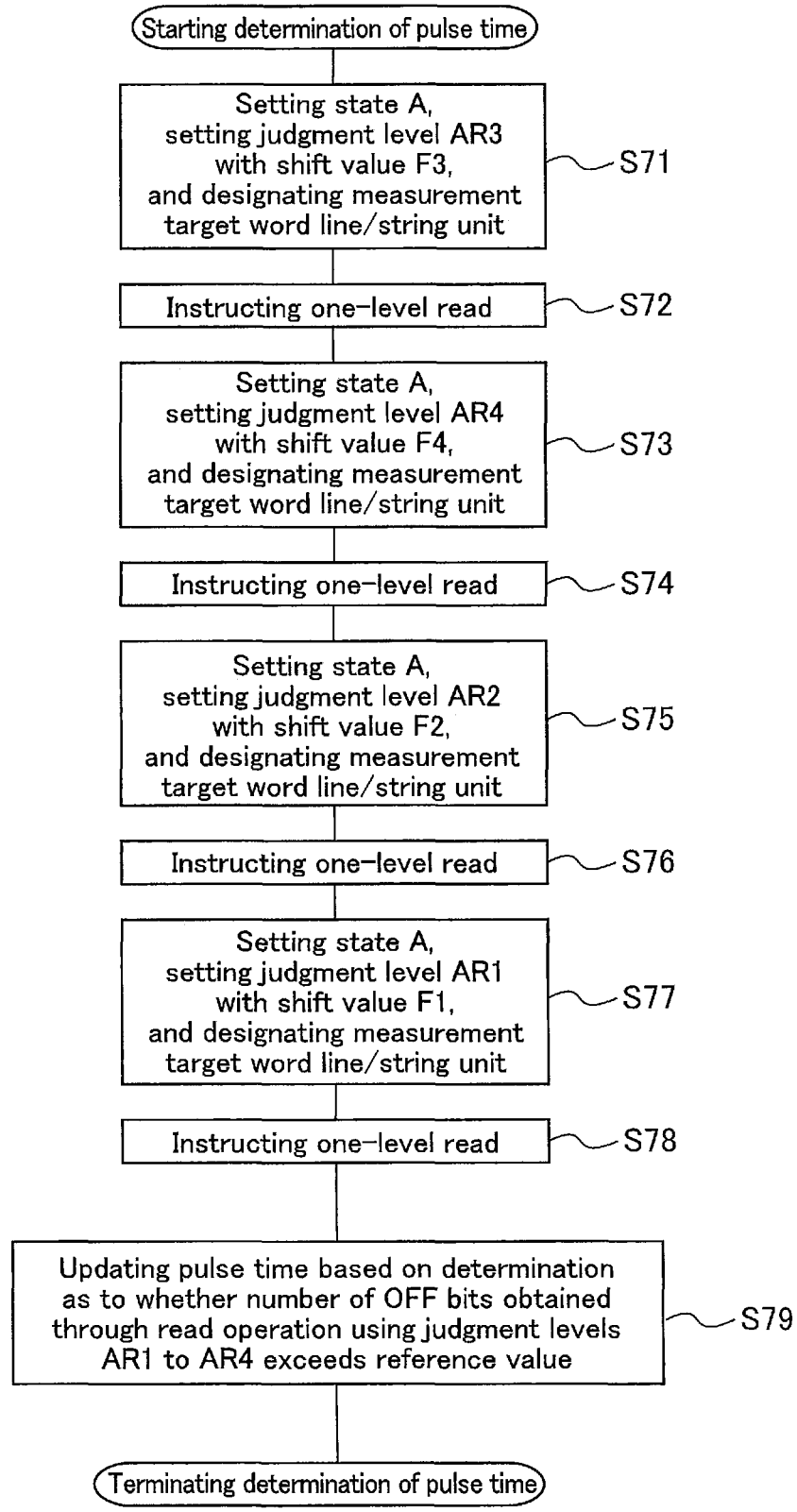
FIG. 42 is a flowchart showing processing of "determining a pulse time of the erase voltage VERA" in a third example of the erase operation according to the fourth embodiment.

Hereinafter, the processing of "determining the pulse time of the erase voltage VERA" which differs from that of the second example will be described with reference to FIG. 42. FIG. 42 is a flowchart showing the processing of "determining the pulse time of the erase voltage VERA" in the third example of the erase operation. The processing shown in FIG. 42 is instructed and controlled by the memory controller 20 (or the CPU 21).

As shown in FIG. 42, first, the memory controller 20 sets the read voltage AR of the state "A" as a read voltage, and further sets a shift value F3 used for making a shift from the read voltage AR. Herein, a read voltage shifted from the read voltage AR by the shift value F3 is defined as a judgment level AR3. The judgment level AR3 is a voltage level used to determine the degree of erasure in memory cells after the erase operation. The memory controller 20 sets to the semiconductor memory device 10 the judgment level AR3 shifted from the read voltage AR by the shift value F3. The memory controller 20 further designates to the semiconductor memory device 10 a word line WL and a string unit SU serving as a measurement target in an erasure target block BLKr (step S71).

Next, the memory controller 20 instructs the semiconductor memory device 10 to perform the "one-level read" of the state "A" (step S72). Upon receipt of the instruction for the "one-level read" of the state "A", the sequencer 16 of the semiconductor memory device 10 executes the read operation at the set judgment level AR3 on measurement target memory cells. The sequencer 16 outputs a read result RA3R of the read operation using the judgment level AR3, from the semiconductor memory device 10 to the memory controller 20. The memory controller 20 counts the number of memory cells in the OFF state (the first number of OFF bits) from the read result RA3R.

Next, the memory controller 20 sets the read voltage AR of the state "A" as a read voltage, and further sets a shift value F4 used for making a shift from the read voltage AR.

Herein, a read voltage shifted from the read voltage AR by the shift value F4 is defined as a judgment level AR4. The judgment level AR4 is a voltage level used to determine a degree of erasure in memory cells after the erase operation. The memory controller 20 sets to the semiconductor memory device 10 the judgment level AR4 shifted from the read voltage AR by the shift value F4. The memory controller 20 further designates to the semiconductor memory device 10 a word line WL and a string unit SU serving as a measurement target in an erasure target block BLKr (step S73).

The memory controller 20 instructs the semiconductor memory device 10 to perform the "one-level read" of the state "A" (step S74). Upon receipt of the instruction for the "one-level read" of the state "A", the sequencer 16 executes the read operation at the set judgment level AR4 on measurement target memory cells. The sequencer 16 outputs a read result RA4R of the read operation using the judgment level AR4, from the semiconductor memory device 10 to the memory controller 20. The memory controller 20 counts the number of memory cells in the OFF state (the second number of OFF bits) from the read result RA4R.

Next, the memory controller 20 sets the read voltage AR of the state "A" as a read voltage, and further sets a shift value F2 used for making a shift from the read voltage AR. Herein, a read voltage shifted from the read voltage AR by the shift value F2 is defined as a judgment level AR2. The judgment level AR2 is a voltage level used for determining the degree of erasure in memory cells after the erase operation. The memory controller 20 sets to the semiconductor memory device 10 the judgment level AR2 shifted from the read voltage AR by the shift value F2. The memory controller 20 further designates to the semiconductor memory device 10 a word line WL and a string unit SU both serving as a measurement target in an erasure target block BLKr (step S75).

The memory controller 20 then instructs the semiconductor memory device 10 to perform the "one-level read" of the state "A" (step S76). Upon receipt of the instruction for the "one-level read" of the state "A", the sequencer 16 executes the read operation at the set judgment level AR2 on measurement target memory cells. The sequencer 16 outputs a read result RA2R of the read operation using the judgment level AR2, from the semiconductor memory device 10 to the memory controller 20. The memory controller 20 counts the number of memory cells in the OFF state (the third number of OFF bits) from the read result RA2R.

Next, the memory controller 20 sets the read voltage AR of the state "A" as a read voltage, and further sets a shift value F1 used for making a shift from the read voltage AR. Herein, a read voltage shifted from the read voltage AR by the shift value F1 is defined as a judgment level AR1. The judgment level AR1 is a voltage level used to determine a degree of erasure in memory cells after the erase operation. The memory controller 20 sets to the semiconductor memory device 10 the judgment level AR1 shifted from the read voltage AR by the shift value F1. The memory controller 20 further designates to the semiconductor memory device 10 a word line WL and a string unit SU serving as a measurement target in an erasure target block BLKr (step S77).

Next, the memory controller 20 instructs the semiconductor memory device 10 to perform the "one-level read" of the state "A" (step S78). Upon receipt of the instruction for the "one-level read" of the state "A", the sequencer 16 executes the read operation at the set judgment level AR1 on measurement target memory cells. The sequencer 16 outputs a read result RA1R of the read operation using the judgment level AR1, from the semiconductor memory device 10 to the memory controller 20. The memory controller 20 counts the number of memory cells in the OFF state (the fourth number of OFF bits) from the read result RA1R.

Next, the memory controller 20 determines the degree of erasure in memory cells depending on whether or not the first number to the fourth number of OFF bits obtained through the read operations at the read voltages AR1 to AR4 exceed the reference value. The memory controller 20 further updates the pulse time PDr based on the determination result of the degree of erasure (step S79). The processing of determining the pulse time is thus terminated.

As with the second example, in the third example, the memory controller 20 determines, based on the number of OFF bits obtained through the read operation performed using a plurality of judgment levels, whether erasure with respect to memory cells corresponds to the excessive erasure state, the slightly excessive erasure state, the appropriate erasure state, the slightly insufficient erasure state, or the insufficient erasure state. Furthermore, based on results of the above determinations, the memory controller 20 updates or maintains without updating the pulse time PDr of the erase voltage VERA.

In the third example, the memory controller 20 determines based on the determination result of the degree of erasure, whether to update the pulse time PDr of the erase voltage VERA, and then updates the pulse time PDr; however, instead of this determination, the memory controller 20 may determine whether to update the initial voltage value PAr of the erase voltage VERA and update the initial voltage value PAr.

4.2 Advantageous Effects of Fourth Embodiment

According to the fourth embodiment, erasure with respect to memory cells through the erase operation can be optimized by adjusting or updating the pulse time of the erase voltage VERA after the erase operation. In other words, by adjusting or updating the pulse time of the erase voltage VERA, memory cells can be prevented from transitioning to the insufficient erasure state or excessive erasure state through the erase operation.

By preventing memory cells from transitioning to the excessive erasure state through the erase operation, damage caused to the memory cells through the erase operation can be reduced. Furthermore, by preventing memory cells from transitioning to the insufficient erasure state through the erase operation, for example, read errors can be reduced in page reads including a read of the state A. The rest of the configuration and advantageous effects are similar to those of the first embodiment.

5. Other Modifications, Etc

Moreover, in the above-described embodiment, a NAND flash memory was described as an example of a semiconductor memory device; however, the embodiment is not limited to a NAND flash memory, and is applicable to other semiconductor memories in general. Furthermore, the present embodiment is applicable to various memory devices other than a semiconductor memory. Furthermore, the order of the steps in the above-described flowchart may be altered in any manner possible.

The embodiments described above are presented merely as examples and are not intended to restrict the scope of the invention. These embodiments may be implemented in various other forms, and various omissions, replacements, and changes can be made without departing from the gist of the invention. The embodiments and their modifications are included in the scope and spirit of the invention and are included in the scope of the claimed inventions and their equivalents.

What is claimed is:

1. A memory system comprising:
a semiconductor memory device including a first memory cell configured to store data; and
a controller configured to output a first parameter and a first command, the first parameter relating to an erase voltage for a first erase operation with respect to the first memory cell, the first command instructing the first erase operation wherein
the controller is configured to output the first command after outputting the first parameter to the semiconductor memory device,
the first erase operation includes a first processing that contains erase processing and erase verify processing, the erase processing applying an erase voltage to the first memory cell, the erase verify processing verifying as to whether a result of verify processing executed with respect to the first memory cell is pass or fail,
the controller is configured to execute the first processing again when the result is fail, and terminate the first erase operation when the result is pass,
the semiconductor memory device includes a plurality of memory cells including the first memory cell, and
after the first erase operation is executed with respect to the plurality of memory cells and then a write operation is executed with respect to a portion of the plurality of memory cells, the controller is configured to update the first parameter based on a result of a read operation with respect to at least another portion of the plurality of memory cells after the first erase operation.

2. The memory system according to claim 1, wherein the first parameter includes at least one of a pulse time and a voltage value of an erase voltage that is applied to the first memory cell when the first erase operation is executed.

3. The memory system according to claim 1, wherein:
the semiconductor memory device includes a block containing the plurality of memory cells including the first memory cell; and
the controller is configured to instruct the first erase operation with respect to the block.

4. The memory system according to claim 1, wherein:
the semiconductor memory device includes the plurality of memory cells including the first memory cell; and
the controller is configured to:
output a second parameter relating to a first voltage for a read operation with respect to the first memory cell;
obtain a first number that is a number of memory cells in an OFF state among the plurality of memory cells during the read operation; and
update the first parameter when the first number is greater than a first value.

5. The memory system according to claim 1, wherein:
the semiconductor memory device is configured to output to the controller a result of a read operation with respect to the first memory cell after the first erase operation; and
the controller is configured to update the parameter based on the result.

6. The memory system according to claim 1, wherein the controller is configured to store a table including the parameter with respect to the first memory cell.

7. The memory system according to claim 1, wherein the semiconductor memory device is configured to execute the erase processing using the first parameter.

8. The memory system according to claim 1, wherein if the first erase operation with respect to the first memory cell is executed a plurality of times, every time the first erase operation is executed, the controller is configured to update the first parameter based on a result of a read operation with respect to the first memory cell after the first erase operation.

9. The memory system according to claim 1, wherein if the first erase operation with respect to the first memory cell is executed a plurality of times, every time the first erase operation is executed a predetermined number of times, the controller is configured to update the first parameter based on a result of a read operation with respect to the first memory cell after the first erase operation.

10. The memory system according to claim 4, wherein the semiconductor memory device includes a first word line connected to the plurality of memory cells.

11. The memory system according to claim 1, wherein:
the semiconductor memory device includes the plurality of memory cells including the first memory cell, and includes a plurality of first word lines connected to the plurality of memory cells; and
the controller is configured to:
output a second parameter relating to a first voltage for a read operation with respect to the first memory cell;
obtain a second number that is a number of memory cells in an OFF state among the plurality of memory cells during the read operation per first word line of the first word lines; and
update the first parameter when the second number is greater than a first value.

12. The memory system according to claim 1, wherein:
the semiconductor memory device includes the plurality of memory cells including the first memory cell, and further includes a second word line connected to a portion of the plurality of memory cells and a third word line connected to another portion of the plurality of memory cells; and
the controller is configured to:
output a second parameter relating to a first voltage for a read operation with respect to the first memory cell;
obtain a third number that is a number of memory cells in an OFF state among the plurality of memory cells during the read operation on the second word line;
obtain a fourth number that is a number of memory cells in an OFF state among the plurality of memory cells during the read operation on the third word line; and
update the first parameter when at least one of the third number and the fourth number is greater than a first value.

13. A memory system comprising:
a semiconductor memory device including a first memory cell configured to store data; and
a controller configured to output a first parameter and a first command, the first parameter relating to an erase voltage for a first erase operation with respect to the first memory cell, the first command instructing the first erase operation, wherein
the controller is configured to output the first command after outputting the first parameter to the semiconductor memory device,
the semiconductor memory device includes a plurality of memory cells including the first memory cell;
the controller is configured to:

output a second parameter relating to a first voltage for a first read operation with respect to the first memory cell, and obtain a first number that is a number of memory cells in an OFF state among the plurality of memory cells during the first read operation;

when the first number is greater than a first value, output a third parameter relating to a second voltage for a second read operation with respect to the first memory cell, obtain a second number that is a number of memory cells in an OFF state among the plurality of memory cells during the second read operation, and update the first parameter based on whether or not the second number is greater than a second value; and when the first number is smaller than the first value, output a fourth parameter relating to a third voltage for a third read operation with respect to the first memory cell, obtain a third number that is a number of memory cells in an OFF state among the plurality of memory cells during the third read operation, and update the first parameter based on whether or not the third number is greater than a third value;

the second voltage is greater than the first voltage; and
the third voltage is smaller than the first voltage.

14. The memory system according to claim 1, wherein:
the semiconductor memory device includes the plurality of memory cells including the first memory cell; and
the plurality of memory cells are stacked above a semiconductor substrate.

15. The memory system according to claim 4, wherein if the first erase operation with respect to the plurality of memory cells is executed a plurality of times, the controller is configured to change the first value in accordance with a number of times the first erase operation is executed.

16. The memory system according to claim 1, wherein:
after outputting the first command to the semiconductor memory device,
the controller is configured to output a second command after outputting a second parameter different from the first parameter to the semiconductor memory device,
the second parameter relates to an erase voltage for a second erase operation with respect to the first memory cell, and
the second command instructs the second erase operation.

17. A semiconductor memory device comprising:
a plurality of memory cells configured to store data; and
a control circuit configured to execute an erase operation with respect to the plurality of memory cells, wherein
the control circuit is configured to receive a parameter relating to an erase voltage for the erase operation, then receive a first command instructing the erase operation, and thereafter execute the erase operation using the parameter, and
after the erase operation is executed with respect to the plurality of memory cells and then a write operation is executed with respect to a portion of the plurality of memory cells, the parameter is updated based on a result of a read operation with respect to at least another portion of the plurality of memory cells after the erase operation.

18. The semiconductor memory device according to claim 17, wherein if the control circuit receives a second command designating that a use target of the parameter is the erase operation, then receives an address designating a type of the parameter, then receives data indicating a set value of the parameter, then receives the first command, then receives an address of a target of the erase operation, and then receives a third command for starting the erase operation, the control circuit is configured to execute the erase operation with respect to the plurality of memory cells that is the target of the erase operation.

* * * * *